(12) United States Patent
Lubomirsky et al.

(10) Patent No.: US 10,256,079 B2
(45) Date of Patent: Apr. 9, 2019

(54) SEMICONDUCTOR PROCESSING SYSTEMS HAVING MULTIPLE PLASMA CONFIGURATIONS

(71) Applicant: Applied Materials, Inc., Santa Clara, CA (US)

(72) Inventors: Dmitry Lubomirsky, Cupertino, CA (US); Xinglong Chen, San Jose, CA (US); Shankar Venkataraman, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 508 days.

(21) Appl. No.: 13/791,074

(22) Filed: Mar. 8, 2013

(65) Prior Publication Data

US 2014/0227881 A1 Aug. 14, 2014

Related U.S. Application Data

(60) Provisional application No. 61/762,767, filed on Feb. 8, 2013.

(51) Int. Cl.
*C23C 16/00* (2006.01)
*C23F 1/00* (2006.01)
(Continued)

(52) U.S. Cl.
CPC .. *H01J 37/32357* (2013.01); *C23C 16/45565* (2013.01); *C23C 16/505* (2013.01);
(Continued)

(58) Field of Classification Search
USPC ............... 156/345.35; 118/723 ME, 723 ER
See application file for complete search history.

(56) References Cited

U.S. PATENT DOCUMENTS 2,369,620 A 2/1945 Sullivan et al.
3,401,302 A 9/1968 Thorpe
(Continued)

FOREIGN PATENT DOCUMENTS

CN 1124364 A 6/1996
CN 1375575 10/2002
(Continued)

OTHER PUBLICATIONS

International Search Report of PCT/2013/052039 dated Nov. 8, 2013, 9 pages.
(Continued)

*Primary Examiner* — Rakesh K Dhingra
(74) *Attorney, Agent, or Firm* — Kilpatrick Townsend & Stockton LLP

(57) ABSTRACT

An exemplary system may include a chamber configured to contain a semiconductor substrate in a processing region of the chamber. The system may include a first remote plasma unit fluidly coupled with a first access of the chamber and configured to deliver a first precursor into the chamber through the first access. The system may still further include a second remote plasma unit fluidly coupled with a second access of the chamber and configured to deliver a second precursor into the chamber through the second access. The first and second access may be fluidly coupled with a mixing region of the chamber that is separate from and fluidly coupled with the processing region of the chamber. The mixing region may be configured to allow the first and second precursors to interact with each other externally from the processing region of the chamber.

23 Claims, 13 Drawing Sheets

(51) Int. Cl.
  *H01L 21/306* (2006.01)
  *H01J 37/32* (2006.01)
  *H01L 21/3213* (2006.01)
  *C23C 16/54* (2006.01)
  *C23C 16/455* (2006.01)
  *C23C 16/505* (2006.01)
  *H01L 21/67* (2006.01)

(52) U.S. Cl.
  CPC ........ *C23C 16/54* (2013.01); *H01J 37/32422* (2013.01); *H01J 37/32449* (2013.01); *H01J 37/32899* (2013.01); *H01L 21/32136* (2013.01); *H01L 21/67069* (2013.01)

(56) References Cited

U.S. PATENT DOCUMENTS

| | | |
|---|---|---|
| 3,451,840 A | 6/1969 | Hough |
| 3,537,474 A | 11/1970 | Rohrer |
| 3,756,511 A | 9/1973 | Shinroku |
| 3,937,857 A | 2/1976 | Brummett et al. |
| 3,969,077 A | 7/1976 | Hill |
| 4,006,047 A | 2/1977 | Brummett et al. |
| 4,190,488 A | 2/1980 | Winters |
| 4,209,357 A | 6/1980 | Gorin et al. |
| 4,214,946 A | 7/1980 | Forget et al. |
| 4,232,060 A | 11/1980 | Mallory et al. |
| 4,234,628 A | 11/1980 | DuRose |
| 4,265,943 A | 5/1981 | Goldstein et al. |
| 4,340,462 A | 7/1982 | Koch |
| 4,341,592 A | 7/1982 | Shortes et al. |
| 4,361,418 A | 11/1982 | Tscheppe |
| 4,364,803 A | 12/1982 | Nidola et al. |
| 4,368,223 A | 1/1983 | Kobayashi et al. |
| 4,374,698 A | 2/1983 | Sanders et al. |
| 4,381,441 A | 4/1983 | Desmarais et al. |
| 4,397,812 A | 8/1983 | Mallory, Jr. |
| 4,468,413 A | 8/1984 | Bachmann |
| 4,565,601 A | 1/1986 | Kakehi et al. |
| 4,571,819 A | 2/1986 | Rogers et al. |
| 4,579,618 A | 4/1986 | Celestino et al. |
| 4,585,920 A | 4/1986 | Hoog et al. |
| 4,610,775 A | 9/1986 | Phifer |
| 4,625,678 A | 12/1986 | Shloya et al. |
| 4,632,857 A | 12/1986 | Mallory, Jr. |
| 4,656,052 A | 4/1987 | Satou et al. |
| 4,656,076 A | 4/1987 | Vetanen et al. |
| 4,668,335 A | 5/1987 | Mockler |
| 4,690,746 A | 9/1987 | McInerney et al. |
| 4,714,520 A | 12/1987 | Gwozdz |
| 4,749,440 A | 6/1988 | Blackwood et al. |
| 4,753,898 A | 6/1988 | Parrillo et al. |
| 4,792,378 A | 12/1988 | Rose et al. |
| 4,807,016 A | 2/1989 | Douglas |
| 4,810,520 A | 3/1989 | Wu |
| 4,816,638 A | 3/1989 | Ukai et al. |
| 4,828,649 A | 5/1989 | Davis |
| 4,838,990 A | 6/1989 | Jucha et al. |
| 4,851,370 A | 7/1989 | Doklan et al. |
| 4,857,140 A | 8/1989 | Loewenstein |
| 4,865,685 A | 9/1989 | Palmour |
| 4,867,841 A | 9/1989 | Loewenstein et al. |
| 4,868,071 A | 9/1989 | Walsh et al. |
| 4,872,947 A | 10/1989 | Wang et al. |
| 4,886,570 A | 12/1989 | Davis et al. |
| 4,892,753 A | 1/1990 | Wang et al. |
| 4,894,352 A | 1/1990 | Lane et al. |
| 4,904,341 A | 2/1990 | Blaugher et al. |
| 4,919,750 A | 4/1990 | Bausmith et al. |
| 4,946,903 A | 8/1990 | Gardella et al. |
| 4,951,601 A | 8/1990 | Maydan et al. |
| 4,960,488 A | 10/1990 | Law et al. |
| 4,981,551 A | 1/1991 | Palmour |
| 4,985,372 A | 1/1991 | Narita et al. |
| 4,991,542 A | 2/1991 | Kohmura et al. |
| 4,993,358 A | 2/1991 | Mahawili |
| 4,994,404 A | 2/1991 | Sheng et al. |
| 5,000,113 A | 3/1991 | Wang et al. |
| 5,006,192 A | 4/1991 | Deguchi |
| 5,010,842 A | 4/1991 | Oda et al. |
| 5,013,691 A | 5/1991 | Lory et al. |
| 5,028,565 A | 7/1991 | Chang |
| 5,030,319 A | 7/1991 | Nishino et al. |
| 5,038,713 A | 8/1991 | Kawakami et al. |
| 5,045,244 A | 9/1991 | Marlett |
| 5,061,838 A | 10/1991 | Lane et al. |
| 5,069,938 A | 12/1991 | Lorimer et al. |
| 5,083,030 A | 1/1992 | Stavov |
| 5,089,441 A | 2/1992 | Moslehi |
| 5,089,442 A | 2/1992 | Olmer |
| 5,147,692 A | 9/1992 | Bengston |
| 5,156,881 A | 10/1992 | Okano et al. |
| 5,180,435 A | 1/1993 | Markunas et al. |
| 5,186,718 A | 2/1993 | Tepman et al. |
| 5,188,706 A | 2/1993 | Hori et al. |
| 5,198,034 A | 3/1993 | deBoer et al. |
| 5,200,016 A | 4/1993 | Namose |
| 5,203,911 A | 4/1993 | Sricharoenchalkit et al. |
| 5,215,787 A | 6/1993 | Homma |
| 5,221,427 A | 6/1993 | Koinuma et al. |
| 5,228,501 A | 7/1993 | Tepman et al. |
| 5,231,690 A | 7/1993 | Soma et al. |
| 5,235,139 A | 8/1993 | Bengston et al. |
| 5,238,499 A | 8/1993 | van de Ven et al. |
| 5,240,497 A | 8/1993 | Shacham et al. |
| 5,248,371 A | 9/1993 | Maher et al. |
| 5,248,527 A | 9/1993 | Uchida et al. |
| 5,252,178 A | 10/1993 | Moslehi |
| 5,269,881 A | 12/1993 | Sekiya |
| 5,270,125 A | 12/1993 | America et al. |
| 5,271,972 A | 12/1993 | Kwok et al. |
| 5,275,977 A | 1/1994 | Otsubo et al. |
| 5,277,750 A | 1/1994 | Wolgang |
| 5,279,669 A | 1/1994 | Lee |
| 5,279,865 A | 1/1994 | Chebi et al. |
| 5,288,518 A | 2/1994 | Homma |
| 5,290,382 A | 3/1994 | Zarowin et al. |
| 5,290,383 A | 3/1994 | Koshimizu |
| 5,292,370 A | 3/1994 | Tsai et al. |
| 5,292,682 A | 3/1994 | Stevens et al. |
| 5,300,463 A | 4/1994 | Cathey et al. |
| 5,302,233 A | 4/1994 | Kim et al. |
| 5,304,250 A | 4/1994 | Sameshima et al. |
| 5,306,530 A | 4/1994 | Stronglin et al. |
| 5,314,724 A | 5/1994 | Tsukune et al. |
| 5,316,804 A | 5/1994 | Tomikawa et al. |
| 5,319,247 A | 6/1994 | Matsuura |
| 5,328,218 A | 7/1994 | Lowrey et al. |
| 5,328,558 A | 7/1994 | Kawamura et al. |
| 5,330,578 A | 7/1994 | Sakama |
| 5,334,552 A | 8/1994 | Homma |
| 5,345,999 A | 9/1994 | Hosokawa |
| 5,352,636 A | 10/1994 | Beinglass |
| 5,362,526 A | 11/1994 | Wang et al. |
| 5,366,585 A | 11/1994 | Robertson et al. |
| 5,368,897 A | 11/1994 | Kurihara et al. |
| 5,378,316 A | 1/1995 | Franke et al. |
| 5,380,560 A | 1/1995 | Kaja et al. |
| 5,382,311 A | 1/1995 | Ishikawa et al. |
| 5,384,284 A | 1/1995 | Doan et al. |
| 5,385,763 A | 1/1995 | Okana et al. |
| 5,399,529 A | 3/1995 | Homma |
| 5,403,434 A | 4/1995 | Moslehi |
| 5,413,670 A | 5/1995 | Langan et al. |
| 5,413,967 A | 5/1995 | Matsuda et al. |
| 5,415,890 A | 5/1995 | Kloiber et al. |
| 5,416,048 A | 5/1995 | Blalock et al. |
| 5,420,075 A | 5/1995 | Homma et al. |
| 5,429,995 A | 7/1995 | Nishiyama et al. |
| 5,439,553 A | 8/1995 | Grant et al. |
| 5,451,259 A | 9/1995 | Krogh |
| 5,464,499 A | 11/1995 | Moslehi |
| 5,468,342 A | 11/1995 | Nulty et al. |
| 5,474,589 A | 12/1995 | Ohga et al. |

(56) References Cited

U.S. PATENT DOCUMENTS

| | | |
|---|---|---|
| 5,478,403 A | 12/1995 | Shinigawa et al. |
| 5,478,462 A | 12/1995 | Walsh |
| 5,483,920 A | 1/1996 | Pryor |
| 5,494,494 A | 2/1996 | Mizuno et al. |
| 5,500,249 A | 3/1996 | Telford et al. |
| 5,505,816 A | 4/1996 | Barnes et al. |
| 5,510,216 A | 4/1996 | Calabrese et al. |
| 5,516,367 A | 5/1996 | Lei et al. |
| 5,518,962 A | 5/1996 | Murao |
| 5,534,070 A | 6/1996 | Okamura et al. |
| 5,536,360 A | 6/1996 | Nguyen et al. |
| 5,531,835 A | 7/1996 | Fodor et al. |
| 5,549,780 A | 8/1996 | Koinuma et al. |
| 5,558,717 A | 9/1996 | Zhao et al. |
| 5,560,779 A | 10/1996 | Knowles et al. |
| 5,563,105 A | 10/1996 | Dobuzinsky et al. |
| 5,567,243 A | 10/1996 | Foster et al. |
| 5,571,576 A | 11/1996 | Qian et al. |
| 5,575,853 A | 11/1996 | Arami et al. |
| 5,578,130 A | 11/1996 | Hayashi et al. |
| 5,591,269 A | 1/1997 | Arami et al. |
| 5,592,358 A | 1/1997 | Shamouilian |
| 5,597,439 A | 1/1997 | Salzman |
| 5,599,740 A | 2/1997 | Jang et al. |
| 5,614,055 A | 3/1997 | Fairbairn et al. |
| 5,616,518 A | 4/1997 | Foo et al. |
| 5,624,582 A | 4/1997 | Cain |
| 5,626,922 A | 5/1997 | Miyanaga et al. |
| 5,628,829 A | 5/1997 | Foster et al. |
| 5,645,645 A | 7/1997 | Zhang et al. |
| 5,648,125 A | 7/1997 | Cane |
| 5,648,175 A | 7/1997 | Russell et al. |
| 5,656,093 A | 8/1997 | Burkhart et al. |
| 5,660,957 A | 8/1997 | Chou et al. |
| 5,661,093 A | 8/1997 | Ravi et al. |
| 5,670,066 A | 9/1997 | Barnes et al. |
| 5,674,787 A | 10/1997 | Zhao et al. |
| 5,676,758 A | 10/1997 | Hasgawa et al. |
| 5,679,606 A | 10/1997 | Wang et al. |
| 5,685,946 A | 11/1997 | Fathauer et al. |
| 5,688,331 A | 11/1997 | Aruga et al. |
| 5,695,810 A | 12/1997 | Dubin et al. |
| 5,712,185 A | 1/1998 | Tsai et al. |
| 5,716,500 A | 2/1998 | Bardos et al. |
| 5,716,506 A | 2/1998 | Maclay et al. |
| 5,719,085 A | 2/1998 | Moon et al. |
| 5,733,816 A | 3/1998 | Iyer et al. |
| 5,747,373 A | 5/1998 | Yu |
| 5,753,886 A | 5/1998 | Iwamura et al. |
| 5,755,859 A | 5/1998 | Brusic et al. |
| 5,756,402 A | 5/1998 | Jimbo et al. |
| 5,781,693 A | 7/1998 | Ballance et al. |
| 5,786,276 A | 7/1998 | Brooks et al. |
| 5,788,825 A | 8/1998 | Park et al. |
| 5,789,300 A | 8/1998 | Fulford |
| 5,792,376 A | 8/1998 | Kanai et al. |
| 5,800,686 A | 9/1998 | Littau et al. |
| 5,804,259 A | 9/1998 | Robles |
| 5,812,403 A | 9/1998 | Fong et al. |
| 5,814,238 A | 9/1998 | Ashby et al. |
| 5,814,365 A | 9/1998 | Mahawill |
| 5,820,723 A | 10/1998 | Benjamin et al. |
| 5,824,599 A | 10/1998 | Schacham-Diamand et al. |
| 5,830,805 A | 11/1998 | Schacham-Diamand et al. |
| 5,835,334 A | 11/1998 | McMillin et al. |
| 5,838,055 A | 11/1998 | Kleinhenz et al. |
| 5,843,538 A | 12/1998 | Ehrsam et al. |
| 5,843,847 A | 12/1998 | Pu et al. |
| 5,844,195 A | 12/1998 | Fairbairn et al. |
| 5,846,332 A | 12/1998 | Zhao et al. |
| 5,846,373 A | 12/1998 | Pirkle et al. |
| 5,846,375 A | 12/1998 | Gilchrist et al. |
| 5,846,598 A | 12/1998 | Semkow et al. |
| 5,849,639 A | 12/1998 | Molloy et al. |
| 5,850,105 A | 12/1998 | Dawson et al. |
| 5,855,681 A | 1/1999 | Maydan et al. |
| 5,855,685 A | 1/1999 | Tobe et al. |
| 5,856,240 A | 1/1999 | Sinha et al. |
| 5,858,876 A | 1/1999 | Chew |
| 5,863,376 A | 1/1999 | Wicker |
| 5,865,896 A | 2/1999 | Nowak |
| 5,866,483 A | 2/1999 | Shiau et al. |
| 5,868,897 A | 2/1999 | Ohkawa |
| 5,872,052 A | 2/1999 | Iyer |
| 5,872,058 A | 2/1999 | Van Cleemput et al. |
| 5,882,786 A | 3/1999 | Nassau et al. |
| 5,883,012 A | 3/1999 | Chiou |
| 5,885,404 A | 3/1999 | Kim et al. |
| 5,885,749 A | 3/1999 | Huggins et al. |
| 5,888,906 A | 3/1999 | Sandhu et al. |
| 5,891,349 A | 4/1999 | Tobe et al. |
| 5,891,513 A | 4/1999 | Dubin et al. |
| 5,897,751 A | 4/1999 | Makowiecki |
| 5,899,752 A | 5/1999 | Hey et al. |
| 5,900,163 A | 5/1999 | Yi et al. |
| 5,904,827 A | 5/1999 | Reynolds |
| 5,907,790 A | 5/1999 | Kellam |
| 5,910,340 A | 6/1999 | Uchida et al. |
| 5,913,140 A | 6/1999 | Roche et al. |
| 5,913,147 A | 6/1999 | Dubin et al. |
| 5,913,978 A | 6/1999 | Kato et al. |
| 5,915,190 A | 6/1999 | Pirkle |
| 5,919,332 A | 7/1999 | Koshiishi et al. |
| 5,920,792 A | 7/1999 | Lin |
| 5,926,737 A | 7/1999 | Ameen et al. |
| 5,932,077 A | 8/1999 | Reynolds et al. |
| 5,933,757 A | 8/1999 | Yoshikawa et al. |
| 5,935,334 A | 8/1999 | Fong et al. |
| 5,935,340 A | 8/1999 | Xia et al. |
| 5,937,323 A | 8/1999 | Orczyk et al. |
| 5,939,831 A | 8/1999 | Fong et al. |
| 5,942,075 A | 8/1999 | Nagahata et al. |
| 5,944,049 A | 8/1999 | Beyer et al. |
| 5,944,902 A | 8/1999 | Redeker et al. |
| 5,948,702 A | 9/1999 | Rotondaro |
| 5,951,601 A | 9/1999 | Lesinski et al. |
| 5,951,776 A | 9/1999 | Selyutin et al. |
| 5,951,896 A | 9/1999 | Mahawill |
| 5,953,635 A | 9/1999 | Andideh |
| 5,963,840 A | 10/1999 | Xia et al. |
| 5,968,587 A | 10/1999 | Frankel et al. |
| 5,968,610 A | 10/1999 | Liu et al. |
| 5,969,422 A | 10/1999 | Ting et al. |
| 5,976,327 A | 11/1999 | Tanaka |
| 5,990,000 A | 11/1999 | Hong et al. |
| 5,990,013 A | 11/1999 | Berenguer et al. |
| 5,993,916 A | 11/1999 | Zhao et al. |
| 5,994,209 A | 11/1999 | Yieh et al. |
| 5,997,649 A | 12/1999 | Hillman |
| 5,997,962 A | 12/1999 | Ogasawara et al. |
| 6,007,635 A | 12/1999 | Mahawill |
| 6,007,785 A | 12/1999 | Liou |
| 6,010,962 A | 1/2000 | Liu et al. |
| 6,013,191 A | 1/2000 | Nasser-Faili et al. |
| 6,013,584 A | 1/2000 | M'Saad |
| 6,015,724 A | 1/2000 | Yamazaki et al. |
| 6,015,747 A | 1/2000 | Lopatin et al. |
| 6,017,414 A | 1/2000 | Koemtzopoulos et al. |
| 6,019,848 A | 2/2000 | Kiyama et al. |
| 6,020,271 A | 2/2000 | Yanagida |
| 6,030,666 A | 2/2000 | Lam et al. |
| 6,030,881 A | 2/2000 | Papasouliotis et al. |
| 6,035,101 A | 3/2000 | Sajoto et al. |
| 6,036,878 A | 3/2000 | Collins et al. |
| 6,037,018 A | 3/2000 | Jang et al. |
| 6,037,266 A | 3/2000 | Tao et al. |
| 6,039,834 A | 3/2000 | Tanaka et al. |
| 6,039,851 A | 3/2000 | Iyer |
| 6,053,982 A | 4/2000 | Halpin et al. |
| 6,059,643 A | 5/2000 | Hu et al. |
| 6,063,683 A | 5/2000 | Wu et al. |
| 6,063,712 A | 5/2000 | Gilton et al. |
| 6,065,424 A | 5/2000 | Shacham-Diamand et al. |
| 6,065,425 A | 5/2000 | Takaki et al. |

(56) References Cited

U.S. PATENT DOCUMENTS

| | | | |
|---|---|---|---|
| 6,072,147 A | 6/2000 | Koshiishi | |
| 6,072,227 A | 6/2000 | Yau et al. | |
| 6,074,512 A | 6/2000 | Collins et al. | |
| 6,074,514 A | 6/2000 | Bjorkman et al. | |
| 6,077,384 A | 6/2000 | Collins et al. | |
| 6,077,780 A | 6/2000 | Dubin | |
| 6,079,356 A | 6/2000 | Umotoy et al. | |
| 6,080,529 A | 6/2000 | Ye et al. | |
| 6,081,414 A | 6/2000 | Flanigan et al. | |
| 6,083,344 A | 7/2000 | Hanawa et al. | |
| 6,086,677 A | 7/2000 | Umotoy et al. | |
| 6,087,278 A | 7/2000 | Kim et al. | |
| 6,090,212 A | 7/2000 | Mahawill | |
| 6,093,457 A | 7/2000 | Okumura | |
| 6,093,594 A | 7/2000 | Yeap et al. | |
| 6,099,697 A | 8/2000 | Hausmann | |
| 6,107,199 A | 8/2000 | Allen et al. | |
| 6,110,530 A | 8/2000 | Chen et al. | |
| 6,110,832 A | 8/2000 | Morgan et al. | |
| 6,110,836 A | 8/2000 | Cohen et al. | |
| 6,110,838 A | 8/2000 | Loewenstein | |
| 6,113,771 A | 9/2000 | Landau et al. | |
| 6,114,216 A | 9/2000 | Yieh et al. | |
| 6,117,245 A | 9/2000 | Mandrekar et al. | |
| 6,120,640 A | 9/2000 | Shih et al. | |
| 6,136,163 A | 10/2000 | Cheung et al. | |
| 6,136,165 A | 10/2000 | Moslehi et al. | |
| 6,136,685 A | 10/2000 | Narwankar et al. | |
| 6,136,693 A | 10/2000 | Chan et al. | |
| 6,140,234 A | 10/2000 | Uzoh et al. | |
| 6,144,099 A | 11/2000 | Lopatin et al. | |
| 6,147,009 A | 11/2000 | Grill et al. | |
| 6,148,761 A | 11/2000 | Majewski et al. | |
| 6,149,828 A | 11/2000 | Vaartstra | |
| 6,150,628 A | 11/2000 | Smith et al. | |
| 6,153,935 A | 11/2000 | Edelstein et al. | |
| 6,161,500 A | 12/2000 | Kopacz et al. | |
| 6,161,576 A | 12/2000 | Maher et al. | |
| 6,162,302 A | 12/2000 | Raghavan et al. | |
| 6,162,370 A | 12/2000 | Hackett et al. | |
| 6,165,912 A | 12/2000 | McConnell et al. | |
| 6,167,834 B1 | 1/2001 | Wang et al. | |
| 6,169,021 B1 | 1/2001 | Akram et al. | |
| 6,170,428 B1 | 1/2001 | Redeker et al. | |
| 6,171,661 B1 | 1/2001 | Zheng et al. | |
| 6,174,450 B1 | 1/2001 | Patrick et al. | |
| 6,174,810 B1 | 1/2001 | Patrick et al. | |
| 6,174,812 B1 | 1/2001 | Hsuing et al. | |
| 6,176,198 B1 | 1/2001 | Kao et al. | |
| 6,176,667 B1 | 1/2001 | Fairbairn | |
| 6,177,245 B1 | 1/2001 | Ward et al. | |
| 6,179,924 B1 | 1/2001 | Zhao et al. | |
| 6,180,523 B1 | 1/2001 | Lee et al. | |
| 6,182,602 B1 | 2/2001 | Redeker et al. | |
| 6,182,603 B1 | 2/2001 | Shang et al. | |
| 6,184,121 B1 | 2/2001 | Buchwalter et al. | |
| 6,186,091 B1 | 2/2001 | Chu et al. | |
| 6,189,483 B1 | 2/2001 | Ishikawa et al. | |
| 6,190,233 B1 | 2/2001 | Hong et al. | |
| 6,191,026 B1 | 2/2001 | Rana et al. | |
| 6,194,038 B1 | 2/2001 | Rossman | |
| 6,197,181 B1 | 3/2001 | Chen | |
| 6,197,364 B1 | 3/2001 | Paunovic et al. | |
| 6,197,680 B1 | 3/2001 | Lin et al. | |
| 6,197,688 B1 | 3/2001 | Simpson | |
| 6,197,705 B1 | 3/2001 | Vassiliev | |
| 6,198,616 B1 | 3/2001 | Dahimene et al. | |
| 6,203,863 B1 | 3/2001 | Liu et al. | |
| 6,204,200 B1 | 3/2001 | Shieh et al. | |
| 6,210,486 B1 | 4/2001 | Mizukami et al. | |
| 6,217,658 B1 | 4/2001 | Orczyk et al. | |
| 6,220,201 B1 | 4/2001 | Nowak | |
| 6,225,745 B1 | 5/2001 | Srivastava | |
| 6,228,233 B1 | 5/2001 | Lakshmikanthan et al. | |
| 6,228,751 B1 | 5/2001 | Yamazaki et al. | |
| 6,228,758 B1 | 5/2001 | Pellerin et al. | |
| 6,235,643 B1 | 5/2001 | Mui et al. | |
| 6,237,527 B1 | 5/2001 | Kellerman et al. | |
| 6,238,513 B1 | 5/2001 | Arnold et al. | |
| 6,238,582 B1 | 5/2001 | Williams et al. | |
| 6,197,151 B1 | 6/2001 | Kaji et al. | |
| 6,241,845 B1 | 6/2001 | Gadgil et al. | |
| 6,242,349 B1 | 6/2001 | Nogami et al. | |
| 6,244,211 B1 | 6/2001 | Nishikawa et al. | |
| 6,245,670 B1 | 6/2001 | Cheung et al. | |
| 6,251,236 B1 | 6/2001 | Stevens | |
| 6,251,802 B1 | 6/2001 | Moore et al. | |
| 6,258,170 B1 | 7/2001 | Somekh et al. | |
| 6,258,220 B1 | 7/2001 | Dordi et al. | |
| 6,258,223 B1 | 7/2001 | Cheung et al. | |
| 6,258,270 B1 | 7/2001 | Hilgendorff et al. | |
| 6,261,637 B1 | 7/2001 | Oberle | |
| 6,277,752 B1 | 8/2001 | Chen | |
| 6,281,072 B1 | 8/2001 | Li et al. | |
| 6,281,135 B1 | 8/2001 | Han et al. | |
| 6,284,146 B1 | 9/2001 | Kim et al. | |
| 6,291,282 B1 | 9/2001 | Wilk et al. | |
| 6,291,348 B1 | 9/2001 | Lopatin et al. | |
| 6,303,044 B1 | 10/2001 | Koemtzopoulos | |
| 6,303,418 B1 | 10/2001 | Cha et al. | |
| 6,306,772 B1 | 10/2001 | Lin | |
| 6,308,654 B1 | 10/2001 | Schneider et al. | |
| 6,308,776 B1 | 10/2001 | Sloan et al. | |
| 6,310,755 B1 | 10/2001 | Busato et al. | |
| 6,312,554 B1 | 11/2001 | Ye | |
| 6,312,995 B1 | 11/2001 | Yu | |
| 6,313,035 B1 | 11/2001 | Sandhu et al. | |
| 6,319,387 B1 | 11/2001 | Krishnamoorthy et al. | |
| 6,321,587 B1 | 11/2001 | Laush | |
| 6,322,716 B1 | 11/2001 | Qiao et al. | |
| 6,323,128 B1 | 11/2001 | Sambucetti et al. | |
| 6,335,261 B1 | 1/2002 | Natzle et al. | |
| 6,335,288 B1 | 1/2002 | Kwan et al. | |
| 6,340,435 B1 | 1/2002 | Bjorkman et al. | |
| 6,342,733 B1 | 1/2002 | Hu et al. | |
| RE37,546 E | 2/2002 | Mahawili | |
| 6,344,410 B1 | 2/2002 | Lopatin et al. | |
| 6,348,407 B1 | 2/2002 | Gupta et al. | |
| 6,350,320 B1 | 2/2002 | Sherstinsky et al. | |
| 6,350,697 B1 | 2/2002 | Richardson | |
| 6,351,013 B1 | 2/2002 | Luning et al. | |
| 6,355,573 B1 | 3/2002 | Okumura | |
| 6,364,949 B1 | 4/2002 | Or et al. | |
| 6,364,954 B2 | 4/2002 | Umotoy et al. | |
| 6,364,957 B1 | 4/2002 | Schneider et al. | |
| 6,372,657 B1 | 4/2002 | Hineman et al. | |
| 6,375,748 B1 | 4/2002 | Yudovsky et al. | |
| 6,376,386 B1 | 4/2002 | Oshima | |
| 6,379,575 B1 | 4/2002 | Yin et al. | |
| 6,383,896 B1 * | 5/2002 | Kirimura | C23C 16/452 438/478 |
| 6,383,951 B1 | 5/2002 | Li | |
| 6,387,207 B1 | 5/2002 | Janakiraman et al. | |
| 6,395,150 B1 | 5/2002 | Van Cleemput et al. | |
| 6,403,491 B1 | 6/2002 | Liu et al. | |
| 6,415,736 B1 | 7/2002 | Hao et al. | |
| 6,416,647 B1 | 7/2002 | Dordi et al. | |
| 6,416,874 B1 | 7/2002 | Cox et al. | |
| 6,423,284 B1 | 7/2002 | Arno | |
| 6,429,465 B1 | 8/2002 | Yagi et al. | |
| 6,432,819 B1 | 8/2002 | Pavate et al. | |
| 6,432,831 B2 | 8/2002 | Dhindsa et al. | |
| 6,436,193 B1 | 8/2002 | Kasai et al. | |
| 6,436,816 B1 | 8/2002 | Lee et al. | |
| 6,440,863 B1 | 8/2002 | Tsai et al. | |
| 6,441,492 B1 | 8/2002 | Cunningham | |
| 6,446,572 B1 | 9/2002 | Brcka | |
| 6,448,537 B1 | 9/2002 | Nering | |
| 6,458,718 B1 | 10/2002 | Todd | |
| 6,462,371 B1 | 10/2002 | Weimer et al. | |
| 6,462,372 B1 | 10/2002 | Xia et al. | |
| 6,465,051 B1 | 10/2002 | Sahin et al. | |
| 6,465,350 B1 | 10/2002 | Taylor et al. | |
| 6,465,366 B1 | 10/2002 | Nemani et al. | |

(56) References Cited

U.S. PATENT DOCUMENTS

| | | |
|---|---|---|
| 6,477,980 B1 | 11/2002 | White et al. |
| 6,479,373 B2 | 11/2002 | Dreybrodt et al. |
| 6,488,984 B1 | 12/2002 | Wada et al. |
| 6,494,959 B1 | 12/2002 | Samoilov et al. |
| 6,500,728 B1 | 12/2002 | Wang |
| 6,503,843 B1 | 1/2003 | Xia et al. |
| 6,506,291 B2 | 1/2003 | Tsai et al. |
| 6,509,283 B1 | 1/2003 | Thomas |
| 6,509,623 B2 | 1/2003 | Zhao |
| 6,516,815 B1 | 2/2003 | Stevens et al. |
| 6,518,548 B2 | 2/2003 | Sugaya et al. |
| 6,527,968 B1 | 3/2003 | Wang et al. |
| 6,528,409 B1 | 3/2003 | Lopatin et al. |
| 6,528,751 B1 | 3/2003 | Hoffman et al. |
| 6,531,377 B2 | 3/2003 | Knorr et al. |
| 6,537,707 B1 | 3/2003 | Lee |
| 6,537,733 B2 | 3/2003 | Campana et al. |
| 6,541,397 B1 | 4/2003 | Bencher |
| 6,541,671 B1 | 4/2003 | Martinez et al. |
| 6,544,340 B2 | 4/2003 | Yudovsky |
| 6,547,977 B1 | 4/2003 | Yan et al. |
| 6,551,924 B1 | 4/2003 | Dalton et al. |
| 6,558,564 B1 | 5/2003 | Loewenhardt |
| 6,565,661 B1 | 5/2003 | Nguyen |
| 6,565,729 B2 | 5/2003 | Chen et al. |
| 6,569,773 B1 | 5/2003 | Gellrich et al. |
| 6,572,937 B2 | 6/2003 | Hakovirta et al. |
| 6,573,030 B1 | 6/2003 | Fairbairn et al. |
| 6,573,606 B2 | 6/2003 | Sambucetti et al. |
| 6,585,851 B1 | 7/2003 | Ohmi et al. |
| 6,596,599 B1 | 7/2003 | Guo |
| 6,596,602 B2 | 7/2003 | Iizuka et al. |
| 6,596,654 B1 | 7/2003 | Bayman et al. |
| 6,602,434 B1 | 8/2003 | Hung et al. |
| 6,602,806 B1 | 8/2003 | Xia et al. |
| 6,603,269 B1 | 8/2003 | Vo et al. |
| 6,605,874 B2 | 8/2003 | Leu et al. |
| 6,616,967 B1 | 9/2003 | Test |
| 6,627,532 B1 | 9/2003 | Gaillard et al. |
| 6,635,575 B1 | 10/2003 | Xia et al. |
| 6,635,578 B1 | 10/2003 | Xu et al. |
| 6,638,810 B2 | 10/2003 | Bakli et al. |
| 6,645,301 B2 | 11/2003 | Sainty et al. |
| 6,645,550 B1 | 11/2003 | Cheung et al. |
| 6,656,831 B1 | 12/2003 | Lee et al. |
| 6,656,837 B2 | 12/2003 | Xu et al. |
| 6,656,848 B1 | 12/2003 | Scanlan et al. |
| 6,677,242 B1 | 1/2004 | Liu et al. |
| 6,677,247 B2 | 1/2004 | Yuan et al. |
| 6,679,981 B1 | 1/2004 | Pan et al. |
| 6,688,375 B1 | 2/2004 | Turner |
| 6,713,356 B1 | 3/2004 | Skotnicki et al. |
| 6,713,835 B1 | 3/2004 | Horak et al. |
| 6,717,189 B2 | 4/2004 | Inoue et al. |
| 6,720,213 B1 | 4/2004 | Gambino et al. |
| 6,736,147 B2 | 5/2004 | Satoh et al. |
| 6,736,987 B1 | 5/2004 | Cho |
| 6,740,247 B1 | 5/2004 | Han et al. |
| 6,740,585 B2 | 5/2004 | Yoon et al. |
| 6,740,977 B2 | 5/2004 | Ahn et al. |
| 6,743,473 B1 | 6/2004 | Parkhe et al. |
| 6,743,732 B1 | 6/2004 | Lin et al. |
| 6,759,261 B2 | 7/2004 | Shimokohbe et al. |
| 6,762,127 B2 | 7/2004 | Boiteux et al. |
| 6,762,435 B2 | 7/2004 | Towle |
| 6,764,958 B1 | 7/2004 | Nemani et al. |
| 6,765,273 B1 | 7/2004 | Chau et al. |
| 6,767,834 B2 | 7/2004 | Chung et al. |
| 6,768,079 B2 | 7/2004 | Kosakai |
| 6,770,166 B1 | 8/2004 | Fisher |
| 6,772,827 B2 | 8/2004 | Keller et al. |
| 6,792,889 B2 | 9/2004 | Nakano et al. |
| 6,794,290 B1 | 9/2004 | Papasouliotis et al. |
| 6,794,311 B2 | 9/2004 | Huang et al. |
| 6,796,314 B1 | 9/2004 | Graff et al. |
| 6,800,336 B1 | 10/2004 | Fornsel et al. |
| 6,800,830 B2 | 10/2004 | Mahawili |
| 6,802,944 B2 | 10/2004 | Ahmad et al. |
| 6,808,564 B2 | 10/2004 | Dietze |
| 6,808,747 B1 | 10/2004 | Shih et al. |
| 6,808,748 B2 | 10/2004 | Kapoor et al. |
| 6,815,633 B1 | 11/2004 | Chen et al. |
| 6,821,571 B2 | 11/2004 | Huang |
| 6,823,589 B2 | 11/2004 | White et al. |
| 6,828,241 B2 | 12/2004 | Kholodenko et al. |
| 6,830,624 B2 | 12/2004 | Janakiraman et al. |
| 6,835,995 B2 | 12/2004 | Li |
| 6,846,745 B1 | 1/2005 | Papasouliotis et al. |
| 6,849,854 B2 | 2/2005 | Sainty |
| 6,852,584 B1 | 2/2005 | Chen et al. |
| 6,853,533 B2 | 2/2005 | Parkhe et al. |
| 6,861,097 B1 | 3/2005 | Goosey et al. |
| 6,861,332 B2 | 3/2005 | Park et al. |
| 6,867,141 B2 | 3/2005 | Jung et al. |
| 6,869,880 B2 | 3/2005 | Krishnaraj et al. |
| 6,875,280 B2 | 4/2005 | Ikeda et al. |
| 6,878,206 B2 | 4/2005 | Tzu et al. |
| 6,879,981 B2 | 4/2005 | Rothschild et al. |
| 6,893,967 B1 | 5/2005 | Wright et al. |
| 6,900,596 B2 | 5/2005 | Yang et al. |
| 6,903,031 B2 | 6/2005 | Karim et al. |
| 6,903,511 B2 | 6/2005 | Chistyakov |
| 6,908,862 B2 | 6/2005 | Li et al. |
| 6,911,112 B2 | 6/2005 | An et al. |
| 6,911,401 B2 | 6/2005 | Khandan et al. |
| 6,916,399 B1 | 7/2005 | Rozenzon et al. |
| 6,921,556 B2 | 7/2005 | Shimizu et al. |
| 6,924,191 B2 | 8/2005 | Liu et al. |
| 6,930,047 B2 | 8/2005 | Yamazaki |
| 6,935,269 B2 | 8/2005 | Lee et al. |
| 6,942,753 B2 | 9/2005 | Choi et al. |
| 6,946,033 B2 | 9/2005 | Tsuei et al. |
| 6,951,821 B2 | 10/2005 | Hamelin et al. |
| 6,958,175 B2 | 10/2005 | Sakamoto et al. |
| 6,958,286 B2 | 10/2005 | Chen et al. |
| 6,969,619 B1 | 11/2005 | Winniczek |
| 6,974,780 B2 | 12/2005 | Schuegraf |
| 6,995,073 B2 | 2/2006 | Liou |
| 7,017,269 B2 | 3/2006 | White et al. |
| 7,030,034 B2 | 4/2006 | Fucsko et al. |
| 7,037,846 B2 | 5/2006 | Srivastava et al. |
| 7,049,200 B2 | 5/2006 | Arghavani et al. |
| 7,052,553 B1 | 5/2006 | Shih et al. |
| 7,071,532 B2 | 7/2006 | Geffken et al. |
| 7,078,312 B1 | 7/2006 | Sutanto et al. |
| 7,081,414 B2 | 7/2006 | Zhang et al. |
| 7,084,070 B1 | 8/2006 | Lee et al. |
| 7,115,525 B2 | 10/2006 | Abatchev et al. |
| 7,122,949 B2 | 10/2006 | Strikovski |
| 7,138,767 B2 | 11/2006 | Chen et al. |
| 7,145,725 B2 | 12/2006 | Hasel et al. |
| 7,148,155 B1 | 12/2006 | Tarafdar et al. |
| 7,183,214 B2 | 2/2007 | Nam et al. |
| 7,196,342 B2 | 3/2007 | Ershov et al. |
| 7,205,240 B2 | 4/2007 | Karim et al. |
| 7,223,701 B2 | 5/2007 | Min et al. |
| 7,226,805 B2 | 6/2007 | Hallin et al. |
| 7,244,474 B2 | 7/2007 | Hanawa et al. |
| 7,252,011 B2 | 8/2007 | Traverso |
| 7,252,716 B2 | 8/2007 | Kim et al. |
| 7,253,123 B2 | 8/2007 | Arghavani et al. |
| 7,256,370 B2 | 8/2007 | Guiver |
| 7,274,004 B2 | 9/2007 | Benjamin et al. |
| 7,288,482 B2 | 10/2007 | Panda et al. |
| 7,291,360 B2 | 11/2007 | Hanawa et al. |
| 7,316,761 B2 | 1/2008 | Doan et al. |
| 7,329,608 B2 | 2/2008 | Babayan et al. |
| 7,341,633 B2 | 3/2008 | Lubomirsky et al. |
| 7,344,912 B1 | 3/2008 | Okoroanyanwu |
| 7,358,192 B2 | 4/2008 | Merry et al. |
| 7,361,865 B2 | 4/2008 | Maki et al. |
| 7,364,956 B2 | 4/2008 | Saito |
| 7,390,710 B2 | 6/2008 | Derderian et al. |
| 7,396,480 B2 | 7/2008 | Kao et al. |

(56) References Cited

U.S. PATENT DOCUMENTS

| | | | |
|---|---|---|---|
| 7,396,773 B1 | 7/2008 | Blosse et al. |
| 7,465,358 B2 | 12/2008 | Weidman et al. |
| 7,465,953 B1 | 12/2008 | Koh et al. |
| 7,468,319 B2 | 12/2008 | Lee |
| 7,479,303 B2 | 1/2009 | Byun et al. |
| 7,484,473 B2 | 2/2009 | Keller et al. |
| 7,488,688 B2 | 2/2009 | Seung-Pil et al. |
| 7,494,545 B2 | 2/2009 | Lam et al. |
| 7,500,445 B2 | 3/2009 | Zhao et al. |
| 7,513,214 B2 | 4/2009 | Okumura et al. |
| 7,520,957 B2 | 4/2009 | Kao et al. |
| 7,553,756 B2 | 6/2009 | Hayashi et al. |
| 7,581,511 B2 | 9/2009 | Mardian et al. |
| 7,604,708 B2 | 10/2009 | Wood et al. |
| 7,611,980 B2 | 11/2009 | Wells |
| 7,628,897 B2 | 12/2009 | Mungekar et al. |
| 7,658,799 B2 | 2/2010 | Ishikawa et al. |
| 7,682,518 B2 | 3/2010 | Chandrachood et al. |
| 7,695,590 B2 | 4/2010 | Hanawa et al. |
| 7,708,859 B2 | 5/2010 | Huang et al. |
| 7,709,396 B2 | 5/2010 | Bencher et al. |
| 7,722,925 B2 | 5/2010 | White et al. |
| 7,723,221 B2 | 5/2010 | Hayashi |
| 7,749,326 B2 | 7/2010 | Kim et al. |
| 7,780,790 B2 | 8/2010 | Nogami |
| 7,785,672 B2 | 8/2010 | Choi et al. |
| 7,790,634 B2 | 9/2010 | Munro et al. |
| 7,806,077 B2 | 10/2010 | Lee et al. |
| 7,806,078 B2 | 10/2010 | Yoshida |
| 7,807,578 B2 | 10/2010 | Bencher et al. |
| 7,825,038 B2 | 11/2010 | Ingle et al. |
| 7,837,828 B2 | 11/2010 | Ikeda et al. |
| 7,845,309 B2 | 12/2010 | Condrashoff et al. |
| 7,867,926 B2 | 1/2011 | Satoh et al. |
| 7,871,926 B2 | 1/2011 | Xia et al. |
| 7,910,491 B2 | 3/2011 | Soo Kwon et al. |
| 7,915,139 B1 | 3/2011 | Lang et al. |
| 7,922,863 B2 | 4/2011 | Ripley |
| 7,932,181 B2 | 4/2011 | Singh et al. |
| 7,976,631 B2 | 4/2011 | Burrows |
| 7,939,422 B2 | 5/2011 | Ingle et al. |
| 7,968,441 B2 | 6/2011 | Xu |
| 7,977,249 B1 | 7/2011 | Liu |
| 7,981,806 B2 | 7/2011 | Jung |
| 7,989,365 B2 | 8/2011 | Park et al. |
| 8,008,166 B2 | 8/2011 | Sanchez et al. |
| 8,048,811 B2 | 11/2011 | Feustel et al. |
| 8,058,179 B1 | 11/2011 | Draegar et al. |
| 8,071,482 B2 | 12/2011 | Kawada |
| 8,074,599 B2 | 12/2011 | Choi et al. |
| 8,076,198 B2 | 12/2011 | Lee et al. |
| 8,083,853 B2 | 12/2011 | Choi et al. |
| 8,114,245 B2 | 2/2012 | Ohmi et al. |
| 8,119,530 B2 | 2/2012 | Hori et al. |
| 8,173,228 B2 | 5/2012 | Choi et al. |
| 8,183,134 B2 | 5/2012 | Wu |
| 8,187,486 B1 | 5/2012 | Liu et al. |
| 8,211,808 B2 | 7/2012 | Sapre et al. |
| 8,216,486 B2 | 7/2012 | Dhindsa |
| 8,222,128 B2 | 7/2012 | Sasaki et al. |
| 8,252,194 B2 | 8/2012 | Kiehlbauch et al. |
| 8,272,346 B2 | 9/2012 | Bettencourt et al. |
| 8,295,089 B2 | 10/2012 | Jeong et al. |
| 8,298,627 B2 | 10/2012 | Minami et al. |
| 8,298,959 B2 | 10/2012 | Cheshire |
| 8,309,440 B2 | 11/2012 | Sanchez et al. |
| 8,312,839 B2 | 11/2012 | Baek |
| 8,313,610 B2 | 11/2012 | Dhindsa |
| 8,328,939 B2 | 12/2012 | Choi et al. |
| 8,329,262 B2 | 12/2012 | Miller et al. |
| 8,336,188 B2 | 12/2012 | Monteen |
| 8,361,892 B2 | 1/2013 | Tam et al. |
| 8,368,308 B2 | 2/2013 | Banna et al. |
| 8,390,980 B2 | 3/2013 | Sansoni et al. |
| 8,427,067 B2 | 4/2013 | Espiau et al. |
| 8,435,902 B2 | 5/2013 | Tang et al. |
| 8,440,523 B1 | 5/2013 | Guillorn et al. |
| 8,466,073 B2 | 6/2013 | Wang et al. |
| 8,475,674 B2 | 7/2013 | Thadani et al. |
| 8,480,850 B2 | 7/2013 | Tyler et al. |
| 8,501,629 B2 | 8/2013 | Tang et al. |
| 8,506,713 B2 | 8/2013 | Takagi |
| 8,512,509 B2 | 8/2013 | Bera et al. |
| 8,528,889 B2 | 9/2013 | Sansoni et al. |
| 8,540,844 B2 | 9/2013 | Hudson et al. |
| 8,551,891 B2 | 10/2013 | Liang |
| 8,573,152 B2 | 11/2013 | De La Llera |
| 8,622,021 B2 | 1/2014 | Taylor et al. |
| 8,623,148 B2 | 1/2014 | Mitchell et al. |
| 8,623,471 B2 | 1/2014 | Tyler et al. |
| 8,633,423 B2 | 1/2014 | Lin et al. |
| 8,642,481 B2 | 2/2014 | Wang et al. |
| 8,652,298 B2 | 2/2014 | Dhindsa et al. |
| 8,668,836 B2 | 3/2014 | Mizukami et al. |
| 8,679,982 B2 | 3/2014 | Wang et al. |
| 8,679,983 B2 | 3/2014 | Wang et al. |
| 8,691,023 B2 | 4/2014 | Bao et al. |
| 8,702,902 B2 | 4/2014 | Blom et al. |
| 8,741,778 B2 | 6/2014 | Yang et al. |
| 8,747,680 B1 | 6/2014 | Deshpande |
| 8,748,322 B1 | 6/2014 | Fung et al. |
| 8,765,574 B2 | 7/2014 | Zhang et al. |
| 8,771,536 B2 | 7/2014 | Zhang et al. |
| 8,771,539 B2 | 7/2014 | Zhang et al. |
| 8,778,079 B2 | 7/2014 | Begarney et al. |
| 8,801,952 B1 | 8/2014 | Wang et al. |
| 8,802,572 B2 | 8/2014 | Nemani et al. |
| 8,808,563 B2 | 8/2014 | Wang et al. |
| 8,815,720 B2 | 8/2014 | Godet et al. |
| 8,846,163 B2 | 9/2014 | Kao et al. |
| 8,869,742 B2 | 10/2014 | Dhindsa |
| 8,871,651 B1 | 10/2014 | Choi et al. |
| 8,888,087 B2 | 11/2014 | Okabe et al. |
| 8,894,767 B2 | 11/2014 | Goradia et al. |
| 8,895,449 B1 | 11/2014 | Zhu et al. |
| 8,900,364 B2 | 12/2014 | Wright |
| 8,921,234 B2 | 12/2014 | Liu et al. |
| 8,927,390 B2 | 1/2015 | Sapre et al. |
| 8,932,947 B1 | 1/2015 | Han et al. |
| 8,937,017 B2 | 1/2015 | Cheshire et al. |
| 8,951,429 B1 | 2/2015 | Liu et al. |
| 8,969,212 B2 | 3/2015 | Ren et al. |
| 8,970,114 B2 | 3/2015 | Busche et al. |
| 8,980,005 B2 | 3/2015 | Carlson et al. |
| 8,980,758 B1 | 3/2015 | Ling et al. |
| 8,980,763 B2 | 3/2015 | Wang et al. |
| 8,992,733 B2 | 3/2015 | Sorensen et al. |
| 8,999,656 B2 | 4/2015 | Zhang et al. |
| 8,999,839 B2 | 4/2015 | Su et al. |
| 8,999,856 B2 | 4/2015 | Zhang |
| 9,012,302 B2 | 4/2015 | Sapre et al. |
| 9,017,481 B1 | 4/2015 | Pettinger et al. |
| 9,023,732 B2 | 5/2015 | Wang et al. |
| 9,023,734 B2 | 5/2015 | Chen et al. |
| 9,034,770 B2 | 5/2015 | Park et al. |
| 9,040,422 B2 | 5/2015 | Wang et al. |
| 9,064,815 B2 | 6/2015 | Zhang et al. |
| 9,064,816 B2 | 6/2015 | Kim et al. |
| 9,072,158 B2 | 6/2015 | Ikeda et al. |
| 9,093,371 B2 | 7/2015 | Wang et al. |
| 9,093,389 B2 | 7/2015 | Nemani |
| 9,093,390 B2 | 7/2015 | Wang et al. |
| 9,111,877 B2 | 8/2015 | Chen et al. |
| 9,111,907 B2 | 8/2015 | Kamineni |
| 9,114,438 B2 | 8/2015 | Hoinkis et al. |
| 9,117,855 B2 | 8/2015 | Cho et al. |
| 9,132,436 B2 | 9/2015 | Liang et al. |
| 9,136,273 B1 | 9/2015 | Purayath et al. |
| 9,144,147 B2 | 9/2015 | Yang et al. |
| 9,153,442 B2 | 10/2015 | Wang et al. |
| 9,159,606 B1 | 10/2015 | Purayath et al. |
| 9,165,783 B2 | 10/2015 | Nemani et al. |
| 9,165,786 B1 | 10/2015 | Purayath et al. |
| 9,184,055 B2 | 11/2015 | Wang et al. |

(56) References Cited

U.S. PATENT DOCUMENTS

| | | |
|---|---|---|
| 9,190,290 B2 | 11/2015 | Xue et al. |
| 9,190,293 B2 | 11/2015 | Wang et al. |
| 9,190,302 B2 | 11/2015 | Ni |
| 9,202,708 B1 | 12/2015 | Chen et al. |
| 9,209,012 B2 | 12/2015 | Chen et al. |
| 9,236,265 B2 | 1/2016 | Korolik et al. |
| 9,236,266 B2 | 1/2016 | Zhang et al. |
| 9,240,315 B1 | 1/2016 | Hsieh et al. |
| 9,245,762 B2 | 1/2016 | Zhang et al. |
| 9,263,278 B2 | 2/2016 | Purayath et al. |
| 9,269,590 B2 | 2/2016 | Luere et al. |
| 9,275,834 B1 | 3/2016 | Park et al. |
| 9,287,095 B2 | 3/2016 | Nguyen et al. |
| 9,287,134 B2 | 3/2016 | Wang et al. |
| 9,293,568 B2 | 3/2016 | Ko |
| 9,299,537 B2 | 3/2016 | Kobayashi et al. |
| 9,299,538 B2 | 3/2016 | Kobayashi et al. |
| 9,299,575 B2 | 3/2016 | Park et al. |
| 9,299,582 B2 | 3/2016 | Ingle et al. |
| 9,299,583 B1 | 3/2016 | Wang et al. |
| 9,309,598 B2 | 4/2016 | Wang et al. |
| 9,324,576 B2 | 4/2016 | Zhang et al. |
| 9,343,272 B1 | 5/2016 | Pandit et al. |
| 9,343,327 B2 | 5/2016 | Zhang et al. |
| 9,349,605 B1 | 5/2016 | Xu et al. |
| 9,355,856 B2 | 5/2016 | Wang et al. |
| 9,355,862 B2 | 5/2016 | Pandit et al. |
| 9,355,863 B2 | 5/2016 | Chen et al. |
| 9,355,922 B2 | 5/2016 | Park et al. |
| 9,362,130 B2 | 6/2016 | Ingle et al. |
| 9,362,163 B2 | 6/2016 | Danek et al. |
| 9,368,364 B2 | 6/2016 | Park et al. |
| 9,373,517 B2 | 6/2016 | Yang et al. |
| 9,373,522 B1 | 6/2016 | Wang et al. |
| 9,378,969 B2 | 6/2016 | Hsu et al. |
| 9,378,978 B2 | 6/2016 | Purayath et al. |
| 9,384,997 B2 | 7/2016 | Ren et al. |
| 9,385,028 B2 | 7/2016 | Nemani et al. |
| 9,390,937 B2 | 7/2016 | Chen et al. |
| 9,396,961 B2 | 7/2016 | Arghavani et al. |
| 9,396,989 B2 | 7/2016 | Purayath et al. |
| 9,406,523 B2 | 8/2016 | Chen et al. |
| 9,412,608 B2 | 8/2016 | Wang et al. |
| 9,418,858 B2 | 8/2016 | Wang et al. |
| 9,425,041 B2 | 8/2016 | Berry et al. |
| 9,425,058 B2 | 8/2016 | Kim et al. |
| 9,431,268 B2 | 8/2016 | Lill et al. |
| 9,343,358 B1 | 9/2016 | Montgomery |
| 9,437,451 B2 | 9/2016 | Chen et al. |
| 9,443,749 B2 | 9/2016 | Smith |
| 9,449,845 B2 | 9/2016 | Liu et al. |
| 9,449,846 B2 | 9/2016 | Liu et al. |
| 9,449,850 B2 | 9/2016 | Wang et al. |
| 9,460,959 B1 | 10/2016 | Xie et al. |
| 9,466,469 B2 | 10/2016 | Khaja |
| 9,472,412 B2 | 10/2016 | Zhang et al. |
| 9,472,417 B2 | 10/2016 | Ingle et al. |
| 9,478,432 B2 | 10/2016 | Chen et al. |
| 9,478,433 B1 | 10/2016 | Zhou et al. |
| 9,478,434 B2 | 10/2016 | Wang et al. |
| 9,493,879 B2 | 11/2016 | Hoinkis et al. |
| 9,496,167 B2 | 11/2016 | Purayath et al. |
| 9,499,898 B2 | 11/2016 | Nguyen et al. |
| 9,502,258 B2 | 11/2016 | Xue et al. |
| 9,508,529 B2 | 11/2016 | Valcore et al. |
| 9,520,303 B2 | 12/2016 | Wang et al. |
| 9,543,163 B2 | 1/2017 | Ling et al. |
| 9,564,296 B2 | 2/2017 | Kobayashi et al. |
| 9,564,338 B1 | 2/2017 | Zhang et al. |
| 9,576,788 B2 | 2/2017 | Liu et al. |
| 9,576,809 B2 | 2/2017 | Korolik et al. |
| 9,601,319 B1 | 3/2017 | Bravo et al. |
| 9,607,856 B2 | 3/2017 | Wang et al. |
| 9,613,822 B2 | 4/2017 | Chen et al. |
| 9,659,753 B2 | 5/2017 | Cho et al. |
| 9,659,791 B2 | 5/2017 | Wang et al. |
| 9,659,792 B2 | 5/2017 | Wang et al. |
| 9,666,449 B2 | 5/2017 | Koval et al. |
| 9,691,645 B2 | 6/2017 | Ayers |
| 9,704,723 B2 | 7/2017 | Wang et al. |
| 9,711,366 B2 | 7/2017 | Ingle et al. |
| 9,721,789 B1 | 8/2017 | Yang et al. |
| 9,728,437 B2 | 8/2017 | Tran et al. |
| 9,741,593 B2 | 8/2017 | Benjaminson et al. |
| 9,754,800 B2 | 9/2017 | Zhang et al. |
| 9,768,034 B1 | 9/2017 | Xu et al. |
| 9,773,648 B2 | 9/2017 | Cho et al. |
| 9,773,695 B2 | 9/2017 | Purayath et al. |
| 9,779,956 B1 | 10/2017 | Zhang et al. |
| 9,822,009 B2 | 11/2017 | Kagaya et al. |
| 9,831,097 B2 | 11/2017 | Ingle et al. |
| 9,837,249 B2 | 12/2017 | Kobayashi et al. |
| 9,837,284 B2 | 12/2017 | Chen et al. |
| 9,837,286 B2 | 12/2017 | Yang et al. |
| 9,842,744 B2 | 12/2017 | Zhang et al. |
| 9,865,484 B1 | 1/2018 | Citla et al. |
| 9,881,805 B2 | 1/2018 | Li et al. |
| 9,885,117 B2 | 2/2018 | Lubomirsky et al. |
| 9,887,096 B2 | 2/2018 | Park et al. |
| 9,903,020 B2 | 2/2018 | Kim et al. |
| 9,934,942 B1 | 4/2018 | Lubomirsky |
| 9,947,549 B1 | 4/2018 | Park et al. |
| 9,966,240 B2 | 5/2018 | Park et al. |
| 9,978,564 B2 | 5/2018 | Liang et al. |
| 9,991,134 B2 | 6/2018 | Wang et al. |
| 10,026,621 B2 | 7/2018 | Ko et al. |
| 10,032,606 B2 | 7/2018 | Yang et al. |
| 10,043,674 B1 | 8/2018 | Korolik et al. |
| 10,043,684 B1 | 8/2018 | Arnepalli et al. |
| 10,049,891 B1 | 8/2018 | Wang et al. |
| 10,062,578 B2 | 8/2018 | Zhang et al. |
| 10,062,579 B2 | 8/2018 | Chen et al. |
| 10,062,585 B2 | 8/2018 | Lubomirsky |
| 10,062,587 B2 | 8/2018 | Chen et al. |
| 2001/0006093 A1 | 7/2001 | Tabuchi et al. |
| 2001/0015175 A1 | 8/2001 | Masuda et al. |
| 2001/0015261 A1 | 8/2001 | Kobayashi et al. |
| 2001/0028093 A1 | 10/2001 | Yamazaki et al. |
| 2001/0028922 A1 | 10/2001 | Sandhu |
| 2001/0029891 A1 | 10/2001 | Oh et al. |
| 2001/0030366 A1 | 10/2001 | Nakano et al. |
| 2001/0034106 A1 | 10/2001 | Moise et al. |
| 2001/0034121 A1 | 10/2001 | Fu et al. |
| 2001/0035124 A1 | 11/2001 | Okayama et al. |
| 2001/0036706 A1 | 11/2001 | Kitamura |
| 2001/0037856 A1 | 11/2001 | Park |
| 2001/0037941 A1 | 11/2001 | Thompson |
| 2001/0039921 A1 | 11/2001 | Rolfson et al. |
| 2001/0041444 A1 | 11/2001 | Shields et al. |
| 2001/0042512 A1 | 11/2001 | Xu et al. |
| 2001/0047760 A1 | 12/2001 | Moslehi |
| 2001/0053585 A1 | 12/2001 | Kikuchi et al. |
| 2001/0053610 A1 | 12/2001 | Athavale et al. |
| 2001/0054381 A1 | 12/2001 | Umotoy et al. |
| 2001/0054387 A1 | 12/2001 | Frankel et al. |
| 2001/0055842 A1 | 12/2001 | Uh et al. |
| 2002/0001778 A1 | 1/2002 | Latchford et al. |
| 2002/0009560 A1 | 1/2002 | Ozono |
| 2002/0009885 A1 | 1/2002 | Brankner et al. |
| 2002/0011210 A1 | 1/2002 | Satoh et al. |
| 2002/0011214 A1 | 1/2002 | Kamarehi et al. |
| 2002/0016080 A1 | 2/2002 | Khan et al. |
| 2002/0016085 A1 | 2/2002 | Huang et al. |
| 2002/0023899 A1 | 2/2002 | Khater et al. |
| 2002/0028585 A1 | 3/2002 | Chung et al. |
| 2002/0029747 A1 | 3/2002 | Powell et al. |
| 2002/0033233 A1 | 3/2002 | Savas |
| 2002/0036143 A1 | 3/2002 | Segawa et al. |
| 2002/0040766 A1 | 4/2002 | Takahashi et al. |
| 2002/0043690 A1 | 4/2002 | Doyle et al. |
| 2002/0045966 A1 | 4/2002 | Lee et al. |
| 2002/0046991 A1 | 4/2002 | Smith et al. |
| 2002/0054962 A1 | 5/2002 | Huang |
| 2002/0062954 A1 | 5/2002 | Getchel et al. |

(56) References Cited

U.S. PATENT DOCUMENTS

| | | |
|---|---|---|
| 2002/0069820 A1 | 6/2002 | Yudovsky |
| 2002/0086501 A1 | 7/2002 | O'Donnell et al. |
| 2002/0090781 A1 | 7/2002 | Skotnicki et al. |
| 2002/0092835 A1 | 7/2002 | Chakravarti et al. |
| 2002/0094378 A1 | 7/2002 | O'Donnell |
| 2002/0094591 A1 | 7/2002 | Sill et al. |
| 2002/0096493 A1 | 7/2002 | Hattori |
| 2002/0098681 A1 | 7/2002 | Hu et al. |
| 2002/0106845 A1 | 8/2002 | Chao et al. |
| 2002/0112819 A1* | 8/2002 | Kamarehi ......... H01J 37/32192 156/345.36 |
| 2002/0124867 A1 | 9/2002 | Kim et al. |
| 2002/0129902 A1 | 9/2002 | Babayan et al. |
| 2002/0144657 A1 | 10/2002 | Chiang et al. |
| 2002/0153808 A1 | 10/2002 | Skotnicki et al. |
| 2002/0164885 A1 | 11/2002 | Lill et al. |
| 2002/0170678 A1 | 11/2002 | Hayashi et al. |
| 2002/0177322 A1 | 11/2002 | Li et al. |
| 2002/0179248 A1 | 12/2002 | Kabansky et al. |
| 2002/0182878 A1 | 12/2002 | Hirose et al. |
| 2002/0187655 A1 | 12/2002 | Tan et al. |
| 2002/0197823 A1 | 12/2002 | Yoo et al. |
| 2003/0000647 A1 | 1/2003 | Yudovsky et al. |
| 2003/0007910 A1 | 1/2003 | Lazarovich et al. |
| 2003/0010645 A1 | 1/2003 | Ting et al. |
| 2003/0019428 A1 | 1/2003 | Ku et al. |
| 2003/0019580 A1 | 1/2003 | Strang |
| 2003/0026060 A1 | 2/2003 | Hiramatsu et al. |
| 2003/0029566 A1 | 2/2003 | Roth |
| 2003/0029567 A1 | 2/2003 | Dhindsa et al. |
| 2003/0029715 A1 | 2/2003 | Yu et al. |
| 2003/0031905 A1 | 2/2003 | Saito et al. |
| 2003/0032284 A1 | 2/2003 | Enomoto et al. |
| 2003/0038127 A1 | 2/2003 | Liu et al. |
| 2003/0038305 A1 | 2/2003 | Wasshuber |
| 2003/0066482 A1 | 4/2003 | Pokharna et al. |
| 2003/0071035 A1 | 4/2003 | Brailove |
| 2003/0072639 A1 | 4/2003 | White et al. |
| 2003/0075808 A1 | 4/2003 | Inoue et al. |
| 2003/0077857 A1 | 4/2003 | Xia et al. |
| 2003/0077909 A1 | 4/2003 | Jiwari |
| 2003/0079686 A1 | 5/2003 | Chen et al. |
| 2003/0087488 A1 | 5/2003 | Fink |
| 2003/0087531 A1 | 5/2003 | Kang et al. |
| 2003/0091938 A1 | 5/2003 | Fairbairn et al. |
| 2003/0094134 A1 | 5/2003 | Minami et al. |
| 2003/0098125 A1 | 5/2003 | An |
| 2003/0109143 A1 | 6/2003 | Hsieh et al. |
| 2003/0116087 A1 | 6/2003 | Nguyen et al. |
| 2003/0116439 A1 | 6/2003 | Seo et al. |
| 2003/0121608 A1 | 7/2003 | Chen et al. |
| 2003/0121609 A1 | 7/2003 | Ohmi et al. |
| 2003/0124465 A1 | 7/2003 | Lee et al. |
| 2003/0124842 A1 | 7/2003 | Hytros et al. |
| 2003/0127049 A1 | 7/2003 | Han et al. |
| 2003/0127740 A1 | 7/2003 | Hsu et al. |
| 2003/0129106 A1 | 7/2003 | Sorensen et al. |
| 2003/0129827 A1 | 7/2003 | Lee et al. |
| 2003/0132319 A1 | 7/2003 | Hytros et al. |
| 2003/0140844 A1 | 7/2003 | Maa et al. |
| 2003/0143328 A1 | 7/2003 | Chen et al. |
| 2003/0148035 A1 | 8/2003 | Lingampalli |
| 2003/0150530 A1 | 8/2003 | Lin et al. |
| 2003/0152691 A1 | 8/2003 | Baude |
| 2003/0159307 A1 | 8/2003 | Sago et al. |
| 2003/0164226 A1 | 9/2003 | Kanno et al. |
| 2003/0168439 A1 | 9/2003 | Kanno et al. |
| 2003/0170945 A1 | 9/2003 | Igeta et al. |
| 2003/0173333 A1 | 9/2003 | Wang et al. |
| 2003/0173347 A1 | 9/2003 | Guiver |
| 2003/0173675 A1 | 9/2003 | Watanabe et al. |
| 2003/0181040 A1 | 9/2003 | Ivanov et al. |
| 2003/0183244 A1 | 10/2003 | Rossman |
| 2003/0190426 A1 | 10/2003 | Padhi et al. |
| 2003/0196760 A1 | 10/2003 | Tyler et al. |
| 2003/0199170 A1 | 10/2003 | Li |
| 2003/0200929 A1 | 10/2003 | Otsuki |
| 2003/0205329 A1 | 11/2003 | Gujer et al. |
| 2003/0205479 A1 | 11/2003 | Lin et al. |
| 2003/0209323 A1 | 11/2003 | Yokogaki et al. |
| 2003/0215570 A1 | 11/2003 | Seutter et al. |
| 2003/0215963 A1 | 11/2003 | AmRhein et al. |
| 2003/0216044 A1 | 11/2003 | Lin et al. |
| 2003/0221780 A1 | 12/2003 | Lei et al. |
| 2003/0224217 A1 | 12/2003 | Byun et al. |
| 2003/0224617 A1 | 12/2003 | Baek et al. |
| 2003/0230385 A1 | 12/2003 | Bach et al. |
| 2004/0003828 A1 | 1/2004 | Jackson |
| 2004/0005726 A1 | 1/2004 | Huang |
| 2004/0018304 A1 | 1/2004 | Chung et al. |
| 2004/0020801 A1 | 2/2004 | Zhao et al. |
| 2004/0026371 A1 | 2/2004 | Nguyen et al. |
| 2004/0033678 A1 | 2/2004 | Arghavani et al. |
| 2004/0033684 A1 | 2/2004 | Li |
| 2004/0058070 A1 | 3/2004 | Takeuchi et al. |
| 2004/0058293 A1 | 3/2004 | Nguyen et al. |
| 2004/0060514 A1 | 4/2004 | Janakiraman et al. |
| 2004/0061447 A1 | 4/2004 | Saigusa et al. |
| 2004/0069225 A1 | 4/2004 | Fairbairn et al. |
| 2004/0070346 A1 | 4/2004 | Choi |
| 2004/0072446 A1 | 4/2004 | Liu et al. |
| 2004/0076529 A1 | 4/2004 | Gnauck et al. |
| 2004/0083967 A1* | 5/2004 | Yuda ................. C23C 16/45519 118/715 |
| 2004/0084150 A1 | 5/2004 | George et al. |
| 2004/0087139 A1 | 5/2004 | Yeh et al. |
| 2004/0092063 A1 | 5/2004 | Okumura |
| 2004/0099285 A1 | 5/2004 | Wang et al. |
| 2004/0099378 A1 | 5/2004 | Kim et al. |
| 2004/0101667 A1 | 5/2004 | O'Loughlin et al. |
| 2004/0103844 A1 | 6/2004 | Chou et al. |
| 2004/0107908 A1 | 6/2004 | Collins et al. |
| 2004/0108067 A1 | 6/2004 | Fischione et al. |
| 2004/0108068 A1 | 6/2004 | Senzaki et al. |
| 2004/0110354 A1 | 6/2004 | Natzle et al. |
| 2004/0115876 A1 | 6/2004 | Goundar et al. |
| 2004/0124280 A1 | 7/2004 | Shih et al. |
| 2004/0129224 A1 | 7/2004 | Yamazaki |
| 2004/0129671 A1 | 7/2004 | Ji et al. |
| 2004/0137161 A1 | 7/2004 | Segawa et al. |
| 2004/0140053 A1 | 7/2004 | Srivastava et al. |
| 2004/0144311 A1 | 7/2004 | Chen et al. |
| 2004/0147126 A1 | 7/2004 | Yamashita et al. |
| 2004/0149223 A1 | 8/2004 | Collison et al. |
| 2004/0149394 A1 | 8/2004 | Doan et al. |
| 2004/0152342 A1 | 8/2004 | Li |
| 2004/0154535 A1 | 8/2004 | Chen et al. |
| 2004/0157444 A1 | 8/2004 | Chiu |
| 2004/0161921 A1 | 8/2004 | Ryu |
| 2004/0175913 A1 | 9/2004 | Johnson et al. |
| 2004/0175929 A1 | 9/2004 | Schmitt et al. |
| 2004/0182315 A1 | 9/2004 | Laflamme et al. |
| 2004/0187787 A1 | 9/2004 | Dawson |
| 2004/0192032 A1 | 9/2004 | Ohmori et al. |
| 2004/0194799 A1 | 10/2004 | Kim et al. |
| 2004/0195216 A1 | 10/2004 | Strang |
| 2004/0200499 A1 | 10/2004 | Harvey |
| 2004/0211357 A1 | 10/2004 | Gadgil et al. |
| 2004/0219723 A1 | 11/2004 | Peng et al. |
| 2004/0219737 A1 | 11/2004 | Quon |
| 2004/0219789 A1 | 11/2004 | Wood et al. |
| 2004/0221809 A1 | 11/2004 | Ohmi et al. |
| 2004/0231706 A1 | 11/2004 | Bhatnagar et al. |
| 2004/0237897 A1 | 12/2004 | Hanawa et al. |
| 2004/0245091 A1 | 12/2004 | Karim et al. |
| 2004/0263827 A1 | 12/2004 | Xu et al. |
| 2005/0000432 A1 | 1/2005 | Keller et al. |
| 2005/0001276 A1 | 1/2005 | Gao et al. |
| 2005/0003676 A1 | 1/2005 | Ho et al. |
| 2005/0009340 A1 | 1/2005 | Saijo et al. |
| 2005/0009358 A1 | 1/2005 | Choi et al. |
| 2005/0026430 A1 | 2/2005 | Kim et al. |
| 2005/0026431 A1 | 2/2005 | Kazumi et al. |
| 2005/0035455 A1 | 2/2005 | Hu et al. |

(56) References Cited

U.S. PATENT DOCUMENTS

| | | |
|---|---|---|
| 2005/0039679 A1 | 2/2005 | Kleshock |
| 2005/0048801 A1 | 3/2005 | Karim et al. |
| 2005/0051094 A1 | 3/2005 | Schaepkens et al. |
| 2005/0056218 A1 | 3/2005 | Sun et al. |
| 2005/0079706 A1 | 4/2005 | Kumar et al. |
| 2005/0087517 A1 | 4/2005 | Ott et al. |
| 2005/0090078 A1 | 4/2005 | Ishihara |
| 2005/0090120 A1 | 4/2005 | Hasegawa et al. |
| 2005/0098111 A1 | 5/2005 | Shimizu et al. |
| 2005/0103267 A1 | 5/2005 | Hur et al. |
| 2005/0105991 A1 | 5/2005 | Hofmeister et al. |
| 2005/0109279 A1 | 5/2005 | Suzuki |
| 2005/0112876 A1 | 5/2005 | Wu |
| 2005/0112901 A1 | 5/2005 | Bing et al. |
| 2005/0121750 A1 | 6/2005 | Chan et al. |
| 2005/0123690 A1 | 6/2005 | Derderian et al. |
| 2005/0136188 A1 | 6/2005 | Chang |
| 2005/0145341 A1 | 7/2005 | Suzuki |
| 2005/0164479 A1 | 7/2005 | Perng et al. |
| 2005/0167394 A1 | 8/2005 | Liu et al. |
| 2005/0176258 A1 | 8/2005 | Hirose et al. |
| 2005/0178746 A1 | 8/2005 | Gorin |
| 2005/0181588 A1 | 8/2005 | Kim |
| 2005/0183666 A1 | 8/2005 | Tsuji et al. |
| 2005/0194094 A1 | 9/2005 | Yasaka |
| 2005/0196967 A1 | 9/2005 | Savas et al. |
| 2005/0199489 A1 | 9/2005 | Stevens et al. |
| 2005/0205110 A1 | 9/2005 | Kao et al. |
| 2005/0205862 A1 | 9/2005 | Koemtzopoulos et al. |
| 2005/0208215 A1 | 9/2005 | Eguchi et al. |
| 2005/0208217 A1 | 9/2005 | Shinriki et al. |
| 2005/0218507 A1 | 10/2005 | Kao et al. |
| 2005/0219786 A1 | 10/2005 | Brown et al. |
| 2005/0221552 A1 | 10/2005 | Kao et al. |
| 2005/0224181 A1 | 10/2005 | Merry et al. |
| 2005/0229848 A1 | 10/2005 | Shinriki et al. |
| 2005/0230350 A1 | 10/2005 | Kao et al. |
| 2005/0236694 A1 | 10/2005 | Wu et al. |
| 2005/0238807 A1 | 10/2005 | Lin et al. |
| 2005/0239282 A1 | 10/2005 | Chen et al. |
| 2005/0251990 A1 | 11/2005 | Choi et al. |
| 2005/0266622 A1 | 12/2005 | Arghavani et al. |
| 2005/0266650 A1 | 12/2005 | Ahn et al. |
| 2005/0266691 A1 | 12/2005 | Gu et al. |
| 2005/0269030 A1 | 12/2005 | Kent et al. |
| 2005/0274324 A1 | 12/2005 | Takahashi et al. |
| 2005/0279454 A1 | 12/2005 | Snijders |
| 2005/0283321 A1 | 12/2005 | Yue et al. |
| 2005/0287688 A1 | 12/2005 | Won et al. |
| 2005/0287755 A1 | 12/2005 | Bachmann |
| 2005/0287771 A1 | 12/2005 | Seamons et al. |
| 2006/0000805 A1 | 1/2006 | Todorow et al. |
| 2006/0005856 A1 | 1/2006 | Sun et al. |
| 2006/0005930 A1 | 1/2006 | Ikeda et al. |
| 2006/0006057 A1 | 1/2006 | Laermer |
| 2006/0008676 A1 | 1/2006 | Ebata et al. |
| 2006/0011299 A1 | 1/2006 | Condrashoff et al. |
| 2006/0016783 A1 | 1/2006 | Wu et al. |
| 2006/0019456 A1 | 1/2006 | Bu et al. |
| 2006/0019477 A1 | 1/2006 | Hanawa et al. |
| 2006/0019486 A1 | 1/2006 | Yu et al. |
| 2006/0021574 A1 | 2/2006 | Armour et al. |
| 2006/0021701 A1 | 2/2006 | Tobe et al. |
| 2006/0021703 A1 | 2/2006 | Umotoy et al. |
| 2006/0024956 A1 | 2/2006 | Zhijian et al. |
| 2006/0033678 A1 | 2/2006 | Lubomirsky et al. |
| 2006/0040055 A1 | 2/2006 | Nguyen et al. |
| 2006/0043066 A1 | 3/2006 | Kamp |
| 2006/0046412 A1 | 3/2006 | Nguyen et al. |
| 2006/0046419 A1 | 3/2006 | Sandhu et al. |
| 2006/0046470 A1 | 3/2006 | Becknell |
| 2006/0046484 A1 | 3/2006 | Abatchev et al. |
| 2006/0051966 A1 | 3/2006 | Or et al. |
| 2006/0051968 A1 | 3/2006 | Joshi et al. |
| 2006/0057828 A1 | 3/2006 | Omura et al. |
| 2006/0060942 A1 | 3/2006 | Minixhofer et al. |
| 2006/0065629 A1 | 3/2006 | Chen et al. |
| 2006/0073349 A1 | 4/2006 | Aihara et al. |
| 2006/0076108 A1 | 4/2006 | Holland et al. |
| 2006/0087644 A1 | 4/2006 | McMillin et al. |
| 2006/0090700 A1 | 5/2006 | Satoh et al. |
| 2006/0093756 A1 | 5/2006 | Rajagopalan et al. |
| 2006/0097397 A1 | 5/2006 | Russell et al. |
| 2006/0102076 A1 | 5/2006 | Smith et al. |
| 2006/0102587 A1 | 5/2006 | Kimura |
| 2006/0113038 A1 | 6/2006 | Gondhalekar et al. |
| 2006/0118178 A1 | 6/2006 | Desbiolles et al. |
| 2006/0118240 A1 | 6/2006 | Holber et al. |
| 2006/0121724 A1 | 6/2006 | Duofeng et al. |
| 2006/0124151 A1 | 6/2006 | Yamasaki et al. |
| 2006/0124242 A1 | 6/2006 | Kanarik et al. |
| 2006/0130971 A1 | 6/2006 | Chang et al. |
| 2006/0151115 A1 | 7/2006 | Kim et al. |
| 2006/0157449 A1 | 7/2006 | Takahashi et al. |
| 2006/0166107 A1 | 7/2006 | Chen et al. |
| 2006/0166515 A1 | 7/2006 | Karim et al. |
| 2006/0169327 A1 | 8/2006 | Shajii et al. |
| 2006/0169410 A1 | 8/2006 | Maeda et al. |
| 2006/0183270 A1 | 8/2006 | Humpston |
| 2006/0185592 A1 | 8/2006 | Matsuura |
| 2006/0191479 A1 | 8/2006 | Mizukami et al. |
| 2006/0207504 A1 | 9/2006 | Hasebe et al. |
| 2006/0207595 A1 | 9/2006 | Ohmi et al. |
| 2006/0207971 A1 | 9/2006 | Moriya et al. |
| 2006/0210713 A1 | 9/2006 | Brcka |
| 2006/0211260 A1 | 9/2006 | Tran et al. |
| 2006/0215347 A1 | 9/2006 | Wakabayashi et al. |
| 2006/0216878 A1 | 9/2006 | Lee |
| 2006/0216923 A1 | 9/2006 | Tran et al. |
| 2006/0219360 A1 | 10/2006 | Iwasaki |
| 2006/0222481 A1 | 10/2006 | Foree |
| 2006/0226121 A1 | 10/2006 | Aoi |
| 2006/0228889 A1 | 10/2006 | Edelberg et al. |
| 2006/0240661 A1 | 10/2006 | Annapragada et al. |
| 2006/0244107 A1 | 11/2006 | Sugihara |
| 2006/0245852 A1 | 11/2006 | Iwabuchi |
| 2006/0246217 A1 | 11/2006 | Weidman et al. |
| 2006/0251800 A1 | 11/2006 | Weidman et al. |
| 2006/0251801 A1 | 11/2006 | Weidman et al. |
| 2006/0252252 A1 | 11/2006 | Zhu et al. |
| 2006/0252265 A1 | 11/2006 | Jin et al. |
| 2006/0254716 A1 | 11/2006 | Mosden et al. |
| 2006/0260750 A1 | 11/2006 | Rueger |
| 2006/0261490 A1 | 11/2006 | Su et al. |
| 2006/0264003 A1 | 11/2006 | Eun |
| 2006/0264043 A1 | 11/2006 | Stewart et al. |
| 2006/0286774 A1 | 12/2006 | Singh et al. |
| 2006/0289384 A1 | 12/2006 | Pavel et al. |
| 2006/0292846 A1 | 12/2006 | Pinto et al. |
| 2007/0022952 A1 | 2/2007 | Ritchie et al. |
| 2007/0025907 A1 | 2/2007 | Rezeq |
| 2007/0039548 A1 | 2/2007 | Johnson |
| 2007/0048977 A1 | 3/2007 | Lee et al. |
| 2007/0051471 A1 | 3/2007 | Kawaguchi et al. |
| 2007/0056925 A1 | 3/2007 | Liu et al. |
| 2007/0062453 A1 | 3/2007 | Ishikawa |
| 2007/0066084 A1 | 3/2007 | Wajda et al. |
| 2007/0071888 A1 | 3/2007 | Shanmugasundram et al. |
| 2007/0072408 A1 | 3/2007 | Enomoto et al. |
| 2007/0077737 A1 | 4/2007 | Kobayashi |
| 2007/0079758 A1 | 4/2007 | Holland et al. |
| 2007/0090325 A1 | 4/2007 | Hwang et al. |
| 2007/0099431 A1 | 5/2007 | Li |
| 2007/0099438 A1 | 5/2007 | Ye et al. |
| 2007/0107750 A1 | 5/2007 | Sawin et al. |
| 2007/0108404 A1 | 5/2007 | Stewart et al. |
| 2007/0111519 A1 | 5/2007 | Lubomirsky et al. |
| 2007/0117396 A1 | 5/2007 | Wu et al. |
| 2007/0119370 A1 | 5/2007 | Ma et al. |
| 2007/0119371 A1 | 5/2007 | Ma et al. |
| 2007/0123051 A1 | 5/2007 | Arghavani et al. |
| 2007/0128864 A1 | 6/2007 | Ma |
| 2007/0131274 A1 | 6/2007 | Stollwerck et al. |
| 2007/0145023 A1 | 6/2007 | Holber et al. |

(56) References Cited

U.S. PATENT DOCUMENTS

| | | |
|---|---|---|
| 2007/0154838 A1 | 7/2007 | Lee |
| 2007/0175861 A1 | 8/2007 | Hwang et al. |
| 2007/0181057 A1 | 8/2007 | Lam et al. |
| 2007/0197028 A1 | 8/2007 | Byun et al. |
| 2007/0207275 A1* | 9/2007 | Nowak .............. B08B 7/0035 427/569 |
| 2007/0212288 A1 | 9/2007 | Holst |
| 2007/0221620 A1 | 9/2007 | Sakthivel et al. |
| 2007/0227554 A1 | 10/2007 | Satoh et al. |
| 2007/0231109 A1 | 10/2007 | Pak et al. |
| 2007/0232071 A1 | 10/2007 | Balseanu et al. |
| 2007/0235134 A1 | 10/2007 | Iimuro |
| 2007/0238199 A1 | 10/2007 | Yamashita |
| 2007/0238321 A1 | 10/2007 | Futase et al. |
| 2007/0243714 A1 | 10/2007 | Shin et al. |
| 2007/0254169 A1 | 11/2007 | Kamins et al. |
| 2007/0259467 A1 | 11/2007 | Tweet et al. |
| 2007/0264820 A1 | 11/2007 | Liu |
| 2007/0266946 A1 | 11/2007 | Choi |
| 2007/0269976 A1 | 11/2007 | Futase et al. |
| 2007/0277734 A1 | 12/2007 | Lubomirsky et al. |
| 2007/0280816 A1 | 12/2007 | Kurita et al. |
| 2007/0281106 A1 | 12/2007 | Lubomirsky et al. |
| 2007/0287292 A1 | 12/2007 | Li et al. |
| 2007/0296967 A1 | 12/2007 | Gupta et al. |
| 2008/0003836 A1 | 1/2008 | Nishimura et al. |
| 2008/0017104 A1 | 1/2008 | Matyushkin et al. |
| 2008/0020570 A1 | 1/2008 | Naik |
| 2008/0035608 A1 | 2/2008 | Thomas et al. |
| 2008/0044593 A1 | 2/2008 | Seo et al. |
| 2008/0044990 A1 | 2/2008 | Lee |
| 2008/0050538 A1 | 2/2008 | Hirata |
| 2008/0063810 A1 | 3/2008 | Park et al. |
| 2008/0081483 A1 | 4/2008 | Wu |
| 2008/0085604 A1 | 4/2008 | Hoshino et al. |
| 2008/0099147 A1 | 5/2008 | Myo et al. |
| 2008/0099431 A1 | 5/2008 | Kumar et al. |
| 2008/0099876 A1 | 5/2008 | Seto |
| 2008/0100222 A1 | 5/2008 | Lewington et al. |
| 2008/0102570 A1 | 5/2008 | Fischer et al. |
| 2008/0102640 A1 | 5/2008 | Hassan et al. |
| 2008/0102646 A1 | 5/2008 | Kawaguchi et al. |
| 2008/0104782 A1 | 5/2008 | Hughes |
| 2008/0105555 A1 | 5/2008 | Iwazaki et al. |
| 2008/0115726 A1 | 5/2008 | Ingle et al. |
| 2008/0121970 A1 | 5/2008 | Aritome |
| 2008/0124919 A1 | 5/2008 | Huang et al. |
| 2008/0124937 A1 | 5/2008 | Xu et al. |
| 2008/0142483 A1 | 6/2008 | Hua et al. |
| 2008/0142831 A1 | 6/2008 | Hua et al. |
| 2008/0156631 A1 | 7/2008 | Fair et al. |
| 2008/0156771 A1 | 7/2008 | Jeon et al. |
| 2008/0157225 A1 | 7/2008 | Datta et al. |
| 2008/0160210 A1 | 7/2008 | Yang et al. |
| 2008/0162781 A1 | 7/2008 | Haller et al. |
| 2008/0169588 A1 | 7/2008 | Shih et al. |
| 2008/0171407 A1 | 7/2008 | Nakabayashi et al. |
| 2008/0173906 A1 | 7/2008 | Zhu |
| 2008/0176412 A1 | 7/2008 | Komeda |
| 2008/0178797 A1 | 7/2008 | Fodor et al. |
| 2008/0178805 A1 | 7/2008 | Paterson et al. |
| 2008/0182381 A1 | 7/2008 | Kiyotoshi |
| 2008/0182382 A1 | 7/2008 | Ingle et al. |
| 2008/0196666 A1 | 8/2008 | Toshima |
| 2008/0202688 A1 | 8/2008 | Wu et al. |
| 2008/0216901 A1 | 9/2008 | Chamberlain et al. |
| 2008/0216958 A1 | 9/2008 | Goto et al. |
| 2008/0233709 A1 | 9/2008 | Conti et al. |
| 2008/0236751 A1 | 10/2008 | Aramaki et al. |
| 2008/0254635 A1 | 10/2008 | Benzel et al. |
| 2008/0261404 A1 | 10/2008 | Kozuka et al. |
| 2008/0264337 A1* | 10/2008 | Sano ................. C23C 16/4408 118/704 |
| 2008/0268645 A1 | 10/2008 | Kao et al. |
| 2008/0292798 A1 | 11/2008 | Huh et al. |
| 2008/0293248 A1 | 11/2008 | Park et al. |
| 2009/0000743 A1 | 1/2009 | Iizuka |
| 2009/0001480 A1 | 1/2009 | Cheng |
| 2009/0004849 A1 | 1/2009 | Eun |
| 2009/0004873 A1 | 1/2009 | Yang |
| 2009/0014127 A1 | 1/2009 | Shah et al. |
| 2009/0014323 A1 | 1/2009 | Yendler et al. |
| 2009/0014324 A1 | 1/2009 | Kawaguchi et al. |
| 2009/0036292 A1 | 2/2009 | Sun et al. |
| 2009/0045167 A1 | 2/2009 | Maruyama |
| 2009/0072401 A1 | 3/2009 | Arnold et al. |
| 2009/0081878 A1 | 3/2009 | Dhindsa |
| 2009/0084317 A1 | 4/2009 | Wu et al. |
| 2009/0087960 A1 | 4/2009 | Cho et al. |
| 2009/0087979 A1 | 4/2009 | Raghuram |
| 2009/0095221 A1 | 4/2009 | Tam et al. |
| 2009/0095222 A1 | 4/2009 | Tam et al. |
| 2009/0095621 A1 | 4/2009 | Kao et al. |
| 2009/0098276 A1 | 4/2009 | Burrows |
| 2009/0098706 A1 | 4/2009 | Kim et al. |
| 2009/0104738 A1 | 4/2009 | Ring et al. |
| 2009/0104764 A1 | 4/2009 | Xia et al. |
| 2009/0104782 A1 | 4/2009 | Lu et al. |
| 2009/0111280 A1 | 4/2009 | Kao et al. |
| 2009/0117270 A1 | 5/2009 | Yamasaki et al. |
| 2009/0120464 A1 | 5/2009 | Rasheed et al. |
| 2009/0162647 A1 | 6/2009 | Sun et al. |
| 2009/0170331 A1 | 7/2009 | Cheng et al. |
| 2009/0179300 A1 | 7/2009 | Arai |
| 2009/0189246 A1 | 7/2009 | Wu et al. |
| 2009/0189287 A1 | 7/2009 | Yang et al. |
| 2009/0191711 A1 | 7/2009 | Rui et al. |
| 2009/0194233 A1 | 8/2009 | Tamura |
| 2009/0194810 A1 | 8/2009 | Kiyotoshi et al. |
| 2009/0197418 A1 | 8/2009 | Sago |
| 2009/0214825 A1 | 8/2009 | Sun et al. |
| 2009/0223928 A1 | 9/2009 | Colpo |
| 2009/0236314 A1 | 9/2009 | Chen |
| 2009/0255902 A1 | 10/2009 | Satoh et al. |
| 2009/0258162 A1 | 10/2009 | Furuta et al. |
| 2009/0269934 A1 | 10/2009 | Kao et al. |
| 2009/0274590 A1 | 11/2009 | Willwerth et al. |
| 2009/0275146 A1 | 11/2009 | Takano et al. |
| 2009/0275205 A1 | 11/2009 | Kiehlbauch et al. |
| 2009/0275206 A1 | 11/2009 | Katz et al. |
| 2009/0277587 A1 | 11/2009 | Lubomirsky et al. |
| 2009/0280650 A1* | 11/2009 | Lubomirsky ............ B08B 7/00 438/694 |
| 2009/0286400 A1 | 11/2009 | Heo et al. |
| 2009/0286405 A1 | 11/2009 | Okesaku et al. |
| 2009/0293809 A1 | 12/2009 | Cho et al. |
| 2009/0294898 A1 | 12/2009 | Feustel et al. |
| 2009/0317978 A1 | 12/2009 | Higashi |
| 2009/0320756 A1 | 12/2009 | Tanaka |
| 2010/0000683 A1 | 1/2010 | Kadkhodayan et al. |
| 2010/0003824 A1 | 1/2010 | Kadkhodayan et al. |
| 2010/0006543 A1 | 1/2010 | Sawada et al. |
| 2010/0022030 A1 | 1/2010 | Ditizio |
| 2010/0025370 A1 | 2/2010 | Dieguez-Campo et al. |
| 2010/0039747 A1 | 2/2010 | Sansoni |
| 2010/0047080 A1 | 2/2010 | Bruce |
| 2010/0055408 A1 | 3/2010 | Lee et al. |
| 2010/0059889 A1 | 3/2010 | Gosset et al. |
| 2010/0062603 A1 | 3/2010 | Ganguly et al. |
| 2010/0075503 A1 | 3/2010 | Bencher et al. |
| 2010/0081285 A1 | 4/2010 | Chen et al. |
| 2010/0093151 A1 | 4/2010 | Arghavani et al. |
| 2010/0093168 A1 | 4/2010 | Naik |
| 2010/0096367 A1* | 4/2010 | Jeon ................. H01J 37/32082 219/121.36 |
| 2010/0098884 A1 | 4/2010 | Balseanu et al. |
| 2010/0099236 A1 | 4/2010 | Kwon et al. |
| 2010/0099263 A1 | 4/2010 | Kao et al. |
| 2010/0105209 A1 | 4/2010 | Winniczek et al. |
| 2010/0116788 A1 | 5/2010 | Singh et al. |
| 2010/0119843 A1 | 5/2010 | Sun et al. |
| 2010/0129974 A1 | 5/2010 | Futase et al. |
| 2010/0130001 A1 | 5/2010 | Noguchi |
| 2010/0139889 A1 | 6/2010 | Kurita et al. |

(56) References Cited

U.S. PATENT DOCUMENTS

| | | |
|---|---|---|
| 2010/0147219 A1 | 6/2010 | Hsieh et al. |
| 2010/0151149 A1 | 6/2010 | Ovshinsky |
| 2010/0164422 A1 | 7/2010 | Shu et al. |
| 2010/0173499 A1 | 7/2010 | Tao et al. |
| 2010/0178748 A1 | 7/2010 | Subramanian |
| 2010/0180819 A1 | 7/2010 | Hatanaka et al. |
| 2010/0183825 A1 | 7/2010 | Becker et al. |
| 2010/0187534 A1 | 7/2010 | Nishi et al. |
| 2010/0197143 A1 | 8/2010 | Nishimura |
| 2010/0203739 A1 | 8/2010 | Becker et al. |
| 2010/0224324 A1 | 9/2010 | Kasai |
| 2010/0240205 A1 | 9/2010 | Son |
| 2010/0243165 A1 | 9/2010 | Um |
| 2010/0243606 A1 | 9/2010 | Koshimizu |
| 2010/0244204 A1 | 9/2010 | Matsuoka et al. |
| 2010/0252068 A1 | 10/2010 | Kannan et al. |
| 2010/0258913 A1 | 10/2010 | Lue |
| 2010/0267224 A1 | 10/2010 | Choi et al. |
| 2010/0267248 A1 | 10/2010 | Ma et al. |
| 2010/0273290 A1 | 10/2010 | Kryliouk |
| 2010/0273291 A1 | 10/2010 | Kryliouk et al. |
| 2010/0288369 A1 | 11/2010 | Chang et al. |
| 2010/0294199 A1 | 11/2010 | Tran et al. |
| 2010/0310785 A1 | 12/2010 | Sasakawa et al. |
| 2010/0314005 A1 | 12/2010 | Saito et al. |
| 2010/0330814 A1 | 12/2010 | Yokota et al. |
| 2011/0005607 A1 | 1/2011 | Desbiolles et al. |
| 2011/0005684 A1 | 1/2011 | Hayami et al. |
| 2011/0008950 A1 | 1/2011 | Xu |
| 2011/0034035 A1 | 2/2011 | Liang et al. |
| 2011/0039407 A1 | 2/2011 | Nishizuka |
| 2011/0045676 A1 | 2/2011 | Park |
| 2011/0048325 A1 | 3/2011 | Choie et al. |
| 2011/0053380 A1 | 3/2011 | Sapre et al. |
| 2011/0058303 A1 | 3/2011 | Migita |
| 2011/0061810 A1 | 3/2011 | Ganguly et al. |
| 2011/0061812 A1 | 3/2011 | Ganguly et al. |
| 2011/0065276 A1 | 3/2011 | Ganguly et al. |
| 2011/0076401 A1 | 3/2011 | Chao et al. |
| 2011/0081782 A1 | 4/2011 | Liang et al. |
| 2011/0100489 A1 | 5/2011 | Orito |
| 2011/0104393 A1 | 5/2011 | Hilkene et al. |
| 2011/0111596 A1 | 5/2011 | Kanakasabapathy |
| 2011/0114601 A1 | 5/2011 | Lubomirsky et al. |
| 2011/0115378 A1 | 5/2011 | Lubomirsky et al. |
| 2011/0126764 A1 | 6/2011 | Sun et al. |
| 2011/0127156 A1 | 6/2011 | Foad et al. |
| 2011/0133650 A1 | 6/2011 | Kim |
| 2011/0140229 A1 | 6/2011 | Rachmady et al. |
| 2011/0143542 A1 | 6/2011 | Feurprier et al. |
| 2011/0146909 A1 | 6/2011 | Shi et al. |
| 2011/0147363 A1 | 6/2011 | Yap et al. |
| 2011/0151674 A1 | 6/2011 | Tang et al. |
| 2011/0151676 A1 | 6/2011 | Ingle et al. |
| 2011/0151677 A1 | 6/2011 | Wang et al. |
| 2011/0151678 A1 | 6/2011 | Ashtiani et al. |
| 2011/0165057 A1 | 7/2011 | Honda et al. |
| 2011/0165347 A1 | 7/2011 | Miller et al. |
| 2011/0165771 A1 | 7/2011 | Ring et al. |
| 2011/0174778 A1 | 7/2011 | Sawada et al. |
| 2011/0195575 A1 | 8/2011 | Wang |
| 2011/0198034 A1 | 8/2011 | Sun et al. |
| 2011/0204025 A1 | 8/2011 | Tahara |
| 2011/0207332 A1 | 8/2011 | Liu et al. |
| 2011/0226734 A1 | 9/2011 | Sumiya et al. |
| 2011/0227028 A1 | 9/2011 | Sekar et al. |
| 2011/0230008 A1 | 9/2011 | Lakshmanan et al. |
| 2011/0230052 A1 | 9/2011 | Tang et al. |
| 2011/0232737 A1 | 9/2011 | Ruletzki et al. |
| 2011/0232845 A1 | 9/2011 | Riker et al. |
| 2011/0244686 A1 | 10/2011 | Aso et al. |
| 2011/0244693 A1 | 10/2011 | Tamura et al. |
| 2011/0256421 A1 | 10/2011 | Bose et al. |
| 2011/0042799 A1 | 11/2011 | Kang et al. |
| 2011/0265884 A1 | 11/2011 | Xu et al. |
| 2011/0265887 A1 | 11/2011 | Lee et al. |
| 2011/0265951 A1 | 11/2011 | Xu |
| 2011/0266252 A1 | 11/2011 | Thadani et al. |
| 2011/0266256 A1 | 11/2011 | Cruse et al. |
| 2011/0266682 A1 | 11/2011 | Edelstein et al. |
| 2011/0278260 A1 | 11/2011 | Lai et al. |
| 2011/0287633 A1 | 11/2011 | Lee et al. |
| 2011/0294300 A1 | 12/2011 | Zhang et al. |
| 2011/0298061 A1 | 12/2011 | Siddiqui et al. |
| 2011/0304078 A1 | 12/2011 | Lee et al. |
| 2012/0003782 A1 | 1/2012 | Byun et al. |
| 2012/0009796 A1 | 1/2012 | Cui et al. |
| 2012/0025289 A1 | 2/2012 | Liang et al. |
| 2012/0031559 A1 | 2/2012 | Dhindsa et al. |
| 2012/0034786 A1 | 2/2012 | Dhindsa et al. |
| 2012/0035766 A1 | 2/2012 | Shajii et al. |
| 2012/0037596 A1 | 2/2012 | Eto et al. |
| 2012/0052683 A1 | 3/2012 | Kim et al. |
| 2012/0055402 A1 | 3/2012 | Moriya et al. |
| 2012/0068242 A1 | 3/2012 | Shin et al. |
| 2012/0070982 A1 | 3/2012 | Yu et al. |
| 2012/0070996 A1 | 3/2012 | Hao et al. |
| 2012/0091108 A1 | 4/2012 | Lin et al. |
| 2012/0097330 A1 | 4/2012 | Iyengar et al. |
| 2012/0100720 A1 | 4/2012 | Winniczek et al. |
| 2012/0103518 A1 | 5/2012 | Kakimoto |
| 2012/0104564 A1 | 5/2012 | Won et al. |
| 2012/0119225 A1 | 5/2012 | Shiomi et al. |
| 2012/0122319 A1 | 5/2012 | Shimizu |
| 2012/0129354 A1 | 5/2012 | Luong |
| 2012/0135576 A1 | 5/2012 | Lee et al. |
| 2012/0148369 A1 | 6/2012 | Michalski et al. |
| 2012/0149200 A1 | 6/2012 | Culp et al. |
| 2012/0161405 A1 | 6/2012 | Mohn et al. |
| 2012/0171852 A1 | 7/2012 | Yuan et al. |
| 2012/0180954 A1 | 7/2012 | Yang et al. |
| 2012/0181599 A1 | 7/2012 | Lung |
| 2012/0182808 A1 | 7/2012 | Lue et al. |
| 2012/0187844 A1 | 7/2012 | Hoffman et al. |
| 2012/0196447 A1 | 8/2012 | Yang et al. |
| 2012/0196451 A1 | 8/2012 | Mallick |
| 2012/0202408 A1 | 8/2012 | Shajii et al. |
| 2012/0208361 A1 | 8/2012 | Ha |
| 2012/0211462 A1 | 8/2012 | Zhang et al. |
| 2012/0211722 A1 | 8/2012 | Kellam et al. |
| 2012/0222616 A1 | 9/2012 | Han et al. |
| 2012/0222815 A1 | 9/2012 | Sabri et al. |
| 2012/0223048 A1 | 9/2012 | Paranjpe et al. |
| 2012/0223418 A1 | 9/2012 | Stowers et al. |
| 2012/0225557 A1 | 9/2012 | Serry et al. |
| 2012/0228642 A1 | 9/2012 | Aube et al. |
| 2012/0234945 A1 | 9/2012 | Olgado |
| 2012/0238102 A1 | 9/2012 | Zhang et al. |
| 2012/0238103 A1 | 9/2012 | Zhang et al. |
| 2012/0238108 A1 | 9/2012 | Chen et al. |
| 2012/0241411 A1 | 9/2012 | Darling et al. |
| 2012/0247390 A1 | 10/2012 | Sawada et al. |
| 2012/0247670 A1 | 10/2012 | Dobashi et al. |
| 2012/0247671 A1 | 10/2012 | Sugawara |
| 2012/0247677 A1 | 10/2012 | Himori et al. |
| 2012/0255491 A1 | 10/2012 | Hadidi |
| 2012/0258600 A1 | 10/2012 | Godet et al. |
| 2012/0267346 A1 | 10/2012 | Kao et al. |
| 2012/0269968 A1 | 10/2012 | Rayner |
| 2012/0282779 A1 | 11/2012 | Arnold et al. |
| 2012/0285619 A1 | 11/2012 | Matyushkin et al. |
| 2012/0285621 A1 | 11/2012 | Tan |
| 2012/0291696 A1 | 11/2012 | Clarke |
| 2012/0292664 A1 | 11/2012 | Kanike |
| 2012/0304933 A1 | 12/2012 | Mai et al. |
| 2012/0309205 A1 | 12/2012 | Wang et al. |
| 2012/0322015 A1 | 12/2012 | Kim |
| 2013/0001899 A1 | 1/2013 | Hwang et al. |
| 2013/0005103 A1 | 1/2013 | Liu et al. |
| 2013/0012030 A1 | 1/2013 | Lakshmanan et al. |
| 2013/0012032 A1 | 1/2013 | Liu et al. |
| 2013/0023062 A1 | 1/2013 | Masuda et al. |
| 2013/0023124 A1 | 1/2013 | Nemani et al. |
| 2013/0026135 A1 | 1/2013 | Kim |

(56) References Cited

U.S. PATENT DOCUMENTS

| | | |
|---|---|---|
| 2013/0032574 A1 | 2/2013 | Liu et al. |
| 2013/0034666 A1 | 2/2013 | Liang et al. |
| 2013/0034968 A1 | 2/2013 | Zhang et al. |
| 2013/0037919 A1 | 2/2013 | Sapra et al. |
| 2013/0045605 A1 | 2/2013 | Wang et al. |
| 2013/0052804 A1 | 2/2013 | Song |
| 2013/0052827 A1 | 2/2013 | Wang et al. |
| 2013/0059440 A1 | 3/2013 | Wang et al. |
| 2013/0062675 A1 | 3/2013 | Thomas |
| 2013/0065398 A1 | 3/2013 | Ohsawa et al. |
| 2013/0082197 A1 | 4/2013 | Yang et al. |
| 2013/0084654 A1 | 4/2013 | Gaylord et al. |
| 2013/0087309 A1 | 4/2013 | Volfovski |
| 2013/0089988 A1 | 4/2013 | Wang et al. |
| 2013/0098868 A1 | 4/2013 | Nishimura et al. |
| 2013/0105303 A1 | 5/2013 | Lubomirsky et al. |
| 2013/0105948 A1 | 5/2013 | Kewley |
| 2013/0115372 A1 | 5/2013 | Pavol et al. |
| 2013/0118686 A1 | 5/2013 | Carducci et al. |
| 2013/0119016 A1 | 5/2013 | Kagoshima |
| 2013/0119457 A1 | 5/2013 | Lue et al. |
| 2013/0119483 A1 | 5/2013 | Alptekin et al. |
| 2013/0130507 A1 | 5/2013 | Wang et al. |
| 2013/0150303 A1 | 6/2013 | Kungl et al. |
| 2013/0155568 A1 | 6/2013 | Todorow et al. |
| 2013/0161726 A1 | 6/2013 | Kim et al. |
| 2013/0171810 A1 | 7/2013 | Sun et al. |
| 2013/0175654 A1 | 7/2013 | Muckenhirn et al. |
| 2013/0193108 A1 | 8/2013 | Zheng |
| 2013/0213935 A1 | 8/2013 | Liao et al. |
| 2013/0217243 A1 | 8/2013 | Underwood et al. |
| 2013/0224960 A1 | 8/2013 | Payyapilly et al. |
| 2013/0260533 A1 | 10/2013 | Sapre et al. |
| 2013/0260564 A1 | 10/2013 | Sapre et al. |
| 2013/0279066 A1 | 10/2013 | Lubomirsky et al. |
| 2013/0284373 A1 | 10/2013 | Sun et al. |
| 2013/0284374 A1 | 10/2013 | Lubomirsky et al. |
| 2013/0286530 A1 | 10/2013 | Lin et al. |
| 2013/0295297 A1 | 11/2013 | Chou et al. |
| 2013/0298942 A1 | 11/2013 | Ren et al. |
| 2013/0337655 A1 | 12/2013 | Lee et al. |
| 2013/0343829 A1 | 12/2013 | Benedetti et al. |
| 2014/0004707 A1 | 1/2014 | Thedjoisworo et al. |
| 2014/0004708 A1 | 1/2014 | Thedjoisworo |
| 2014/0008880 A1 | 1/2014 | Miura et al. |
| 2014/0020708 A1 | 1/2014 | Kim et al. |
| 2014/0021673 A1 | 1/2014 | Chen et al. |
| 2014/0026813 A1 | 1/2014 | Wang et al. |
| 2014/0053866 A1 | 2/2014 | Baluja et al. |
| 2014/0057447 A1 | 2/2014 | Yang et al. |
| 2014/0062285 A1 | 3/2014 | Chen |
| 2014/0065827 A1 | 3/2014 | Kang et al. |
| 2014/0065842 A1 | 3/2014 | Anthis et al. |
| 2014/0080308 A1 | 3/2014 | Chen et al. |
| 2014/0080309 A1 | 3/2014 | Park |
| 2014/0080310 A1 | 3/2014 | Chen et al. |
| 2014/0083362 A1 | 3/2014 | Lubomirsky et al. |
| 2014/0087488 A1 | 3/2014 | Nam et al. |
| 2014/0097270 A1 | 4/2014 | Liang et al. |
| 2014/0099794 A1 | 4/2014 | Ingle et al. |
| 2014/0102367 A1 | 4/2014 | Ishibashi |
| 2014/0124364 A1 | 5/2014 | Yoo et al. |
| 2014/0134842 A1 | 5/2014 | Zhange et al. |
| 2014/0134847 A1 | 5/2014 | Seya |
| 2014/0141621 A1 | 5/2014 | Ren et al. |
| 2014/0152312 A1 | 6/2014 | Snow et al. |
| 2014/0154668 A1 | 6/2014 | Chou et al. |
| 2014/0154889 A1 | 6/2014 | Wang et al. |
| 2014/0165912 A1 | 6/2014 | Kao et al. |
| 2014/0166617 A1 | 6/2014 | Chen et al. |
| 2014/0166618 A1 | 6/2014 | Tadigadapa et al. |
| 2014/0186772 A1 | 7/2014 | Pohlers et al. |
| 2014/0190410 A1 | 7/2014 | Kim |
| 2014/0191388 A1 | 7/2014 | Chen |
| 2014/0199850 A1 | 7/2014 | Kim et al. |
| 2014/0199851 A1 | 7/2014 | Nemani et al. |
| 2014/0209245 A1 | 7/2014 | Yamamoto et al. |
| 2014/0216337 A1 | 8/2014 | Swaminathan et al. |
| 2014/0225504 A1 | 8/2014 | Kaneko et al. |
| 2014/0234466 A1 | 8/2014 | Gao et al. |
| 2014/0248773 A1 | 9/2014 | Tsai et al. |
| 2014/0248780 A1 | 9/2014 | Ingle et al. |
| 2014/0256131 A1 | 9/2014 | Wang et al. |
| 2014/0256145 A1 | 9/2014 | Abdallah et al. |
| 2014/0262031 A1 | 9/2014 | Belostotskiy et al. |
| 2014/0262038 A1 | 9/2014 | Wang et al. |
| 2014/0263172 A1 | 9/2014 | Xie et al. |
| 2014/0264533 A1 | 9/2014 | Simsek-Ege |
| 2014/0271097 A1 | 9/2014 | Wang et al. |
| 2014/0273373 A1 | 9/2014 | Makala et al. |
| 2014/0273406 A1 | 9/2014 | Wang et al. |
| 2014/0273451 A1 | 9/2014 | Wang et al. |
| 2014/0273462 A1 | 9/2014 | Simsek-Ege et al. |
| 2014/0273487 A1 | 9/2014 | Deshmukh et al. |
| 2014/0273489 A1 | 9/2014 | Wang et al. |
| 2014/0273491 A1 | 9/2014 | Zhang et al. |
| 2014/0273492 A1 | 9/2014 | Anthis et al. |
| 2014/0273496 A1 | 9/2014 | Kao |
| 2014/0288528 A1 | 9/2014 | Py et al. |
| 2014/0302678 A1 | 10/2014 | Paterson et al. |
| 2014/0302680 A1 | 10/2014 | Singh |
| 2014/0308758 A1 | 10/2014 | Nemani et al. |
| 2014/0308816 A1 | 10/2014 | Wang et al. |
| 2014/0311581 A1 | 10/2014 | Belostotskiy et al. |
| 2014/0342532 A1 | 11/2014 | Zhu |
| 2014/0342569 A1 | 11/2014 | Zhu et al. |
| 2014/0349477 A1 | 11/2014 | Chandrashekar et al. |
| 2014/0357083 A1 | 12/2014 | Ling et al. |
| 2014/0361684 A1 | 12/2014 | Ikeda et al. |
| 2014/0363979 A1 | 12/2014 | Or et al. |
| 2015/0011096 A1 | 1/2015 | Chandrasekharan et al. |
| 2015/0014152 A1 | 1/2015 | Hoinkis et al. |
| 2015/0031211 A1 | 1/2015 | Sapre et al. |
| 2015/0037980 A1 | 2/2015 | Rha |
| 2015/0041430 A1 | 2/2015 | Yoshino et al. |
| 2015/0050812 A1 | 2/2015 | Smith |
| 2015/0060265 A1 | 3/2015 | Cho et al. |
| 2015/0064918 A1 | 3/2015 | Ranjan et al. |
| 2015/0072508 A1 | 3/2015 | Or et al. |
| 2015/0076110 A1 | 3/2015 | Wu et al. |
| 2015/0076586 A1 | 3/2015 | Rabkin et al. |
| 2015/0079797 A1 | 3/2015 | Chen et al. |
| 2015/0093891 A1 | 4/2015 | Zope |
| 2015/0118822 A1 | 4/2015 | Zhang et al. |
| 2015/0118858 A1 | 4/2015 | Takaba |
| 2015/0126035 A1 | 5/2015 | Diao et al. |
| 2015/0126039 A1 | 5/2015 | Korolik et al. |
| 2015/0126040 A1 | 5/2015 | Korolik et al. |
| 2015/0129541 A1 | 5/2015 | Wang et al. |
| 2015/0129545 A1 | 5/2015 | Ingle et al. |
| 2015/0129546 A1 | 5/2015 | Ingle et al. |
| 2015/0132953 A1 | 5/2015 | Nowling |
| 2015/0132968 A1 | 5/2015 | Ren et al. |
| 2015/0152072 A1 | 6/2015 | Cantat et al. |
| 2015/0155177 A1 | 6/2015 | Zhang et al. |
| 2015/0170879 A1 | 6/2015 | Nguyen et al. |
| 2015/0170920 A1 | 6/2015 | Purayath et al. |
| 2015/0170924 A1 | 6/2015 | Nguyen et al. |
| 2015/0170926 A1 | 6/2015 | Michalak et al. |
| 2015/0170935 A1 | 6/2015 | Wang et al. |
| 2015/0170943 A1 | 6/2015 | Nguyen et al. |
| 2015/0171008 A1 | 6/2015 | Luo |
| 2015/0179464 A1 | 6/2015 | Wang et al. |
| 2015/0187625 A1 | 7/2015 | Busche et al. |
| 2015/0200042 A1 | 7/2015 | Ling et al. |
| 2015/0206764 A1 | 7/2015 | Wang et al. |
| 2015/0214066 A1 | 7/2015 | Luere et al. |
| 2015/0214067 A1 | 7/2015 | Zhang et al. |
| 2015/0214092 A1 | 7/2015 | Purayath et al. |
| 2015/0214337 A1 | 7/2015 | Ko et al. |
| 2015/0221479 A1 | 8/2015 | Chen et al. |
| 2015/0221541 A1 | 8/2015 | Nemani et al. |
| 2015/0228456 A1 | 8/2015 | Ye et al. |
| 2015/0235809 A1 | 8/2015 | Ito et al. |

(56) References Cited

U.S. PATENT DOCUMENTS

| | | |
|---|---|---|
| 2015/0235860 A1 | 8/2015 | Tomura et al. |
| 2015/0235863 A1 | 8/2015 | Chen |
| 2015/0235865 A1 | 8/2015 | Wang et al. |
| 2015/0235867 A1 | 8/2015 | Nishizuka |
| 2015/0247231 A1 | 9/2015 | Nguyen et al. |
| 2015/0249018 A1 | 9/2015 | Park et al. |
| 2015/0270140 A1 | 9/2015 | Gupta et al. |
| 2015/0275361 A1 | 10/2015 | Lubomirsky et al. |
| 2015/0275375 A1 | 10/2015 | Kim et al. |
| 2015/0279687 A1 | 10/2015 | Xue et al. |
| 2015/0294980 A1 | 10/2015 | Lee et al. |
| 2015/0332930 A1 | 11/2015 | Wang et al. |
| 2015/0340225 A1 | 11/2015 | Kim et al. |
| 2015/0357201 A1 | 12/2015 | Chen et al. |
| 2015/0357205 A1 | 12/2015 | Wang et al. |
| 2015/0371861 A1 | 12/2015 | Li et al. |
| 2015/0371864 A1 | 12/2015 | Hsu et al. |
| 2015/0371865 A1 | 12/2015 | Chen et al. |
| 2015/0371866 A1 | 12/2015 | Chen et al. |
| 2015/0380431 A1 | 12/2015 | Kanamori et al. |
| 2016/0005572 A1 | 1/2016 | Liang et al. |
| 2016/0005833 A1 | 1/2016 | Collins et al. |
| 2016/0027654 A1 | 1/2016 | Kim et al. |
| 2016/0027673 A1 | 1/2016 | Wang et al. |
| 2016/0035586 A1 | 2/2016 | Purayath et al. |
| 2016/0035614 A1 | 2/2016 | Purayath et al. |
| 2016/0043099 A1 | 2/2016 | Purayath et al. |
| 2016/0056167 A1 | 2/2016 | Wang et al. |
| 2016/0064212 A1 | 3/2016 | Thedjoisworo et al. |
| 2016/0064233 A1 | 3/2016 | Wang et al. |
| 2016/0079072 A1 | 3/2016 | Wang et al. |
| 2016/0086772 A1 | 3/2016 | Khaja |
| 2016/0086807 A1 | 3/2016 | Park et al. |
| 2016/0086808 A1 | 3/2016 | Zhang et al. |
| 2016/0086815 A1 | 3/2016 | Pandit et al. |
| 2016/0086816 A1 | 3/2016 | Wang et al. |
| 2016/0093505 A1 | 3/2016 | Chen et al. |
| 2016/0093737 A1 | 3/2016 | Li et al. |
| 2016/0104606 A1 | 4/2016 | Park et al. |
| 2016/0109863 A1 | 4/2016 | Valcore et al. |
| 2016/0117425 A1 | 4/2016 | Povolny et al. |
| 2016/0118227 A1 | 4/2016 | Valcore et al. |
| 2016/0118268 A1 | 4/2016 | Ingle et al. |
| 2016/0126118 A1 | 5/2016 | Chen et al. |
| 2016/0133480 A1 | 5/2016 | Ko et al. |
| 2016/0148805 A1 | 5/2016 | Jongbloed et al. |
| 2016/0148821 A1 | 5/2016 | Singh et al. |
| 2016/0163512 A1 | 6/2016 | Lubomirsky |
| 2016/0163513 A1 | 6/2016 | Lubomirsky |
| 2016/0172216 A1 | 6/2016 | Marakhtanov et al. |
| 2016/0181112 A1 | 6/2016 | Xue et al. |
| 2016/0181116 A1 | 6/2016 | Berry et al. |
| 2016/0189933 A1 | 6/2016 | Kobayashi et al. |
| 2016/0196969 A1 | 7/2016 | Berry et al. |
| 2016/0196984 A1 | 7/2016 | Lill et al. |
| 2016/0196985 A1 | 7/2016 | Tan et al. |
| 2016/0204009 A1 | 7/2016 | Nguyen et al. |
| 2016/0218018 A1 | 7/2016 | Lieu et al. |
| 2016/0222522 A1 | 8/2016 | Wang et al. |
| 2016/0225651 A1 | 8/2016 | Tran et al. |
| 2016/0225652 A1 | 8/2016 | Tran et al. |
| 2016/0237570 A1 | 8/2016 | Tan et al. |
| 2016/0240389 A1 | 8/2016 | Zhang et al. |
| 2016/0240402 A1 | 8/2016 | Park et al. |
| 2016/0260588 A1 | 9/2016 | Park et al. |
| 2016/0260616 A1 | 9/2016 | Li et al. |
| 2016/0260619 A1 | 9/2016 | Zhang et al. |
| 2016/0284556 A1 | 9/2016 | Ingle et al. |
| 2016/0293438 A1 | 10/2016 | Zhou et al. |
| 2016/0300694 A1 | 10/2016 | Yang et al. |
| 2016/0307772 A1 | 10/2016 | Choi et al. |
| 2016/0307773 A1 | 10/2016 | Lee et al. |
| 2016/0314961 A1 | 10/2016 | Liu et al. |
| 2016/0314985 A1 | 10/2016 | Yang et al. |
| 2016/0319452 A1 | 11/2016 | Eidschun et al. |
| 2016/0343548 A1 | 11/2016 | Howald et al. |
| 2017/0040175 A1 | 2/2017 | Xu et al. |
| 2017/0040190 A1 | 2/2017 | Benjaminson et al. |
| 2017/0040191 A1 | 2/2017 | Benjaminson et al. |
| 2017/0040207 A1 | 2/2017 | Purayath |
| 2017/0040214 A1 | 2/2017 | Lai et al. |
| 2017/0053808 A1 | 2/2017 | Kamp et al. |
| 2017/0062184 A1 | 3/2017 | Tran et al. |
| 2017/0110290 A1 | 4/2017 | Kobayashi et al. |
| 2017/0110335 A1 | 4/2017 | Yang et al. |
| 2017/0110475 A1 | 4/2017 | Liu et al. |
| 2017/0133202 A1 | 5/2017 | Berry |
| 2017/0178894 A1 | 6/2017 | Stone et al. |
| 2017/0178899 A1 | 6/2017 | Kabansky et al. |
| 2017/0178924 A1 | 6/2017 | Chen et al. |
| 2017/0226637 A1 | 8/2017 | Lubomirsky et al. |
| 2017/0229287 A1 | 8/2017 | Xu et al. |
| 2017/0229289 A1 | 8/2017 | Lubomirsky et al. |
| 2017/0229291 A1 | 8/2017 | Singh et al. |
| 2017/0229293 A1 | 8/2017 | Park et al. |
| 2017/0229326 A1 | 8/2017 | Tran et al. |
| 2017/0229328 A1 | 8/2017 | Benjaminson et al. |
| 2017/0229329 A1 | 8/2017 | Benjaminson et al. |
| 2017/0236691 A1 | 8/2017 | Liang et al. |
| 2017/0236694 A1 | 8/2017 | Eason et al. |
| 2017/0309509 A1 | 10/2017 | Tran et al. |
| 2017/0338133 A1 | 11/2017 | Tan et al. |
| 2017/0338134 A1 | 11/2017 | Tan et al. |
| 2018/0005850 A1 | 1/2018 | Citla et al. |
| 2018/0025900 A1 | 1/2018 | Park et al. |
| 2018/0069000 A1 | 3/2018 | Bergendahl et al. |
| 2018/0076031 A1 | 3/2018 | Yan et al. |
| 2018/0076044 A1 | 3/2018 | Choi et al. |
| 2018/0076083 A1 | 3/2018 | Ko et al. |
| 2018/0082861 A1 | 3/2018 | Citla et al. |
| 2018/0096818 A1 | 4/2018 | Lubomirsky |
| 2018/0096819 A1 | 4/2018 | Lubomirsky et al. |
| 2018/0096821 A1 | 4/2018 | Lubomirsky et al. |
| 2018/0096865 A1 | 4/2018 | Lubomirsky et al. |
| 2018/0102255 A1 | 4/2018 | Chen et al. |
| 2018/0102256 A1 | 4/2018 | Chen et al. |
| 2018/0102259 A1 | 4/2018 | Wang et al. |
| 2018/0138049 A1 | 5/2018 | Ko et al. |
| 2018/0138055 A1 | 5/2018 | Xu et al. |
| 2018/0138075 A1 | 5/2018 | Kang et al. |
| 2018/0138085 A1 | 5/2018 | Wang et al. |
| 2018/0182633 A1 | 6/2018 | Pandit et al. |
| 2018/0226223 A1 | 8/2018 | Lubomirsky |
| 2018/0226230 A1 | 8/2018 | Kobayashi et al. |
| 2018/0226259 A1 | 8/2018 | Choi et al. |
| 2018/0226278 A1 | 8/2018 | Arnepalli et al. |
| 2018/0226425 A1 | 8/2018 | Purayath |
| 2018/0226426 A1 | 8/2018 | Purayath |
| 2018/0261516 A1 | 9/2018 | Lin et al. |
| 2018/0261686 A1 | 9/2018 | Lin et al. |

FOREIGN PATENT DOCUMENTS

| | | |
|---|---|---|
| CN | 1412861 A | 4/2003 |
| CN | 1847450 A | 10/2006 |
| CN | 101236893 A | 8/2008 |
| CN | 101378850 A | 3/2009 |
| CN | 101465386 A | 6/2009 |
| CN | 102893705 | 1/2013 |
| EP | 0329406 | 8/1989 |
| EP | 0376252 | 7/1990 |
| EP | 0475567 | 3/1992 |
| EP | 0 496 543 A2 | 7/1992 |
| EP | 0 658 928 A1 | 6/1995 |
| EP | 0697467 | 2/1996 |
| EP | 0913498 | 5/1999 |
| EP | 1099776 | 5/2001 |
| EP | 1107288 | 6/2001 |
| EP | 1496542 | 1/2005 |
| EP | 1568797 | 8/2005 |
| EP | 1675160 A1 | 6/2006 |
| GB | 2285174 | 6/1995 |
| JP | S59-126778 A | 7/1984 |
| JP | 61-276977 A | 12/1986 |

(56) References Cited

FOREIGN PATENT DOCUMENTS

| | | |
|---|---|---|
| JP | S62-45119 A | 2/1987 |
| JP | 63301051 | 12/1988 |
| JP | H01-200627 A | 8/1989 |
| JP | 2058836 A | 2/1990 |
| JP | H02-114525 A | 4/1990 |
| JP | 02-121330 | 5/1990 |
| JP | 02256235 | 10/1990 |
| JP | 4-239750 | 7/1992 |
| JP | 4-341568 A | 11/1992 |
| JP | 07-130713 A | 5/1995 |
| JP | 7-161703 A | 6/1995 |
| JP | H07-153739 A | 6/1995 |
| JP | 7297543 | 11/1995 |
| JP | H8-31755 A | 2/1996 |
| JP | H08-107101 A | 4/1996 |
| JP | H08-264510 A | 10/1996 |
| JP | 08-306671 | 11/1996 |
| JP | 09153481 A | 6/1997 |
| JP | 09-205140 A | 8/1997 |
| JP | H09-260356 A | 10/1997 |
| JP | 10-178004 | 6/1998 |
| JP | 11124682 | 5/1999 |
| JP | H11-204442 | 7/1999 |
| JP | 2000-012514 | 1/2000 |
| JP | 2001-308023 | 11/2001 |
| JP | 2001-313282 A | 11/2001 |
| JP | 2001-332608 A | 11/2001 |
| JP | 2002-075972 A | 3/2002 |
| JP | 2002-083869 A | 3/2002 |
| JP | 2002-100578 | 4/2002 |
| JP | 2002-141349 | 5/2002 |
| JP | 2002-222861 | 8/2002 |
| JP | 2003-019433 | 1/2003 |
| JP | 2003-059914 | 2/2003 |
| JP | 2003-174020 A | 6/2003 |
| JP | 2003-179038 | 6/2003 |
| JP | 2003-217898 | 7/2003 |
| JP | 2003-282591 A | 10/2003 |
| JP | 2003-318158 | 11/2003 |
| JP | 2003-347278 | 12/2003 |
| JP | 2004-047956 | 2/2004 |
| JP | 2004-508709 A | 3/2004 |
| JP | 2004-156143 | 6/2004 |
| JP | 04-239723 A | 8/2004 |
| JP | 2004-296467 A | 10/2004 |
| JP | 2005-033023 A | 2/2005 |
| JP | 2005-050908 A | 2/2005 |
| JP | 2006-041039 A | 2/2006 |
| JP | 2006-066408 A | 3/2006 |
| JP | 2007-173383 | 7/2007 |
| JP | 08-148470 A | 6/2008 |
| JP | 2008-288560 A | 11/2008 |
| JP | 4191137 B2 | 12/2008 |
| JP | 2009-141343 A | 6/2009 |
| JP | 2009-530871 A | 8/2009 |
| JP | 2009-239056 A | 10/2009 |
| JP | 2010-154699 | 8/2010 |
| JP | 2010-180458 | 8/2010 |
| JP | 2011-508436 A | 3/2011 |
| JP | 2011-518408 A | 6/2011 |
| JP | 4763293 B2 | 8/2011 |
| JP | 2011-171378 A | 9/2011 |
| JP | 2012-19164 A | 1/2012 |
| JP | 2012-019194 A | 1/2012 |
| JP | 2012-512531 A | 5/2012 |
| JP | 2013-243418 A | 12/2013 |
| JP | 5802323 B2 | 10/2015 |
| JP | 2016-111177 A | 6/2016 |
| KR | 10-0155601 | 12/1998 |
| KR | 10-0236219 | 12/1999 |
| KR | 10-2000-008278 A | 2/2000 |
| KR | 1020000008278 A | 2/2000 |
| KR | 2000-0044928 | 7/2000 |
| KR | 10-2000-0064946 A | 11/2000 |
| KR | 2001-0014064 | 2/2001 |
| KR | 10-2001-0049274 | 6/2001 |
| KR | 10-2001-0056735 A | 7/2001 |
| KR | 10-2001-0058774 A | 7/2001 |
| KR | 10-2001-0082109 | 8/2001 |
| KR | 2003-0023964 A | 3/2003 |
| KR | 10-2003-0054726 A | 7/2003 |
| KR | 10-2003-0083663 A | 10/2003 |
| KR | 1020030081177 | 10/2003 |
| KR | 10-2004-0049739 | 6/2004 |
| KR | 100441297 B1 | 7/2004 |
| KR | 10-2004-0096365 A | 11/2004 |
| KR | 10-2005-0007143 A | 1/2005 |
| KR | 10-2005-0042701 A | 5/2005 |
| KR | 2005-0049903 A | 5/2005 |
| KR | 1020050042701 A | 5/2005 |
| KR | 10-2006-0080509 A | 7/2006 |
| KR | 1006-41762 B1 | 11/2006 |
| KR | 10-2006-0127173 A | 12/2006 |
| KR | 100663668 B1 | 1/2007 |
| KR | 100678696 B1 | 1/2007 |
| KR | 100712727 B1 | 4/2007 |
| KR | 2007-0079870 A | 8/2007 |
| KR | 10-2008-0063988 A | 7/2008 |
| KR | 10-0843236 B1 | 7/2008 |
| KR | 1020080063988 | 7/2008 |
| KR | 10-0858934 B1 | 9/2008 |
| KR | 10-2009-0040869 A | 4/2009 |
| KR | 10-2009-0128913 A | 12/2009 |
| KR | 10-2010-0013980 | 2/2010 |
| KR | 10-2010-0013980 A | 2/2010 |
| KR | 10-2010-0074508 A | 7/2010 |
| KR | 10-2010-0093358 A | 8/2010 |
| KR | 10-2011-0086540 A | 7/2011 |
| KR | 10-1050454 | 7/2011 |
| KR | 10-2011-0114538 A | 10/2011 |
| KR | 10-2011-0126675 A | 11/2011 |
| KR | 1020110126675 A | 11/2011 |
| KR | 10-2012-0022251 A | 3/2012 |
| KR | 10-2012-0082640 A | 7/2012 |
| KR | 10-2012-0084898 A | 7/2012 |
| KR | 1020120082640 A | 7/2012 |
| KR | 10-2016-0002543 A | 1/2016 |
| TW | 2006-12480 A | 4/2006 |
| TW | 200709256 A | 3/2007 |
| TW | 2007-35196 A | 9/2007 |
| TW | 2011-27983 A1 | 8/2011 |
| TW | 2012-07919 | 2/2012 |
| TW | 2012-13594 A | 4/2012 |
| TW | 2012-33842 A1 | 8/2012 |
| WO | 92/20833 A1 | 11/1992 |
| WO | 1999/026277 A1 | 5/1999 |
| WO | 1999/054920 | 10/1999 |
| WO | 99/062108 A2 | 12/1999 |
| WO | 00/13225 A1 | 3/2000 |
| WO | 2000/022671 | 4/2000 |
| WO | 2001/94719 | 12/2001 |
| WO | 02083981 | 10/2002 |
| WO | 03014416 | 2/2003 |
| WO | 1020030096140 | 12/2003 |
| WO | 2004/006303 | 1/2004 |
| WO | 2004/074932 | 9/2004 |
| WO | 04/114366 A2 | 12/2004 |
| WO | 05036615 | 4/2005 |
| WO | 2006/069085 A2 | 6/2006 |
| WO | 2008-112673 A2 | 9/2008 |
| WO | 2009/071627 | 6/2009 |
| WO | 2009-084194 A1 | 7/2009 |
| WO | 2010-010706 | 1/2010 |
| WO | 2010-113946 A1 | 10/2010 |
| WO | 2011-027515 A | 3/2011 |
| WO | 2011-031556 A | 3/2011 |
| WO | 2011070945 A | 6/2011 |
| WO | 2011/087580 A1 | 7/2011 |
| WO | 2011-095846 A1 | 8/2011 |
| WO | 2011/115761 A2 | 9/2011 |
| WO | 2011-139435 A2 | 11/2011 |
| WO | 2011-149638 A | 12/2011 |
| WO | 12/018449 A2 | 2/2012 |
| WO | 2012-050321 A | 4/2012 |

(56) References Cited

FOREIGN PATENT DOCUMENTS

| WO | 2012-118987 A1 | 9/2012 |
|---|---|---|
| WO | 2012/125654 A2 | 9/2012 |
| WO | 2012-125656 A2 | 9/2012 |
| WO | 2012-148568 A1 | 11/2012 |
| WO | 2013-118260 A1 | 8/2013 |

OTHER PUBLICATIONS

International Search Report of PCT/2013/037202 dated Aug. 23, 2013, 11 pages.
Abraham, "Reactive Facet Tapering of Plasma Oxide for Multilevel Interconnect Applications", IEEE, V-MIC Conference, Jun. 15-16, 1987, pp. 115-121.
Applied Materials, Inc., "Applied Siconi™ Preclean," printed on Aug. 7, 2009, 8 pages.
Carlson, et al., "A Negative Spacer Lithography Process for Sub-100nm Contact Holes and Vias", University of California at Berkeley, Jun. 19, 2007, 4 pp.
Chang et al. "Frequency Effects and Properties of Plasma Deposited Fluorinated Silicon Nitride", J. Vac Sci Technol B 6(2), Mar./Apr. 1988, pp. 524-532.
Cheng, et al., "New Test Structure to Identify Step Coverage Mechanisms in Chemical Vapor Deposition of Silicon Dioxide," Appl. Phys. Lett., 58 (19), May 13, 1991, p. 2147-2149.
C.K. Hu, et al. "Reduced Electromigration of Cu Wires by Surface Coating" Applied Physics Letters, vol. 81, No. 10, Sep. 2, 2002—pp. 1782-1784.
European Search Report dated May 23, 2006 for EP Application No. 05251143.3.
European Examination Report dated Nov. 13, 2007 for EP Application No. 05251143.3.
EP Partial Search Report, Application No. 08150111.601235/1944796, dated Aug. 22, 2008.
Examination Report dated Jun. 28, 2010 for European Patent Application No. 05251143.3.
Eze, F. C., "Eiectroless deposition of CoO thin films," J. Phys. D: Appl. Phys. 32 (1999), pp. 533-540.
Fukada et al. "Preparation of SiOF Films with Low Dielectric Constant by ECR Plasma CVD", ISMIC, DUMIC Conference, Feb. 21-22, 1995, pp. 43-49.
Galiano et al. "Stress-Temperature Behavior of Oxide Films Used for Intermetal Dielectric Applications", VMIC Conference, Jun. 9-10, 1992, pp. 100-106.
Hashim et al.; Characterization of thin oxide removal by RTA Treatment; ICSE 1998 Proc. Nov. 1998, Rangi, Malaysia, pp. 213-216.
Hausmann, et al., "Rapid Vapor Deposition of Highly Conformal Silica Nanolaminates," Science, Oct. 11, 2002, p. 402-406, vol. 298.
Hayasaka, N. et al. "High Quality Low Dielectric Constant SiO2 CVD Using High Density Plasma," Proceedings of the Dry Process Symposium, 1993, pp. 163-168.
Hwang et al., "Smallest Bit-Line Contact of 76nm pitch on NAND Flash Cell by using Reversal PR (Photo Resist) and SADP (Self-Align Double Patterning) Process," IEEE/SEMI Advanced Semiconductor Manufacturing Conference, 2007, 3 pages.
Iijima, et al., "Highly Selective SiO2 Etch Employing Inductively Coupled Hydro-Fluorocarbon Plasma Chemistry for Self Aligned Contact Etch", Jpn. J. Appl. Phys., Sep. 1997, pp. 5498-5501, vol. 36, Part 1, No. 9A.
International Search Report and Written Opinion of the International Searching Authority dated Jul. 3, 2008 (PCT/US05/46226).
International Search Report and Written Opinion for PCT Application No. PCT/US2011/027221, dated Nov. 1, 2011, 8 pages.
International Search Report and Written Opinion of PCT/US2010/057676 dated Jun. 27, 2011, 9 pages.
International Search Report and Written Opinion of PCT/US2011/030582 dated Dec. 7, 2011, 9 pages.
International Search Report and Written Opinion of PCT/US2011/064724 dated Oct. 12, 2012, 8 pages.
International Search Report and Written Opinion of PCT/US2012/028952 dated Oct. 29, 2012, 9 pages.
International Search Report and Written Opinion of PCT/US2012/048842 dated Nov. 28, 2012, 10 pages.
International Search Report and Written Opinion of PCT/US2012/053329 dated Feb. 15, 2013, 8 pages.
International Search Report and Written Opinion of PCT/US2012/057294 dated Mar. 18, 2013, 12 pages.
International Search Report and Written Opinion of PCT/US2012/057358 dated Mar. 25, 2013, 10 pages.
International Search Report and Written Opinion of PCT/US2012/058818 dated Apr. 1, 2013, 9 pages.
International Search Report and Written Opinion of the International Searching Authority for PCT Application No. PCT/US2012/028957, dated Oct. 18, 2012, 9 pages.
International Search Report of PCT/US2009/059743 dated Apr. 26, 2010, 4 pages.
International Search report and Written Opinion of PCT/CN2010/000932 dated Mar. 31, 2011.
International Search report and Written Opinion of PCT/CN2012/061726 dated May 16, 2013, 3 pages.
Japanese Patent Office, Official Action for Application No. 2007-317207 dated Dec. 21, 2011, 2 pages.
Jung, et al., "Patterning with amorphous carbon spacer for expanding the resolution limit of current lithography tool", Proc. SPIE , 2007, 9 pages, vol. 6520, 65201C.
Laxman, "Low ∈ Dielectrics: CVD Fluorinated Silicon Dioxides", Semiconductor International, May 1995, pp. 71-74.
Lee, et al., "Dielectric Planarization Techniques for Narrow Pitch Multilevel Interconnects," IEEE, V-MIC Conference Jun. 15-16, 1987, pp. 85-92 (1987).
Lin, et al., "Manufacturing of Cu Electroless Nickei/Sn—Pb Flip Chip Solder Bumps", IEEE Transactions on Advanced Packaging, vol. 22, No. 4 (Nov. 1999), pp. 575-579.
Lopatin, et al., "Thin Electroless barrier for copper films", Part of the SPIE Conference of Multilevel Interconnect technology II, SPIE vol. 3508 (1998), pp. 65-77.
Matsuda, et al. "Dual Frequency Plasma CVD Fluorosilicate Glass Deposition for 0.25 um Interlevel Dielectrics", ISMIC, DUMIC Conference Feb. 21-22, 1995, 1995. pp. 22-28.
Meeks, Ellen et al., "Modeling of SiO2 deposition in high density plasma reactors and comparisons of model predictions with experimental measurements," J. Vac. Sci. Technol. A, Mar./Apr. 1998, pp. 544-563, vol. 16(2).
Mukai, et al., "A Study of CD Budget in Spacer Patterning Process", Toshiba, SPIE 2008, Feb. 26, 2008, 12 pages.
Musaka, "Single Step Gap Filling Technology fo Subhalf Micron Metal Spacings on Plasma Enhanced TEOS/O2 Chemical Vapor Deposition System," Extended Abstracts of the 1993 International Conference on Solid State Devices and Materials pp. 1993, 510-512.
Nishino, et al.; Damage-Free Selective Etching of Si Native Oxides Using NH3/NF3 and SF6/H20 Down-Flow Etching, The Japanese Society of Applied Physics, vol. 74, No. 2, pp. 1345-1348, XP-002491959, Jul. 15, 1993.
Ogawa, et al., "Dry Cleaning Technology for Removal of Silicon Native Oxide Employing Hot NH3/NF3 Exposure", Japanese Journal of Applied Physics, pp. 5349-5358, Aug. 2002, vol. 41 Part 1, No. 8.
Ota, et al., "Stress Controlled Shallow Trench Isolation Technology to Suppress the Novel Anti-Isotropic Impurity Diffusion for 45nm-Node High Performance CMOSFETs," Symposium on VLSI Technology Digest of Technical Papers, 2005, pp. 138-139.
Pearlstein, Fred. "Eiectroless Plating," J. Res. Natl. Bur. Stan., Ch. 31 (1974), pp. 710-747.
Qian, et al., "High Density Plasma Deposition and Deep Submicron Gap Fill with Low Dielectric Constant SiOF Films," ISMIC, DUMIC Conference Feb. 21-22, 1995, 1995, pp. 50-56.
Robles, et al. "Effects of RF Frequency and Deposition Rates on the Moisture Resistance of PECVD TEOS-Based Oxide Films", ECS Extended Abstracts, Abstract No. 129, May 1992, pp. 215-216, vol. 92-1.

(56) References Cited

OTHER PUBLICATIONS

Saito, et al., "Electroless deposition of Ni—B, Co—B and Ni—Co—B alloys using dimethylamineborane as a reducing agent," Journal of Applied Electrochemistry 28 (1998), pp. 559-563.

Schacham-Diamond, et al., "Electrochemically deposited thin film alloys for ULSI and MEMS applications," Microelectronic Engineering 50 (2000), pp. 525-531.

Schacham-Diamond, et al. "Material properties of electroless 100-200 nm thick CoWP films," Electrochemical Society Proceedings, vol. 99-34, pp. 102-110.

Shapiro, et al. "Dual Frequency Plasma CVD Fluorosilicate Glass: Water Absorption and Stability", ISMIC, DUMIC Conference Feb. 21-22, 1995, 1995. pp. 118-123.

Smayling, et al., "APF® Pitch-Halving for 2nm Logic Cells using Gridded Design Rules", proceedings of the SPIE, 2008, 8 pages.

S.M. Sze, VLSI Technology, McGraw-Hill Book Company, pp. 107, 108.

U.S. Appl. No. 60/803,499, filed May 30, 2006, 56 pages.

U.S. Appl. No. 11/875,250, filed Oct. 19, 2007, 36 pages.

Usami, et al., "Low Dielectric Constant Interlayer Using Fluorine-Doped Silicon Oxide", Jpn. J. Appl. Phys., Jan. 19, 1994. pp. 408-412, vol. 33 Part 1, No. 1B.

Vassiliev, et al., "Trends in void-free pre-metal CVD dielectrics," Solid State Technology, Mar. 2001, pp. 129-136.

Wang et al.; Ultra High-selectivity silicon nitride etch process using an inductively coupled plasma source; J. Vac. Sci. Technol. A 16(3),May/Jun. 1998, pp. 1582-1587.

Weston, et al., "Ammonium Compounds," Kirk-Othmer Encyclopedia of Chemical Technology, 2003,30 pages see pp. 717-718, John Wiley & Sons, Inc.

Wolf et al.; Silicon Processing for the VLSI Era; vol. 1; 1986; Lattice Press, pp. 546, 547, 618, 619.

Yosi Shacham-Diamond, et al. "High Aspect Ratio Quarter-Micron Electroless Copper Integrated Technology", Microelectronic Engineering 37/38 (1997) pp. 77-88.

Yu, et al., "Step Coverage Study of Peteos Deposition for Intermetal Dielectric Applications," abstract, VMIC conference, Jun. 12-13, 1990, 7 pages, No. 82.

Yutaka, et al., "Selective Etching of Silicon Native Oxide with Remote-Plasma-Excited Anhydrous Hydrogen Fluoride," Japanese Journal of Applied Physics, 1998, vol. 37, pp. L536-L538.

International Search Report and Written Opinion of PCT/US2014/013138, dated May 20, 2014, 11 pages.

H. Xiao, Introduction to Semiconductor Manufacturing Technology, published by Prentice Hall, 2001, ISBN 0-13-022404-9, pp. 354-356.

Manual No. TQMA72E1. "Bayard-Alpert Pirani Gauge FRG-730: Short Operating Instructions" Mar. 2012. Agilent Technologies, Lexington, MA 02421, USA. pp. 1-45.

International Search Report and Written Opinion of PCT/US2016/045551 dated Nov. 17, 2016, all pages.

J.J. Wang and et al., "Inductively coupled plasma etching of bulk 1-20 6H-SiC and thin-film SiCN in NF3 chemistries," Journal of Vacuum Science & Technology A: Vacuum, Surfaces, and Films 16, 2204 (1998).

Instrument Manual: Vacuum Gauge Model MM200, Rev D. TELEVAC (website: www.televac.com), A Division of the Fredericks Company, Huntingdonvalley, PA, US. 2008. pp. 162.

International Search Report and Written Opinion of PCT/US2017/047209 dated Nov. 24, 2017, all pages.

International Search Report and Written Opinion of PCT/US2017/033362 dated Aug. 24, 2017, all pages.

International Search Report and Written Opinion of PCT/US2018/016261 dated May 21, 2018, all pages.

International Search Report and Written Opinion of PCT/US2018/016648 dated May 18, 2018, all pages.

Won et al. Derwent 2006-065772; Sep. 7, 2014, 10 pages.

International Search Report and Written Opinion of PCT/US2017/060696 dated Jan. 25, 2018, all pages.

International Search Report and Written Opinion of PCT/US2017/055431 dated Jan. 19, 2018, all pages.

\* cited by examiner

SEMICONDUCTOR PROCESSING SYSTEMS HAVING MULTIPLE PLASMA CONFIGURATIONS

CROSS-REFERENCES TO RELATED APPLICATIONS

This application claims the benefit of U.S. Provisional Application No. 61/762,767, filed Feb. 8, 2013, entitled "Semiconductor Processing Systems Having Multiple Plasma Configurations." The entire disclosure of which is incorporated herein by reference for all purposes.

TECHNICAL FIELD

The present technology relates to semiconductor processes and equipment. More specifically, the present technology relates to processing systems having multiple plasma configurations.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

A wet HF etch preferentially removes silicon oxide over other dielectrics and semiconductor materials. However, wet processes are unable to penetrate some constrained trenches and sometimes deform the remaining material. Dry etches produced in local plasmas formed within the substrate processing region can penetrate more constrained trenches and exhibit less deformation of delicate remaining structures. However, local plasmas can damage the substrate through the production of electric arcs as they discharge.

Thus, there is a need for improved methods and systems for selectively etching materials and structures on semiconductor substrates that allow more control over precursor chemistries and etch parameters. These and other needs are addressed by the present technology.

SUMMARY

Systems and methods are described relating to semiconductor processing chambers. An exemplary system may include a chamber configured to contain a semiconductor substrate in a processing region of the chamber. The system may include a first remote plasma unit fluidly coupled with a first access of the chamber and configured to deliver a first precursor into the chamber through the first access. The system may still further include a second remote plasma unit fluidly coupled with a second access of the chamber and configured to deliver a second precursor into the chamber through the second access. The first and second accesses may be fluidly coupled with a mixing region of the chamber that is separate from and fluidly coupled with the processing region of the chamber. The mixing region may be configured to allow the first and second precursors to interact with each other externally from the processing region of the chamber.

The system may further include a device positioned between the mixing region and the processing region of the chamber. The device may be configured to at least partially suppress flow of ionic species directed toward the processing region. The chamber may further include a gas distribution assembly located within the chamber at a top portion of or above the processing region of the chamber and configured to deliver both the first and second precursors into the processing region of the chamber. The gas distribution assembly may include an upper plate and a lower plate, and the plates may be coupled with one another to define a volume between the plates. The coupling of the plates may provide first fluid channels through the upper and lower plates, and second fluid channels through the lower plate that are configured to provide fluid access from the volume through the lower plate. The first fluid channels may be fluidly isolated from the volume between the plates and the second fluid channels. The volume defined may be fluidly accessible through a side of the gas distribution assembly fluidly coupled with a third access in the chamber separate from the first and second accesses of the chamber.

The first access and the second access to the chamber may be coupled with a top portion of the chamber. In embodiments the first access and second access may be separate from one another. The first and second accesses may also be coupled at a single location with a top portion of the chamber. The coupling of the first remote plasma unit and second remote plasma unit with the single access may be configured to allow the first and second precursors to interact prior to accessing the mixing region of the chamber. The first and second accesses may also be coupled with a side portion of the chamber, and the accesses may be separate from one another or coupled together. The first access and second access may be fluidly coupled with a plenum radially distributed about the chamber and configured to provide access to the mixing region of the chamber at a plurality of locations throughout the plenum.

The chamber of the processing system may further include a showerhead positioned between the mixing region and the processing region of the chamber that is configured to distribute the first and second precursors through the chamber. The showerhead may define a plurality of apertures positioned about an exterior portion of the showerhead. The showerhead may include no apertures about an interior portion of the showerhead extending at least from a center point of the showerhead to about 25% of a radial length of the showerhead.

The remote plasma units of the system may have the first remote plasma unit including a first material and the second remote plasma unit including a second material. The first material may be selected based on the composition of the first precursor, and the second material may be selected based on the composition of the second precursor. The first material and second material may be similar or different materials. The first and second remote plasma units may be configured to operate between about 10 W to above or about 10 kW. The first remote plasma unit may be configured to operate at a first power level that is selected based on the composition of the first precursor. The second remote plasma unit may be configured to operate at a second power level that is selected based on the composition of the second precursor. The system may be configured to operate the first and second remote plasma units at power levels that are similar or different from one another.

Methods are also described of operating a semiconductor processing system. The methods may include flowing a first precursor through a first remote plasma unit into a semiconductor processing chamber. The methods may also include flowing a second precursor through a second remote plasma unit into the processing chamber. The first and second precursors may be combined in a mixing region of the chamber located fluidly upstream of a processing region of the chamber in which a substrate resides. The first precursor may include a fluorine-containing precursor, and the second precursor may include an oxygen-containing precursor. The first precursor may be excited in the first remote plasma unit at a first plasma power, and the second precursor may be excited in the second remote plasma unit at a second plasma power. The first and second plasma powers may be similar or different from one another.

Such technology may provide numerous benefits over conventional systems and techniques. For example, etch chemistries may be improved and tuned based on the individual excitation of precursors. Additionally, greater process uniformity may be provided based on the flow pathways that may provide more uniform gas mixtures. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
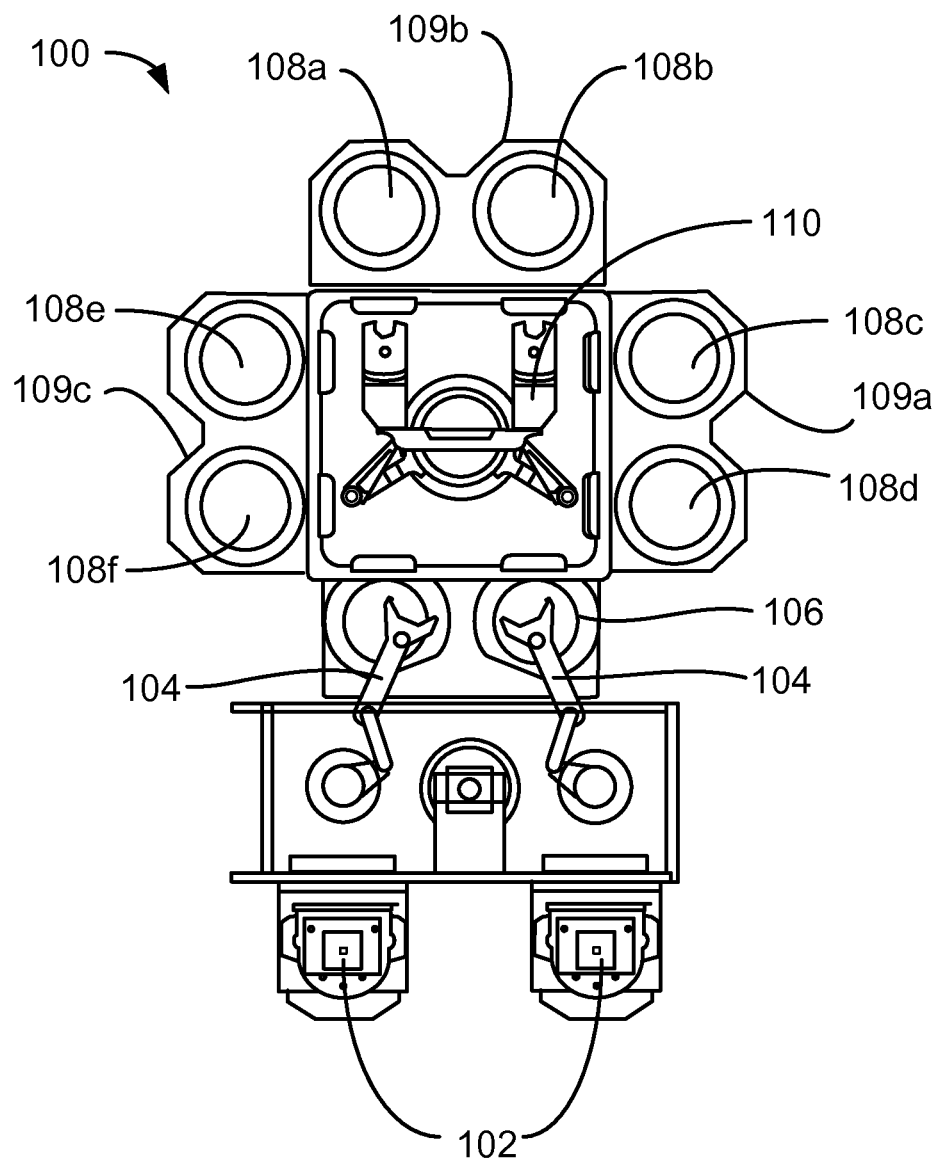
FIG. 1 shows a top plan view of one embodiment of an exemplary processing tool.

Several of the Figures are included as schematics. It is to be understood that the Figures are for illustrative purposes, and are not to be considered of scale unless specifically stated to be as such.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

The present technology includes systems for semiconductor processing that provide improved fluid delivery mechanisms. Certain dry etching techniques include utilizing remote plasma systems to provide radical fluid species into a processing chamber. Exemplary methods are described in co-assigned patent application Ser. No. 13/439,079 filed on Apr. 4, 2012, which is incorporated herein by reference to the extent not inconsistent with the claimed aspects and description herein. When dry etchant formulas are used that may include several radical species, the radical species produced from different fluids may interact differently with the remote plasma chamber. For example, precursor fluids for etching may include fluorine-containing precursors, and oxygen or hydrogen-containing precursors. The plasma cavity of the remote plasma system, as well as the distribution components to the processing chamber, may be coated or lined to provide protection from the reactive radicals. For example, an aluminum plasma cavity may be coated with an oxide or nitride that will protect the cavity from fluorine radicals. However, if the precursors also contain hydrogen radicals, the hydrogen species may convert or reduce the aluminum oxide back to aluminum, at which point the fluorine may react directly with the aluminum producing unwanted byproducts such as aluminum fluoride.

Conventional technologies have dealt with these unwanted side effects through regular maintenance and replacement of components, however, the present systems overcome this need by providing radical precursors through separate fluid pathways into the processing chamber. By utilizing two or more remote plasma systems each configured to deliver separate precursor fluids, each system may be separately protected based on the fluid being delivered. The inventors have also surprisingly determined that by providing the precursor species through separate remote plasma systems, the specific dissociation and plasma characteristics of each fluid can be tailored thereby providing improved etching performance. Accordingly, the systems described herein provide improved flexibility in terms of chemistry modulation. These and other benefits will be described in detail below.

Although the remaining disclosure will routinely identify specific etching processes utilizing the disclosed technology, it will be readily understood that the systems and methods are equally applicable to deposition and cleaning processes as may occur in the described chambers. Accordingly, the technology should not be considered to be so limited as to etching processes alone.

FIG. 1 shows a top plan view of one embodiment of a processing tool 100 of deposition, etching, baking, and curing chambers according to disclosed embodiments. In the figure, a pair of front opening unified pods (FOUPs) 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

The substrate processing chambers 108a-f may include one or more system components for depositing, annealing, curing and/or etching a dielectric film on the substrate wafer. In one configuration, two pairs of the processing chamber, e.g., 108c-d and 108e-f, may be used to deposit dielectric material on the substrate, and the third pair of processing chambers, e.g., 1308a-b, may be used to etch the deposited dielectric. In another configuration, all three pairs of chambers, e.g., 108a-f, may be configured to etch a dielectric film on the substrate. Any one or more of the processes described may be carried out in chamber(s) separated from the fabrication system shown in different embodiments. It will be appreciated that additional configurations of deposition, etching, annealing, and curing chambers for dielectric films are contemplated by system 100.

Figure 2A:
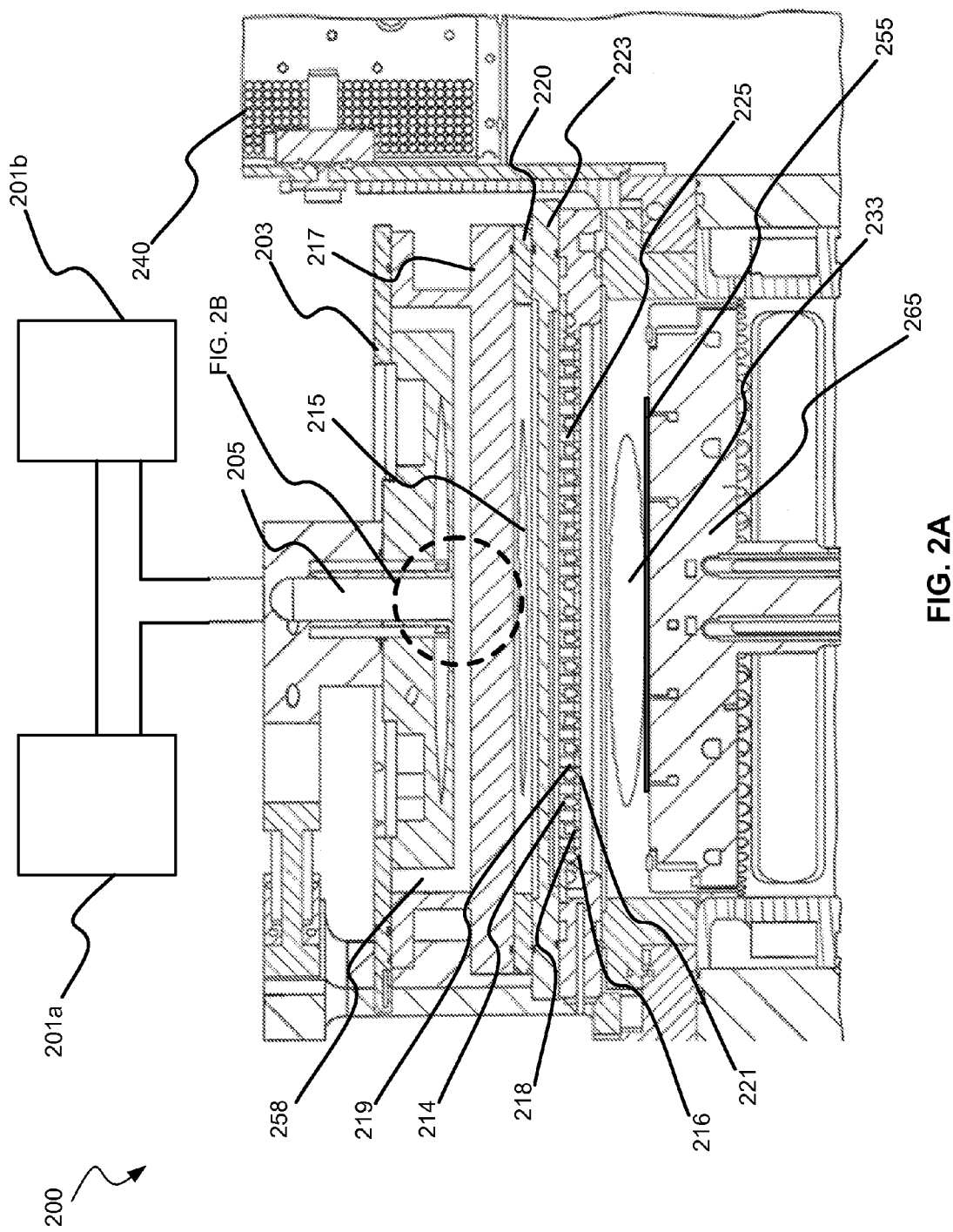
FIG. 2A shows a schematic cross-sectional view of an exemplary processing chamber.

FIG. 2A shows a cross-sectional view of an exemplary process chamber section 200 with partitioned plasma generation regions within the processing chamber. During film etching, e.g., titanium nitride, tantalum nitride, tungsten, silicon, polysilicon, silicon oxide, silicon nitride, silicon oxynitride, silicon oxycarbide, etc., a process gas may be flowed into the first plasma region 215 through a gas inlet assembly 205. One or more remote plasma system (RPS) units 201 may optionally be included in the system, and may process a first and second gas which then may travel through gas inlet assembly 205. The inlet assembly 205 may include two or more distinct gas supply channels where the second channel (not shown) may bypass either of the RPS units 201, if included. Accordingly, in disclosed embodiments the precursor gases may be delivered to the processing chamber in an unexcited state. In another example, the first channel provided through the RPS may be used for the process gas and the second channel bypassing the RPS may be used for a treatment gas in disclosed embodiments. The process gases may be excited within the RPS units 201 prior to entering the first plasma region 215. Accordingly, a fluorine-containing precursor as will be routinely referred below, for example, may pass through RPS 201 or bypass the RPS units in disclosed embodiments. Various other examples encompassed by this arrangement will be similarly understood.

A cooling plate 203, faceplate 217, ion suppressor 223, showerhead 225, and a substrate support 265, having a substrate 255 disposed thereon, are shown and may each be included according to disclosed embodiments. The pedestal 265 may have a heat exchange channel through which a heat exchange fluid flows to control the temperature of the substrate. This configuration may allow the substrate 255 temperature to be cooled or heated to maintain relatively low temperatures, such as between about −20° C. to about 200° C., or therebetween. The heat exchange fluid may comprise ethylene glycol and/or water. The wafer support platter of the pedestal 265, which may comprise aluminum, ceramic, or a combination thereof, may also be resistively heated in order to achieve relatively high temperatures, such as from up to or about 100° C. to above or about 1100° C., using an embedded resistive heater element. The heating element may be formed within the pedestal as one or more loops, and an outer portion of the heater element may run adjacent to a perimeter of the support platter, while an inner portion runs on the path of a concentric circle having a smaller radius. The wiring to the heater element may pass through the stem of the pedestal 265, which may be further configured to rotate.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the RPS 201, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region 258, gas inlet assembly 205, and fluid supply system (not shown). The structural features may include the selection of dimensions and cross-sectional geometries of the apertures in faceplate 217 to deactivate back-streaming plasma. The operational features may include maintaining a pressure difference between the gas supply region 258 and first plasma region 215 that maintains a unidirectional flow of plasma through the showerhead 225. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively coupled plasma (CCP) to be formed in the first plasma region. A baffle (not shown) may additionally be located in the first plasma region 215, or otherwise coupled with gas inlet assembly 205, to affect the flow of fluid into the region through gas inlet assembly 205.

The ion suppressor 223 may comprise a plate or other geometry that defines a plurality of apertures throughout the structure that are configured to suppress the migration of ionically-charged species out of the plasma excitation region 215 while allowing uncharged neutral or radical species to pass through the ion suppressor 223 into an activated gas delivery region between the suppressor and the showerhead. In disclosed embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may provide increased control over the gas mixture brought into contact with the underlying wafer substrate, which in turn may increase control of the deposition and/or etch characteristics of the gas mixture. For example, adjustments in the ion concentration of the gas mixture can significantly alter its etch selectivity, e.g., TiNx:SiOx etch ratios, TiN:W etch ratios, etc. In alternative embodiments in which deposition is performed, it can also shift the balance of conformal-to-flowable style depositions for dielectric materials.

The plurality of holes in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically-charged species in the activated gas passing through the ion suppressor 223 is reduced. The holes in the ion suppressor 223 may include a tapered portion that faces the plasma excitation region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppression element 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate is not always the desired goal. In many instances, ionic species are required to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in chamber plasma region 215 to avoid directly exciting gases in substrate processing region 233, while still allowing excited species to travel from chamber plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if the exposed second material is oxide, this material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 215. This in turn may allow development of particular plasma characteristics such that precursors may be dissociated in specific ways to enhance the etching profiles produced by these precursors.

A plasma may be ignited either in chamber plasma region 215 above showerhead 225 or substrate processing region 233 below showerhead 225. A plasma may be present in chamber plasma region 215 to produce the radical-fluorine precursors from an inflow of the fluorine-containing precursor. An AC voltage typically in the radio frequency (RF) range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHz frequency.

Plasma power can be of a variety of frequencies or a combination of multiple frequencies. In the exemplary processing system the plasma may be provided by RF power delivered to faceplate 217 relative to ion suppressor 223 and/or showerhead 225. The RF power may be between about 10 watts and about 2000 watts, between about 100 watts and about 2000 watts, between about 200 watts and about 1500 watts, or between about 200 watts and about 1000 watts in different embodiments. The RF frequency applied in the exemplary processing system may be low RF frequencies less than about 200 kHz, high RF frequencies between about 10 MHz and about 15 MHz, or microwave frequencies greater than or about 1 GHz in different embodiments. The plasma power may be capacitively-coupled (CCP) or inductively-coupled (ICP) into the remote plasma region.

The top plasma region 215 may be left at low or no power when a bottom plasma in the substrate processing region 233 is turned on to, for example, cure a film or clean the interior surfaces bordering substrate processing region 233. A plasma in substrate processing region 233 may be ignited by applying an AC voltage between showerhead 255 and the pedestal 265 or bottom of the chamber. A cleaning gas may be introduced into substrate processing region 233 while the plasma is present.

A fluid, such as a precursor, for example a fluorine-containing precursor, may be flowed into the processing region 233 by embodiments of the showerhead described herein. Excited species derived from the process gas in the plasma region 215 may travel through apertures in the ion suppressor 223, and/or showerhead 225 and react with an additional precursor flowing into the processing region 233 from a separate portion of the showerhead. Alternatively, if all precursor species are being excited in plasma region 215, no additional precursors may be flowed through the separate portion of the showerhead. Little or no plasma may be present in the processing region 233. Excited derivatives of the precursors may combine in the region above the substrate and, on occasion, on the substrate to etch structures or remove species on the substrate in disclosed applications.

Exciting the fluids in the first plasma region 215 directly, or exciting the fluids in the RPS units 201a-b, may provide several benefits. The concentration of the excited species derived from the fluids may be increased within the processing region 233 due to the plasma in the first plasma region 215. This increase may result from the location of the plasma in the first plasma region 215. The processing region 233 may be located closer to the first plasma region 215 than the remote plasma system (RPS) 201, leaving less time for the excited species to leave excited states through collisions with other gas molecules, walls of the chamber, and surfaces of the showerhead.

The uniformity of the concentration of the excited species derived from the process gas may also be increased within the processing region 233. This may result from the shape of the first plasma region 215, which may be more similar to the shape of the processing region 233. Excited species created in the RPS units 201a-b may travel greater distances in order to pass through apertures near the edges of the showerhead 225 relative to species that pass through apertures near the center of the showerhead 225. The greater distance may result in a reduced excitation of the excited species and, for example, may result in a slower growth rate near the edge of a substrate. Exciting the fluids in the first plasma region 215 may mitigate this variation for the fluid flowed through RPS 201.

The processing gases may be excited in the RPS units 201a-b and may be passed through the showerhead 225 to the processing region 233 in the excited state. Alternatively, power may be applied to the first processing region to either excite a plasma gas or enhance an already excited process gas from the RPS. While a plasma may be generated in the processing region 233, a plasma may alternatively not be generated in the processing region. In one example, the only excitation of the processing gas or precursors may be from exciting the processing gases in the RPS units 201a-b to react with one another in the processing region 233.

In addition to the fluid precursors, there may be other gases introduced at varied times for varied purposes, including carrier gases to aid delivery. A treatment gas may be introduced to remove unwanted species from the chamber walls, the substrate, the deposited film and/or the film during deposition. A treatment gas may be excited in a plasma and then used to reduce or remove residual content inside the chamber. In other disclosed embodiments the treatment gas may be used without a plasma. When the treatment gas includes water vapor, the delivery may be achieved using a mass flow meter (MFM), an injection valve, or by commercially available water vapor generators. The treatment gas may be introduced to the processing region 233, either through the RPS unit or bypassing the RPS units, and may further be excited in the first plasma region.

Figure 2B:
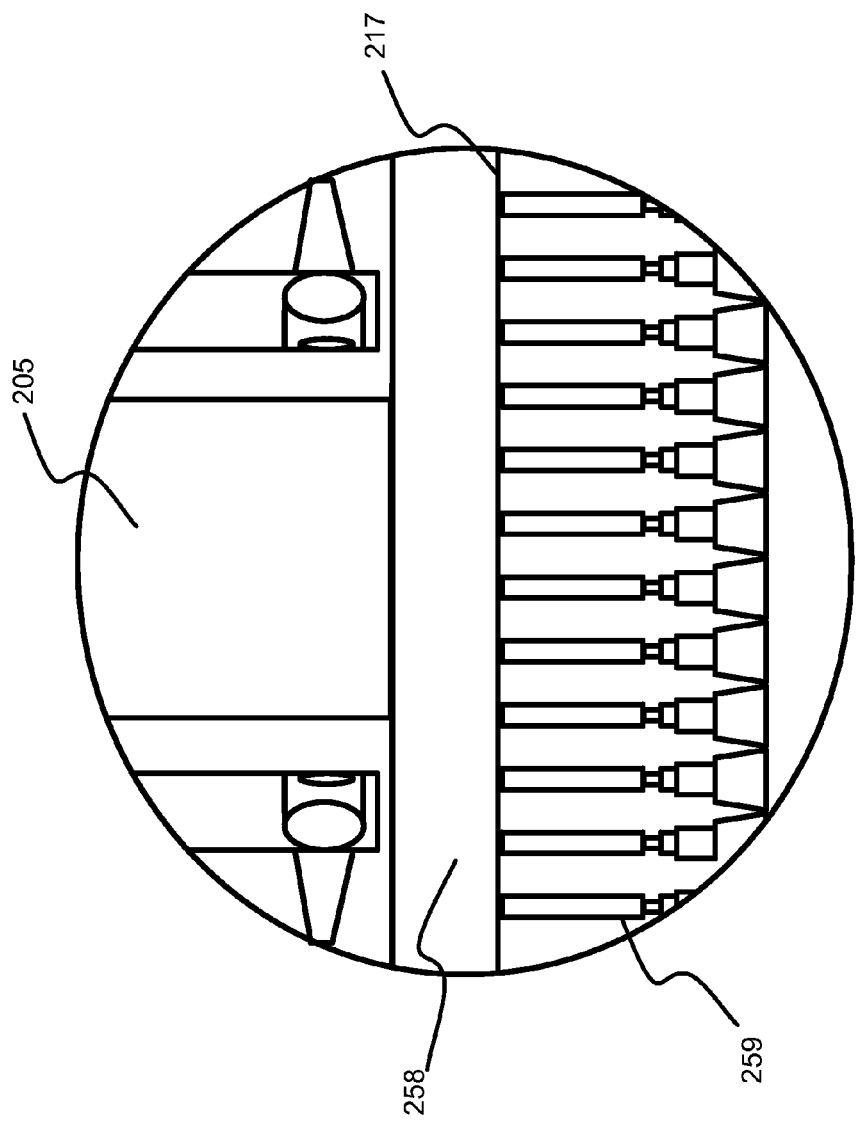
FIG. 2B shows a detailed view of a portion of the processing chamber illustrated in FIG. 2A.

FIG. 2B shows a detailed view of the features affecting the processing gas distribution through faceplate 217. As shown in FIGS. 2A and 2B, faceplate 217, cooling plate 203, and gas inlet assembly 205 intersect to define a gas supply region 258 into which process gases may be delivered from gas inlet 205. The gases may fill the gas supply region 258 and flow to first plasma region 215 through apertures 259 in faceplate 217. The apertures 259 may be configured to direct flow in a substantially unidirectional manner such that process gases may flow into processing region 233, but may be partially or fully prevented from backflow into the gas supply region 258 after traversing the faceplate 217.

Figure 3A:
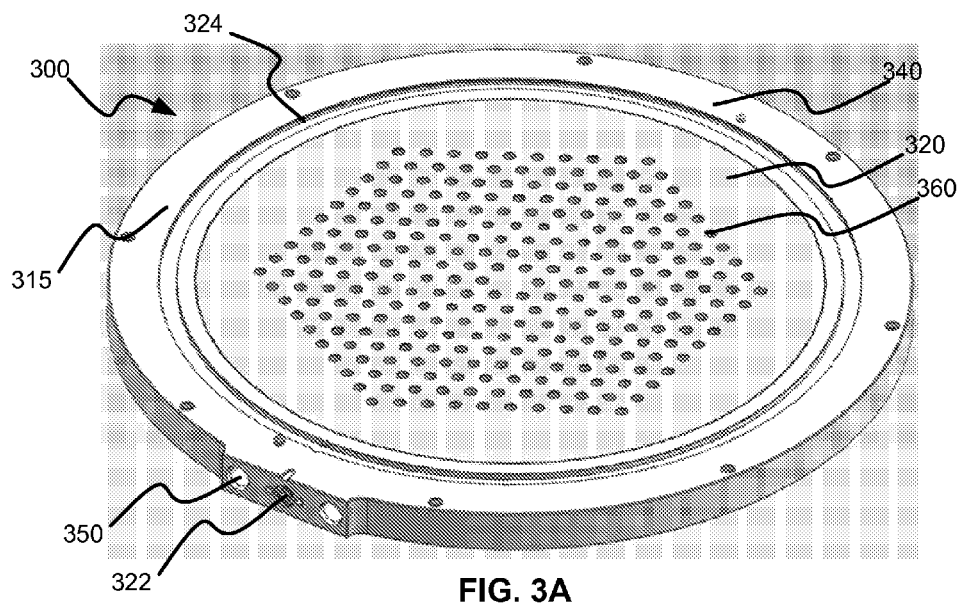
FIGS. 3A-3C show schematic views of exemplary showerhead configurations according to the disclosed technology.
Figure 3B:
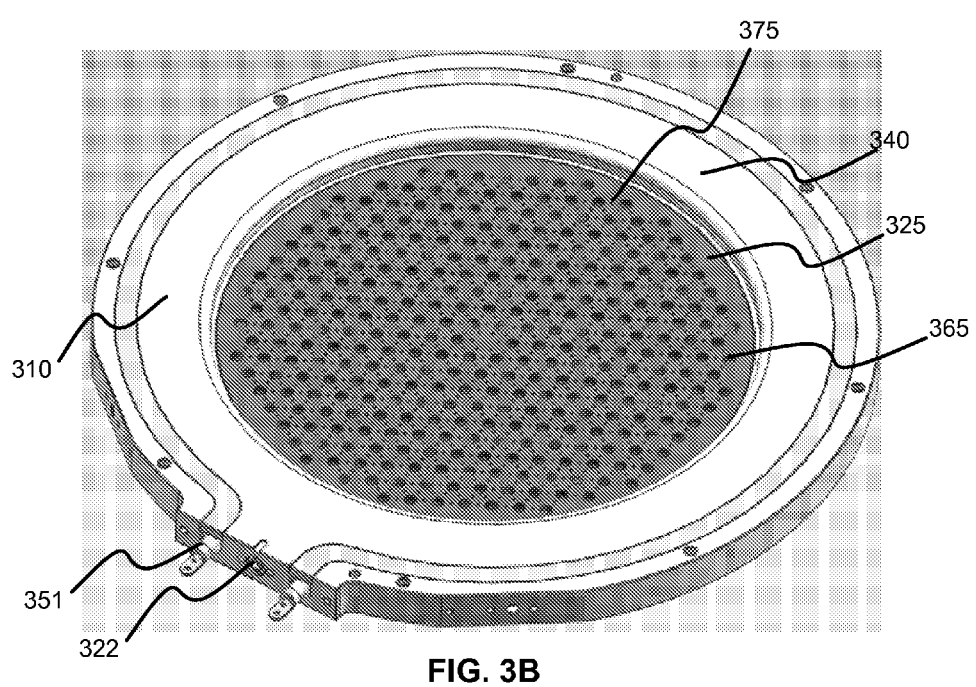
Figure 3C:
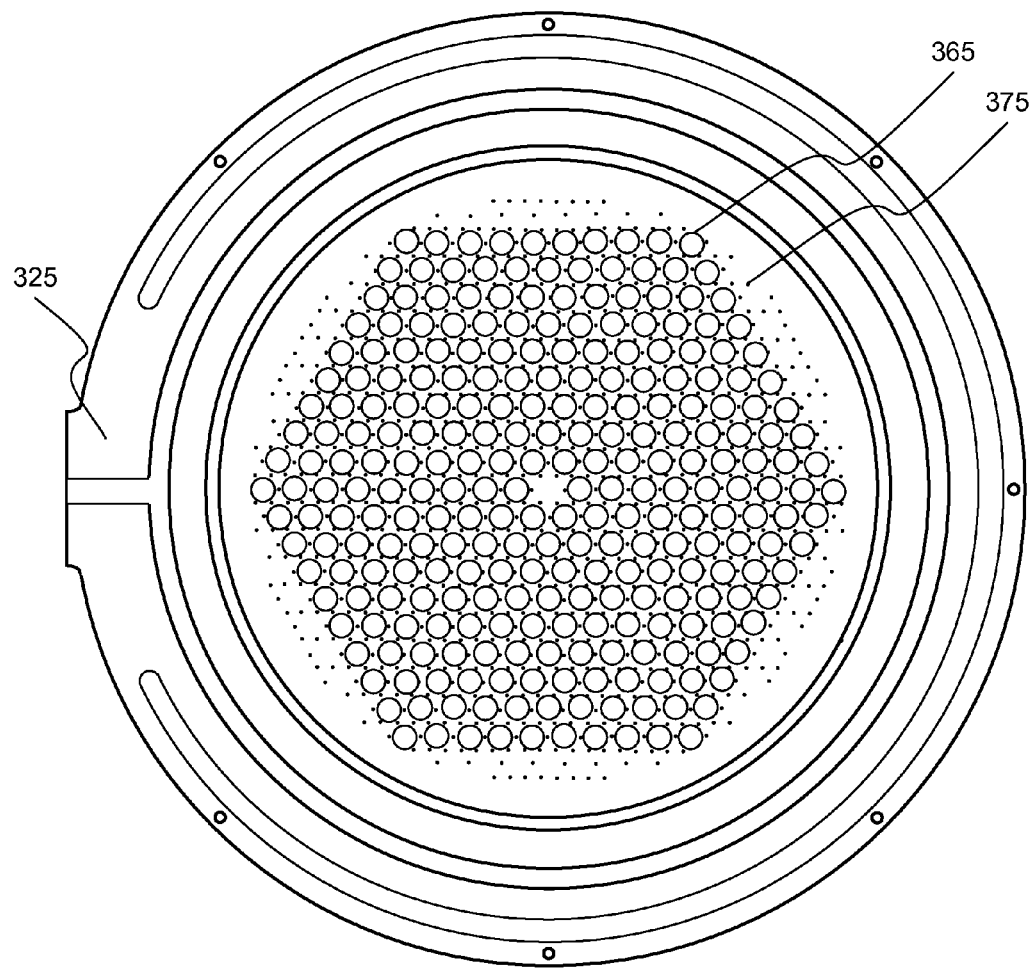

The gas distribution assemblies such as showerhead 225 for use in the processing chamber section 200 may be referred to as dual channel showerheads (DCSH) and are additionally detailed in the embodiments described in FIG. 2A as well as FIGS. 3A-C herein. The dual channel showerhead may provide for etching processes that allow for separation of etchants outside of the processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first fluid channels 219 through the upper and lower plates, and second fluid channels 221 through the lower plate 216. The formed channels may be configured to provide fluid access from the volume 218 through the lower plate 216 via second fluid channels 221 alone, and the first fluid channels 219 may be fluidly isolated from the volume 218 between the plates and the second fluid channels 221. The volume 218 may be fluidly accessible through a side of the gas distribution assembly 225. Although the exemplary system of FIG. 2 includes a dual-channel showerhead, it is understood that alternative distribution assemblies may be utilized that maintain first and second precursors fluidly isolated prior to the processing region 233. For example, a perforated plate and tubes underneath the plate may be utilized, although other configurations may operate with reduced efficiency or not provide as uniform processing as the dual-channel showerhead as described.

In the embodiment shown, showerhead 225 may distribute via first fluid channels 219 process gases which contain plasma effluents upon excitation by a plasma in chamber plasma region 215 or from RPS units 201a-b. In embodiments, the process gas introduced into the RPS units 201 and/or chamber plasma region 215 may contain fluorine, e.g., $CF_4$, $NF_3$ or $XeF_2$, oxygen, e.g. $N_2O$, or hydrogen-containing precursors, e.g. $H_2$ or $NH_3$. One or both process gases may also include a carrier gas such as helium, argon, nitrogen ($N_2$), etc. Plasma effluents may include ionized or neutral derivatives of the process gas and may also be referred to herein as a radical-fluorine precursor referring to the atomic constituent of the process gas introduced.

An additional dual channel showerhead, as well as this processing system and chamber, are more fully described in patent application Ser. No. 13/251,714 filed on Oct. 3, 2011, which is hereby incorporated by reference for all purposes to the extent not inconsistent with the claimed features and description herein.

The gas distribution assemblies 225 for use in the processing chamber section 200 are referred to as dual channel showerheads (DCSH) and are detailed in the embodiments described in FIGS. 3A-3C herein. The dual channel showerhead may allow for flowable deposition of a dielectric material, and separation of precursor and processing fluids during operation. The showerhead may alternatively be utilized for etching processes that allow for separation of etchants outside of the reaction zone to provide limited interaction with chamber components and each other prior to being delivered into the processing region.

Referring generally to the showerheads in FIGS. 3A-3C, precursors may be introduced into the processing region by first being introduced into an internal showerhead volume defined in the showerhead 300 by a first manifold 320, or upper plate, and second manifold 325, or lower plate. The manifolds may be perforated plates that define a plurality of apertures. The precursors in the internal showerhead volume, typically referred to as the third precursors, may flow into the processing region 233 via apertures 375 formed in the lower plate. This flow path may be isolated from the rest of the process gases in the chamber, and may provide for the precursors to be in an unreacted or substantially unreacted state until entry into the processing region 233 defined between the substrate 255 and a bottom of the lower plate 325. Once in the processing region 233, the two precursors may react with each other and the substrate. The third precursor may be introduced into the internal showerhead volume defined in the showerhead 300 through a side channel formed in the showerhead, such as channel 322 as shown in the showerhead embodiments herein. The first and second precursor gases may be in a plasma state including radicals from the RPS units or from a plasma generated in the first plasma region. Additionally, a plasma may be generated in the processing region.

FIG. 3A illustrates an upper perspective view of a gas distribution assembly 300. In usage, the gas distribution system 300 may have a substantially horizontal orientation such that an axis of the gas apertures formed therethrough may be perpendicular or substantially perpendicular to the plane of the substrate support (see substrate support 265 in FIG. 2). FIG. 3B illustrates a bottom perspective view of the gas distribution assembly 300. FIG. 3C is a bottom plan view of the gas distribution assembly 300.

Referring to FIGS. 3A-3C, the gas distribution assembly 300 generally includes the annular body 340, the upper plate 320, and the lower plate 325. The annular body 340 may be a ring which has an inner annular wall located at an inner diameter, an outer annular wall located at an outer diameter, an upper surface 315, and a lower surface 310. The upper surface 315 and lower surface 310 define the thickness of the annular body 340. A conduit 350 may be formed in the annular body 340 and a cooling fluid may be flowed within the channel that extends around the circumference of the annular body 340. Alternatively, a heating element 351 may be extended through the channel that is used to heat the showerhead assembly. Annular body 340 may additionally define a channel 322 through which an additional precursor may be delivered to the processing chamber.

The upper plate 320 may be a disk-shaped body, and may be coupled with the annular body 340 at the first upper recess. The upper plate may have a diameter selected to mate with the diameter of the upper recess, and the upper plate may comprise a plurality of first apertures 360 formed therethrough. The first apertures 360 may extend beyond a bottom surface of the upper plate 320 thereby forming a number of raised cylindrical bodies (not shown). In between each raised cylindrical body may be a gap. As seen in FIG. 3A, the first apertures 360 may be arranged in a polygonal pattern on the upper plate 320, such that an imaginary line drawn through the centers of the outermost first apertures 360 define or substantially define a polygonal figure, which may be for example, a six-sided polygon.

The lower plate 325 may have a disk-shaped body having a number of second apertures 365 and third apertures 375 formed therethrough, as especially seen in FIG. 3C. The lower plate 325 may have multiple thicknesses, with the thickness of defined portions greater than the central thickness of the upper plate 320, and in disclosed embodiments at least about twice the thickness of the upper plate 320. The lower plate 325 may also have a diameter that mates with the diameter of the inner annular wall of the annular body 340 at the first lower recess. The second apertures 365 may be defined by the lower plate 325 as cylindrical bodies extending up to the upper plate 320. In this way, channels may be formed between the first and second apertures that are fluidly isolated from one another, and may be referred to as first fluid channels. Additionally, the volume formed between the upper and lower plates may be fluidly isolated from the channels formed between the first and second apertures. As such, a fluid flowing through the first apertures 360 will flow through the second apertures 365 and a fluid within the internal volume between the plates will flow through the third apertures 375, and the fluids will be fluidly isolated from one another until they exit the lower plate 325 through either the second or third apertures. Third apertures 375 may be referred to as second fluid channels, which extend from the internal volume through the bottom plate 325. This separation may provide numerous benefits including preventing a radical precursor from contacting a second precursor prior to reaching a processing region. By preventing the interaction of the gases, reactions within the chamber may be minimized prior to the processing region in which the reaction is desired.

The second apertures 365 may be arranged in a pattern that aligns with the pattern of the first apertures 360 as described above. In one embodiment, when the upper plate 320 and bottom plate 325 are positioned one on top of the other, the axes of the first apertures 360 and second apertures 365 align. In disclosed embodiments, the upper and lower plates may be coupled with one another or directly bonded together. Under either scenario, the coupling of the plates may occur such that the first and second apertures are aligned to form a channel through the upper and lower plates. The plurality of first apertures 360 and the plurality of second apertures 365 may have their respective axes parallel or substantially parallel to each other, for example, the apertures 360, 365 may be concentric. Alternatively, the plurality of first apertures 360 and the plurality of second apertures 365 may have the respective axis disposed at an angle from about 1° to about 30° from one another. At the center of the bottom plate 325 there may or may not be a second aperture 365.

FIG. 3C is a bottom view of a showerhead 325 for use with a processing chamber according to disclosed embodiments. Showerhead 325 corresponds with the showerhead shown in FIG. 2A. Through-holes 365, which show a view of first fluid channels 219, may have a plurality of shapes and configurations in order to control and affect the flow of precursors through the showerhead 325. Small holes 375, which show a view of second fluid channels 221, may be distributed substantially evenly over the surface of the showerhead, even amongst the through-holes 365, which may help to provide more even mixing of the precursors as they exit the showerhead than other configurations.

Figure 4:
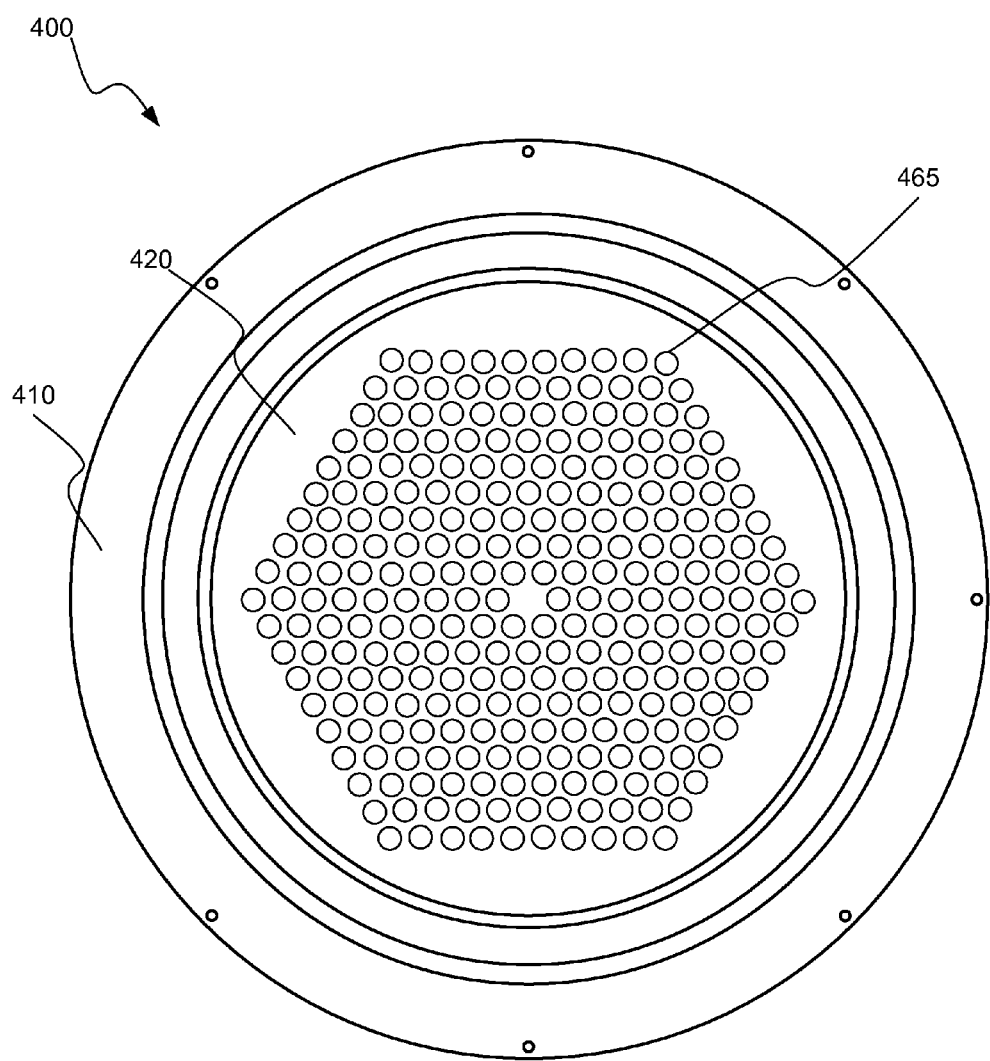
FIG. 4 shows an additional plan view of an exemplary showerhead according to the disclosed technology.

An alternative arrangement for a showerhead or faceplate according to disclosed embodiments is shown in FIG. 4. As shown, the showerhead 400 may comprise a perforated plate or manifold. The assembly of the showerhead may be similar to the showerhead as shown in FIG. 3, or may include a design configured specifically for distribution patterns of precursor gases. Showerhead 400 may include an annular frame 410 positioned in various arrangements within an exemplary processing chamber, such as one or more arrangements as shown in FIGS. 2, 5, 6, 7, and/or 9. On or within the frame may be coupled a plate 420, which may be similar in disclosed embodiments to plate 320 as previously described. The plate may have a disc shape and be seated on or within the frame 410. The plate may be of a variety of thicknesses, and may include a plurality of apertures 465 defined within the plate. An exemplary arrangement as shown in FIG. 4 may include a pattern as previously described with reference to the arrangement in FIG. 3, and may include a series of rings of apertures in a geometric pattern, such as a hexagon as shown. As would be understood, the pattern illustrated is exemplary and it is to be understood that a variety of patterns, hole arrangements, and hole spacing are encompassed in the design.

Figure 5:
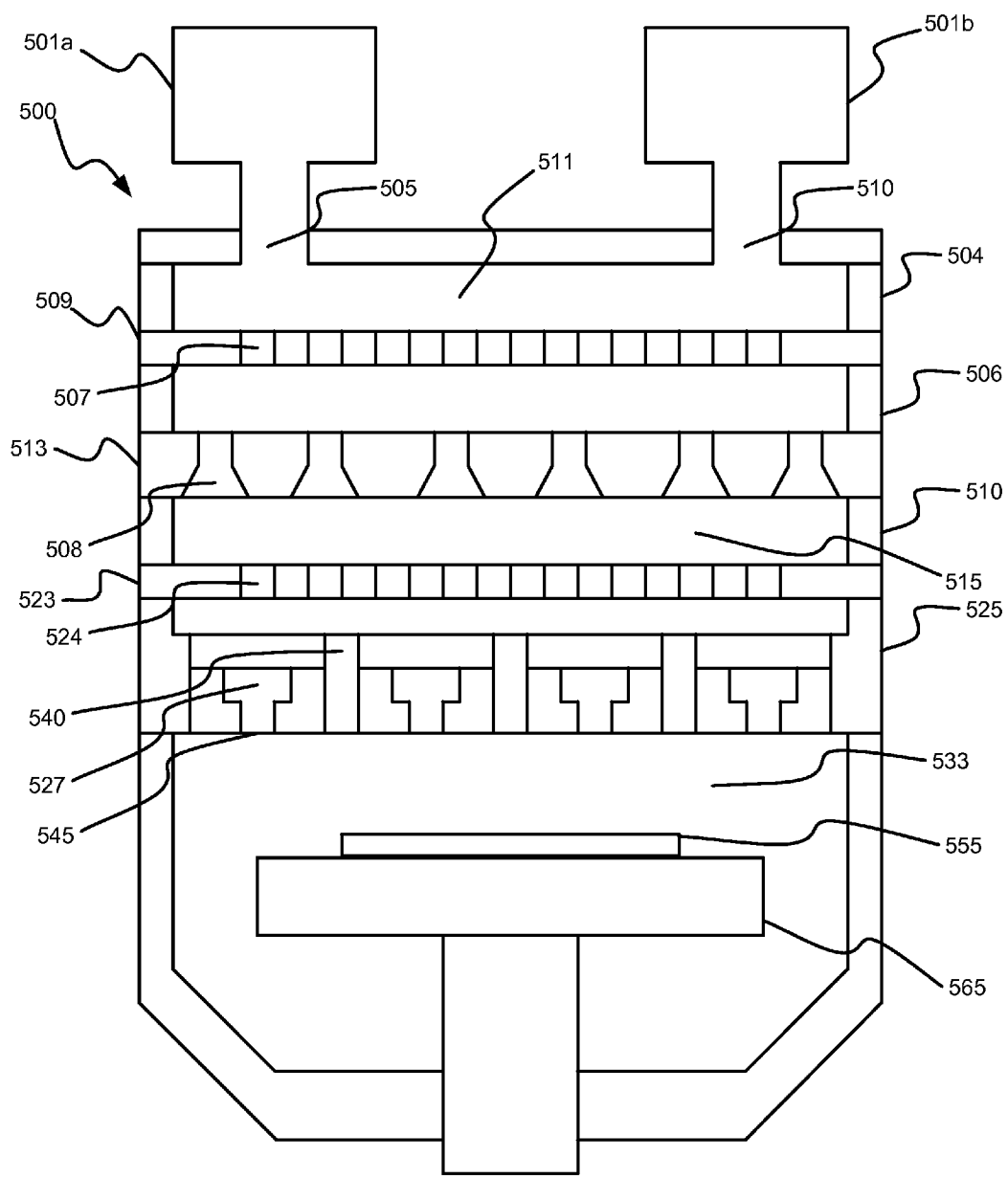
FIG. 5 shows a simplified cross-sectional view of a processing chamber according to the disclosed technology.

Turning to FIG. 5 is shown a simplified schematic of processing system 500 is shown according to the disclosed technology. The chamber of system 500 may include any of the components as previously discussed, and may be configured to house a semiconductor substrate 555 in a processing region 533 of the chamber. The substrate 555 may be located on a pedestal 565 as shown. Processing chamber 500 may include two remote plasma units or systems (RPS) 501a-b. In disclosed embodiments, the chamber of system 500 may include any number of additional plasma units above the two illustrated based on the number of precursors being utilized. A first RPS unit 501a may be fluidly coupled with a first access 505 of the chamber of system 500, and may be configured to deliver a first precursor into the chamber of system 500 through the first access 505. A second RPS unit 501b may be fluidly coupled with a second access 510 of the chamber of system 500, and may be configured to deliver a second precursor into the chamber through the second access 510. An exemplary configuration may include the first access 505 and the second access 510 coupled with a top portion of the chamber. The exemplary configuration may further couple the RPS units with the accesses such that the first access 505 and second access 510 are separate from one another.

First and second plasma units 501*a-b* may be the same or different plasma units. For example, either or both systems may be RF plasma systems, CCP plasma chambers, ICP plasma chambers, magnetically generated plasma systems including toroidal plasma systems, microwave plasma systems, etc., or any other system type capable of forming a plasma or otherwise exciting and/or dissociating molecules therein. The first access 505 and second access 510 may be coupled with a portion of the chamber to provide access to a mixing region 511 of the processing chamber. The mixing region 511 may be separate from and fluidly coupled with the processing region 533 of the chamber. The mixing region 511 may further be configured to allow the first and second precursors to interact with each other externally from the processing region 533 of the chamber. For example, a first precursor delivered through the first RPS unit 501*a* and a second precursor delivered through the second RPS unit 501*b* may enter the mixing region 511 through the respective access locations and mix within the region to provide a more uniform dispersion of species across a profile of the gas mixture. The mixing region 511 may be at least partially defined by a top of the chamber of system 500 and a distribution device, such as a showerhead 509 below. Showerhead 509 may be similar to the showerhead illustrated in FIG. 4 in disclosed embodiments. Showerhead 509 may include a plurality of channels or apertures 507 that may be positioned and/or shaped to affect the distribution and/or residence time of the precursors in the mixing region 511 before proceeding through the chamber. For example, recombination may be affected or controlled by adjusting the number of apertures, size of the apertures, or configuration of apertures across the showerhead 509. Spacer 504, such as a ring of dielectric material may be positioned between the top of the chamber and the showerhead 509 to further define the mixing region 511. As illustrated, showerhead 509 may be positioned between the mixing region 511 and the processing region 533 of the chamber, and the showerhead 509 may be configured to distribute the first and second precursors through the chamber 500.

The chamber of system 500 may include one or more of a series of components that may optionally be included in disclosed embodiments. An additional faceplate or showerhead 513 may be positioned below the showerhead 509 in order to further affect the distribution of the precursors directed through the chamber. In disclosed embodiments, the precursors that are at least partially mixed in mixing region 511 may be directed through the chamber via one or more of the operating pressure of the system, the arrangement of the chamber components, and the flow profile of the precursors. Showerhead 509 and faceplate 513 may be separated by spacer 506, which may include a ring of material, such as a dielectric material, metal, or other composition separating the two showerheads. Faceplate 513 may provide additional mixing and distribution of precursors to further provide a uniform profile through the mixed precursors. Faceplate 513 may be of a similar shape or dimensioning as showerhead 509, and may again have similar characteristics as the showerhead illustrated in FIG. 4. In disclosed embodiments, faceplate 513 may be of a greater or lesser thickness than showerhead 509. Additionally, channels or apertures 508 in faceplate 513 may be shaped in a similar fashion to apertures 507 defined in showerhead 509. In disclosed embodiments some or all of the apertures 508 may be differently shaped such as illustrated with a tapered portion extending outward toward the processing region 533.

An additional plate or device 523 may be disposed below the faceplate 513. Plate 523 may include a similar design as showerhead 509, and may have a similar arrangement as the showerhead illustrated at FIG. 4, for example. Spacer 510 may be positioned between the faceplate 513 and plate 523, and may include similar components as previously discussed, such as a dielectric material. Apertures 524 may be defined in plate 523, and may be distributed and configured to affect the flow of ionic species through the plate 523. For example, the apertures 524 may be configured to at least partially suppress the flow of ionic species directed toward the processing region 533. The apertures 524 may have a variety of shapes including channels as previously discussed, and may include a tapered portion extending outward away from the processing region 533 in disclosed embodiments.

The chamber of system 500 optionally may further include a gas distribution assembly 525 within the chamber. The gas distribution assembly 525, which may be similar in aspects to the dual-channel showerheads as previously described, may be located within the chamber at a top portion of the processing region 533, or above the processing region 533. The gas distribution assembly 525 may be configured to deliver both the first and second precursors into the processing region 533 of the chamber. Although the exemplary system of FIG. 5 includes a dual-channel showerhead, it is understood that alternative distribution assemblies may be utilized that maintain a third precursor fluidly isolated from the radical species from the first and second precursors prior to the processing region 533. For example, a perforated plate and tubes underneath the plate may be utilized, although other configurations may operate with reduced efficiency or not provide as uniform processing as the dual-channel showerhead as described. By utilizing one of the disclosed designs, a third precursor may be introduced into the processing region 533 that is not previously excited by a plasma prior to entering the processing region 533. Although not shown, an additional spacer may be positioned between the plate 523 and the showerhead 525, such as an annular spacer, to isolate the plates from one another. In embodiments in which a third precursor is not required, the gas distribution assembly 525 may have a design similar to any of the previously described components, and may include characteristics similar to the showerhead illustrated in FIG. 4.

The gas distribution assembly 525 may comprise an upper plate and a lower plate as previously discussed. The plates may be coupled with one another to define a volume 527 between the plates. The coupling of the plates may be such as to provide first fluid channels 540 through the upper and lower plates, and second fluid channels 545 through the lower plate. The formed channels may be configured to provide fluid access from the volume 527 through the lower plate, and the first fluid channels 540 may be fluidly isolated from the volume 527 between the plates and the second fluid channels 545. The volume 527 may be fluidly accessible through a side of the gas distribution assembly 525, such as channel 322 as previously discussed. The channel may be coupled with a third access in the chamber separate from the first access 505 and the second access 510 of the chamber 500.

The plasma cavities of the RPS units 501*a-b*, and any mechanical couplings leading to the chamber accesses 505, 510 may be made of materials based on the first and second precursors selected to be flowed through the RPS units

501*a-b*. For example, in certain etching operations, a fluorine-containing precursor, e.g., $NF_3$, may be flowed through either of the first and second RPS units, such as RPS unit 501*a*. When a plasma is formed in the RPS unit 501*a*, the molecules may dissociate into radical ions. If the RPS unit 501*a* is made of an unaltered aluminum, fluorine radicals may react with the cavity walls forming byproducts such as aluminum fluoride. Accordingly, RPS unit 501*a* may be formed with a first material that may be for example aluminum oxide, aluminum nitride, or another material with which the first precursor does not interact. The material of the RPS unit 501*a* may be selected based on the composition of the first precursor, and may be specifically selected such that the precursor does not interact with the chamber components.

Similarly, the second RPS unit 501*b* may be made of a second material that is selected based on the second precursor. In disclosed embodiments, the first and second material may be different materials. For example, if an oxygen-containing precursor, such as $N_2O$ or $O_2$, or a hydrogen containing precursor is flowed through the second RPS 501*b* and a plasma is formed, dissociated radicals that may include O*, NO*, H*, etc., may interact with the plasma cavity of the RPS 501*b*. If the chamber is similarly made of aluminum oxide, for example, hydrogen radicals in an exemplary embodiment may interact with the oxide, and may remove the protective coating. Accordingly, RPS unit 501*b* may be made of a second material different from the first such as aluminum, or another material with which the second precursor does not interact. This may be extended to the couplings or various other components of the chamber as well. Such coatings or materials selections may improve equipment degradation over time. Accordingly, for example, the couplings, spacers, gas distribution assembly plates, etc. may each include multiple plates made of one or more materials. Moreover, the chamber may not include one or more of the components previously described. For example, gas distribution assembly 525 may be removed in configurations that my not require a third precursor that is maintained isolated from plasma species. Similarly, showerhead 509 may be removed in disclosed embodiments in which faceplate 513 may provide adequate distribution profiles of the precursors.

In operation, one or both of the RPS units 501*a-b* may be used to produce a plasma within the unit to at least partially ionize the first and/or second precursor. In one example in which a fluorine-containing precursor and an oxygen-containing precursor are utilized, the oxygen-containing precursor may be flowed through the first RPS unit 501*a* and the fluorine-containing precursor may be flowed through the second RPS unit 501*b*. Such a configuration may be configured based on the travel distances for the radical species. Although shown equal distances from the processing chamber of system 500, based on the size and configuration of the RPS units 501, one or both of them may be further removed from the chamber, such that the produced radical species may have a longer flow path to the chamber. For example, in an embodiment in which a hydrogen-containing precursor is used, because hydrogen radicals may recombine more quickly than fluorine radicals due to a shorter half-life, the hydrogen-containing precursor may be flowed through the chamber with the shorter flow path. However, it is to be understood that a variety of configurations may be utilized which may flow any or either precursors through any or either RPS unit. Also, additional RPS units may be utilized if additional precursors are to be utilized for the operations to be performed.

The RPS units 501*a-b* may be operated at power levels from between below or about 10 W up to above or about 10 or 15 kW in various embodiments. The inventors have advantageously determined that an additional benefit of the disclosed technology is that the power and plasma profile of each RPS unit may be tuned to the particular precursor used. In this way, each plasma may have separate plasma potentials within each RPS unit. For example, continuing the example with a fluorine-containing precursor and an oxygen or hydrogen-containing precursor, some conventional systems require that both precursors requiring dissociation be flowed through the same RPS unit. In addition to the potential deterioration of the plasma cavity and RPS unit as discussed above, a plasma profile beneficial to both precursors may not be available. Continuing the example, fluorine-containing precursors including $NF_3$ may be processed at a relatively low level of power in the RPS unit. By operating the RPS at a power level at or below 100 W, 200 W, 400 W, up to 1000 W or more, the precursor may be dissociated to a lesser degree that does not completely ionize the particles, and includes independent radicals including NF and $NF_2$ species as well. Additionally, the RPS unit processing the oxygen or hydrogen-containing precursor may be operated at a much higher power level as complete dissociation may be desired. Accordingly, the RPS unit may be operated between up to or above about 1000 W and up to or above about 10 kW or more. The RF frequency applied in the exemplary processing system may be low RF frequencies less than about 500 kHz, high RF frequencies between about 10 MHz and about 15 MHz or microwave frequencies greater than or about 1 GHz in different embodiments. As such, the first RPS unit 501*a* may be configured to operate at a first power level that is selected based on the composition of the first precursor, and the second RPS may be configured to operate at a second power level that is selected based on the composition of the second precursor. The two RPS units 501*a-b* may be configured to operate at power levels different from one another. Such a configuration may require separate or decoupled power sources, among other changes.

A further advantage of the present configuration may be based on the flow rates of the respective precursors. Initially, as previously discussed, either or both of the first and second precursors may be flowed with one or more carrier gases. However, the amount of each precursor utilized in exemplary operations may not be similar, which may detrimentally affect conventional systems including a single RPS unit. For example, if the first and second precursors are flowed through a single RPS unit, increasing the flow of one precursor may require an increase in the flow of the second precursor to ensure that an adequate amount of radical species are produced of each species. This may occur due to the dilution of either of the respective precursors from the increase in amount of the other precursor. In the present technology, however, such an issue may be overcome based on the separately ionized precursors. Accordingly, further process tuning may be provided by allowing individual modulation of precursor flows, while still providing adequate radical species of other precursor sources.

Additional flexibility may be provided by operating one of the RPS units but not the other. For example, a fluorine-containing precursor may be flowed through the first RPS unit 501*a* that is configured to operate at a power level that may be lower based on the precursor. An oxygen or hydrogen-containing precursor may be flowed through the second RPS unit 501*b* in which a plasma is not formed such that the molecular precursor flows to the mixing region 511. When the first and second precursors separately enter the mixing region 511 they may interact, and the first precursor that has been at least partially radicalized in RPS unit 501a may ionize a portion of the second precursor, in which case power efficiency of the system may be improved. Based on these examples, it is understood that many aspects may be reversed or changed in disclosed embodiments of the technology based on various operational characteristics.

Additionally, a plasma as described earlier may be formed in a region of the chamber defined between two or more of the components previously discussed. By providing an additional plasma source, such as a CCP source, the plasma particles produced in the RPS units may be continued or enhanced, and the rate of recombination may be further tuned. For example, a plasma region such as a first plasma region 515 as previously described, may be formed between faceplate 508 and plate 523. Spacer 510 may maintain the two devices electrically isolated from one another in order to allow a plasma field to be formed. Faceplate 508 may be electrically charged while plate 523 may be grounded or DC biased to produce a plasma field within the region defined between the plates. The plates may additionally be coated or seasoned in order to minimize the degradation of the components between which the plasma may be formed. The plates may additionally include compositions that may be less likely to degrade or be affected including ceramics, metal oxides, etc.

Operating a conventional CCP plasma may degrade the chamber components, which may remove particles that may be inadvertently distributed on a substrate. Such particles may affect performance of devices formed from these substrates due to the metal particles that may provide short-circuiting across semiconductor substrates. However, the CCP plasma of the disclosed technology may be operated at reduced or substantially reduced power because the CCP plasma may be utilized only to maintain the plasma, and not to ionize species within the plasma region. For example, the CCP plasma may be operated at a power level below or about 1 kW, 500 W, 250 W, 100 W, 50 W, 20 W, etc. or less. Moreover, the CCP plasma may produce a flat plasma profile which may provide a uniform plasma distribution within the space. As such, a more uniform plasma may be delivered downstream to the processing region of the chamber.

Figure 6:
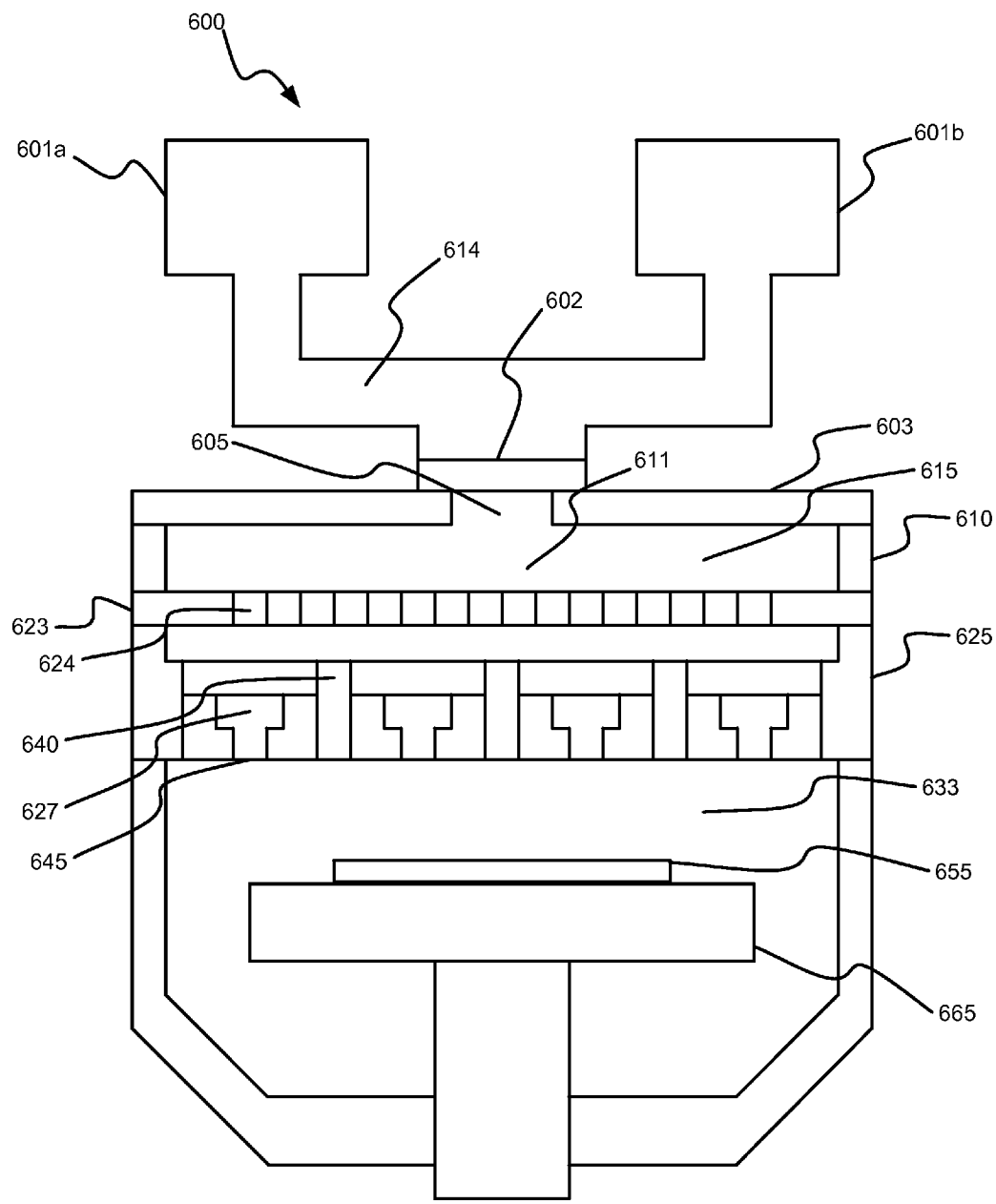
FIG. 6 shows a simplified cross-sectional view of a processing chamber according to the disclosed technology.

FIG. 6 shows a simplified cross-sectional view of a processing system 600 according to the disclosed technology. The processing chamber of system 600 may include some or all of the components previously described with respect to the processing chamber of FIG. 5. For example, the processing chamber may be configured to house a semiconductor substrate 655 in a processing region 633 of the chamber. The substrate 655 may be located on a pedestal 665 as shown. The system 600 may include two or more remote plasma units or systems (RPS) 601a-b. The system 600 may include a first RPS unit 601a and a second RPS unit 601b as previously discussed, which may be configured to provide radicalized precursors to the processing chamber. As illustrated in the Figure, the first and second RPS units may be fluidly coupled to the chamber in such a way as to couple with a single access to the chamber. Accordingly, in disclosed embodiments the first and second accesses are coupled at a single location 605 that may be positioned along the top surface of the processing chamber. The coupling of the first RPS unit 601a and the second RPS unit 601b with the single access 605 may be configured to allow a first and second precursor to interact prior to accessing the mixing region 611 of the chamber.

The components coupling the RPS units 601 to the chamber may include piping 614 in several arrangements. For example, the piping may be arranged in a Y-connection as illustrated in the Figure, or for example in a T-connection as illustrated in FIG. 2. Various other arrangements and connections may similarly be used to couple the RPS units 601. The piping 614 may be coated or produced of materials designed to have little or no interaction with the precursors that may be flowed through the RPS units. The piping 614 may be formed with rifling, knurling, or other designs configured to provide turbulence and mixing of the precursors prior to entering the chamber. The separately excited precursors may interact above the access 605 to provide additional mixing that may provide improved uniformity of distribution of the precursors through the chamber. The access 605 may be formed in a top plate such as a faceplate 603 that at least partially defines a mixing region 611. The mixing region may be additionally defined by a plate 623 that may be configured to suppress the flow of ionic species into the processing region 633.

Plate 623 may include a similar design and may have a similar arrangement as the showerhead illustrated at FIG. 4, for example. Spacer 610 may be positioned between the faceplate 603 and plate 623, and may include similar components as previously discussed, such as a dielectric material. Apertures 624 may be defined in plate 623, and may be distributed and configured to affect the flow of ionic species through the plate 623. For example, the apertures 624 may be configured to at least partially suppress the flow of ionic species directed toward the processing region 633. The apertures 624 may have a variety of shapes including channels as previously discussed, and may include a tapered portion extending upward away from the processing region 633 in disclosed embodiments.

System 600 may further include a gas distribution assembly 625 within the chamber. The gas distribution assembly 625, which may be similar in aspects to the dual-channel showerheads as previously described, may be located within the chamber at a top portion of the processing region 633, or above the processing region 633. The gas distribution assembly 625 may be configured to deliver both the first and second precursors into the processing region 633 of the chamber. Although the exemplary system of FIG. 6 includes a dual-channel showerhead, it is understood that alternative distribution assemblies may be utilized that maintain a third precursor fluidly isolated from the radical species of the first and second precursors prior to entering the processing region 633. Although not shown, an additional spacer may be positioned between the assembly 623 and the showerhead 625, such as an annular spacer, to isolate the plates from one another. In embodiments in which a third precursor is not required, the gas distribution assembly 625 may have a design similar to any of the previously described components, and may include characteristics similar to the showerhead illustrated in FIG. 4.

The gas distribution assembly 625 may comprise an upper plate and a lower plate as previously discussed. The plates may be coupled with one another to define a volume 627 between the plates. The coupling of the plates may be such as to provide first fluid channels 640 through the upper and lower plates, and second fluid channels 645 through the lower plate. The formed channels may be configured to provide fluid access from the volume 627 through the lower plate, and the first fluid channels 640 may be fluidly isolated from the volume 627 between the plates and the second fluid channels 645. The volume 627 may be fluidly accessible through a side of the gas distribution assembly 625, such as channel 322 as previously discussed. The channel may be coupled with a third access in the chamber separate from the first access 605 of the chamber 600.

A plasma as described earlier may be formed in a region of the chamber defined between two or more of the components previously discussed. By providing an additional plasma source, such as a CCP source, the plasma effluents may be further tuned as previously described. For example, a plasma region such as a first plasma region 615 as previously described, may be formed in the mixing region 611 between faceplate 603 and assembly 623. Spacer 610 may maintain the two devices electrically isolated from one another in order to allow a plasma field to be formed. Faceplate 603 may be electrically charged while assembly 623 may be grounded or DC biased to produce a plasma field within the region defined between the plates. The plates may additionally be coated or seasoned in order to minimize the degradation of the components between which the plasma may be formed. The plates may additionally include compositions that may be less likely to degrade or be affected including ceramics, metal oxides, etc.

By producing a plasma within the mixing region 611, plasma effluents from the CCP may backflow through the access 605 and travel back through piping 614, which may degrade the components. Accordingly, a blocker 602, such as a mesh screen or device configured to suppress backflowing plasma, may be incorporated into piping 614 or access 605 to protect upstream components such as the RPS units 601 and piping 614.

In disclosed embodiments, the system 600 chamber may also not include CCP plasma capabilities, and plasma production may be made, for example, exclusively from the RPS units 601a-b. Producing CCP plasma often may degrade the portions of a chamber in which the plasma is formed, which may cause metal or other material sputtering from the chamber surfaces. The particles displaced from the chamber may pass through the chamber regions and deposit or interact with a substrate on which a processing operation is being performed. In this way, the finally produced substrate may have performance issues such as short circuit occurrences due to the inclusion of displaced metallic, conductive, or other materials from the chamber surfaces.

Figure 7:
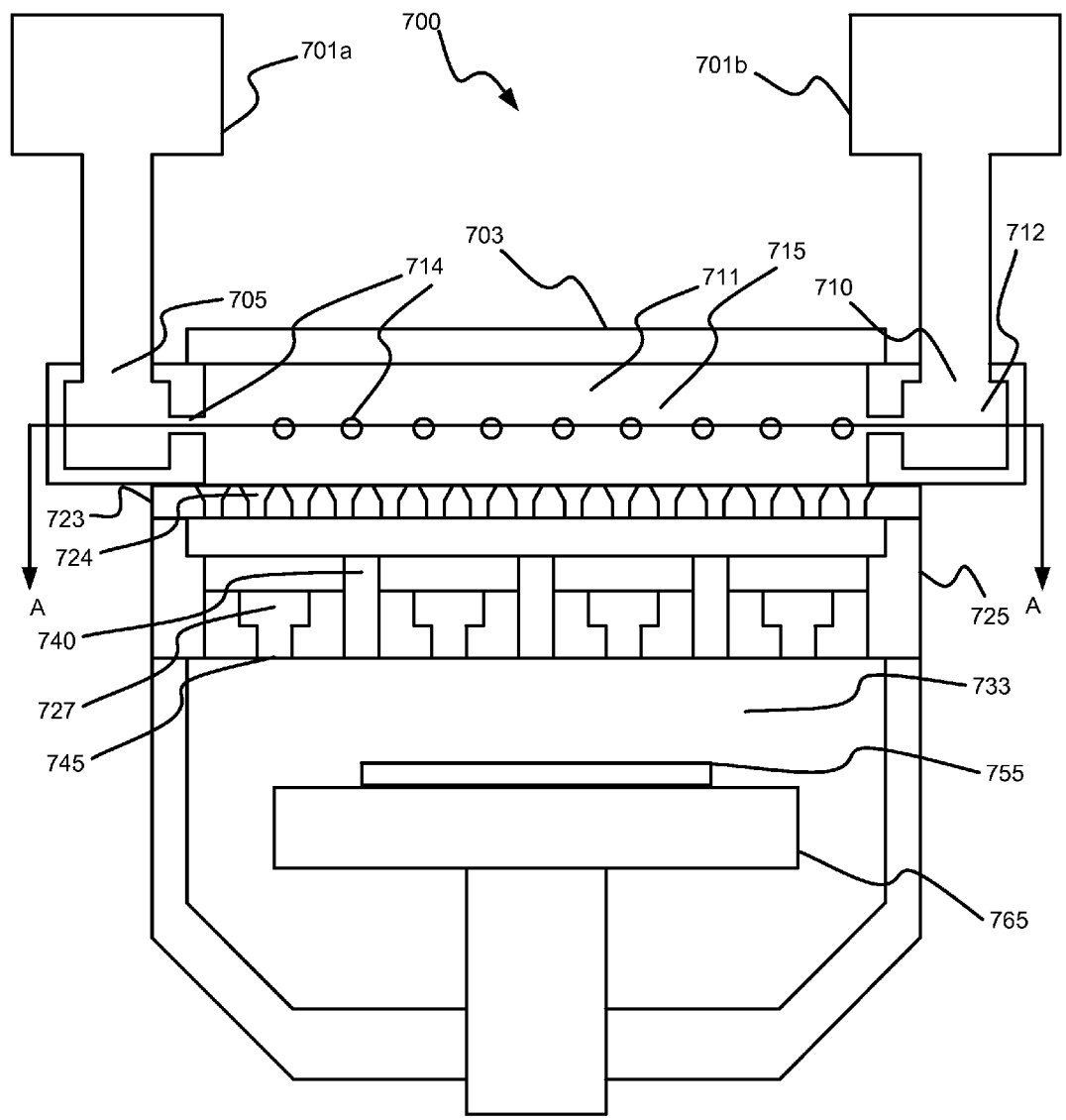
FIG. 7 shows a simplified cross-sectional view of a processing chamber according to the disclosed technology.

FIG. 7 shows a simplified cross-sectional view of a processing chamber system 700 according to the disclosed technology. Processing system 700 may include some or all of the components previously described with respect to the processing systems 500 and/or 600 of FIGS. 5 and 6. For example, processing system 700 may be configured to house a semiconductor substrate 755 in a processing region 733 of the chamber. The substrate 755 may be located on a pedestal 765 as shown. Processing system 700 may include two or more remote plasma units or systems (RPS) 701a-b. The system may include a first RPS unit 701a and a second RPS unit 701b as previously discussed, which may be configured to provide radicalized precursors to the processing chamber.

As illustrated in the Figure, the first and second RPS units may be fluidly coupled with a side portion of the chamber. The first access 705 and second accesses 710 may be disposed separately from one another. The first access 705 and second access 710 may be fluidly coupled with a plenum 712 radially distributed about the chamber. The plenum 712 may be coupled about the circumference of the chamber, and may be configured to provide access to the mixing region 711 of the chamber at a plurality of locations throughout the plenum 712. The plenum 712 may also be located within the confines of the chamber housing, but may have an annular shape at least partially defining the mixing region 711. The plurality of locations throughout the plenum 712 by which access is provided to the mixing region 711 may include ports or apertures 714 defined about an interior portion of the plenum 712. The ports 714 may be positioned or configured to provide a more uniform delivery of the precursors into the mixing region 711 from the plenum 712. In disclosed embodiments, the inner wall of the plenum 712 may define 2 or more ports 714, and may define greater than or about 4 ports, 6, 7, 8, 9, 10, 12, 15, 20, 25, 30, 40, 50, etc. or more ports 714 defined about the plenum 712.

In disclosed embodiments the first access 705 and second access 710 may be coupled prior to their accessing the plenum 712, such as with a coupling or piping as previously described. Accordingly, in disclosed embodiments the first and second accesses are coupled at a single location that may be positioned along the top surface of the processing chamber or along a side portion of the chamber housing. The coupling of the first RPS unit 701a and the second RPS unit 701b with a single access may be configured to allow the a first and second precursors to interact prior to accessing the plenum 712 and mixing region 711 of the chamber.

The separately excited precursors may interact about the plenum 712 to provide additional mixing that may provide improved uniformity of distribution of the precursors through the chamber. As discussed, the plenum may at least partially define the mixing region 711 that may be further defined in part by a top plate such as a faceplate 703. The mixing region may be additionally defined by an plate 723 that may be configured to suppress the flow of ionic species into the processing region 733.

Plate 723 may include a similar design and may have a similar arrangement as the showerhead illustrated at FIG. 4, for example. The housing of plenum 712 may formed or coated with a dielectric material that may allow the faceplate 703 and plate 723 to be electrically isolated from one another as described further below. Apertures 724 may be defined in plate 723, and may be distributed and configured to affect the flow of ionic species through the plate 723. For example, the apertures 724 may be configured to at least partially suppress the flow of ionic species directed toward the processing region 733. The apertures 724 may have a variety of shapes including channels as previously discussed, and may include a tapered portion as illustrated extending upward away from the processing region 733 in disclosed embodiments.

System 700 may further include a gas distribution assembly 725 within the chamber. The gas distribution assembly 725, which may be similar in aspects to the dual-channel showerheads as previously described, may be located within the system 700 chamber at a top portion of the processing region 733, or above the processing region 733. The gas distribution assembly 725 may be configured to deliver both the first and second precursors into the processing region 733 of the chamber. Although the exemplary system of FIG. 7 includes a dual-channel showerhead, it is understood that alternative distribution assemblies may be utilized that maintain a third precursor fluidly isolated from the radical species of the first and second precursors prior to entering the processing region 733. Although not shown, an additional spacer may be positioned between the plate 723 and the showerhead 725, such as an annular spacer, to isolate the plates from one another. In embodiments in which a third precursor is not required, the gas distribution assembly 725 may have a design similar to any of the previously described components, and may include characteristics similar to the showerhead illustrated in FIG. 4.

The gas distribution assembly 725 may comprise an upper plate and a lower plate as previously discussed. The plates may be coupled with one another to define a volume 727 between the plates. The coupling of the plates may be such as to provide first fluid channels 740 through the upper and lower plates, and second fluid channels 745 through the lower plate. The formed channels may be configured to provide fluid access from the volume 727 through the lower plate, and the first fluid channels 740 may be fluidly isolated from the volume 727 between the plates and the second fluid channels 745. The volume 727 may be fluidly accessible through a side of the gas distribution assembly 725, such as channel 322 as previously discussed. The channel may be coupled with a third access in the chamber separate from the first access 705 of the system 700 chamber.

A plasma as described earlier may be formed in a region of the system 700 chamber defined between two or more of the components previously discussed. By providing an additional plasma source, such as a CCP source, the plasma effluents may be further tuned as previously described. For example, a plasma region such as a first plasma region 715 as previously described, may be formed in the mixing region 711 between faceplate 703 and plate 723. As discussed, the housing of plenum 712 may maintain the two devices electrically isolated from one another in order to allow a plasma field to be formed. Faceplate 703 may be electrically charged while plate 723 may be grounded or DC biased to produce a plasma field within the region defined between the plates. The plates may additionally be coated or seasoned in order to minimize the degradation of the components between which the plasma may be formed. The plates may additionally include compositions that may be less likely to degrade or be affected including ceramics, metal oxides, etc.

Figure 8:
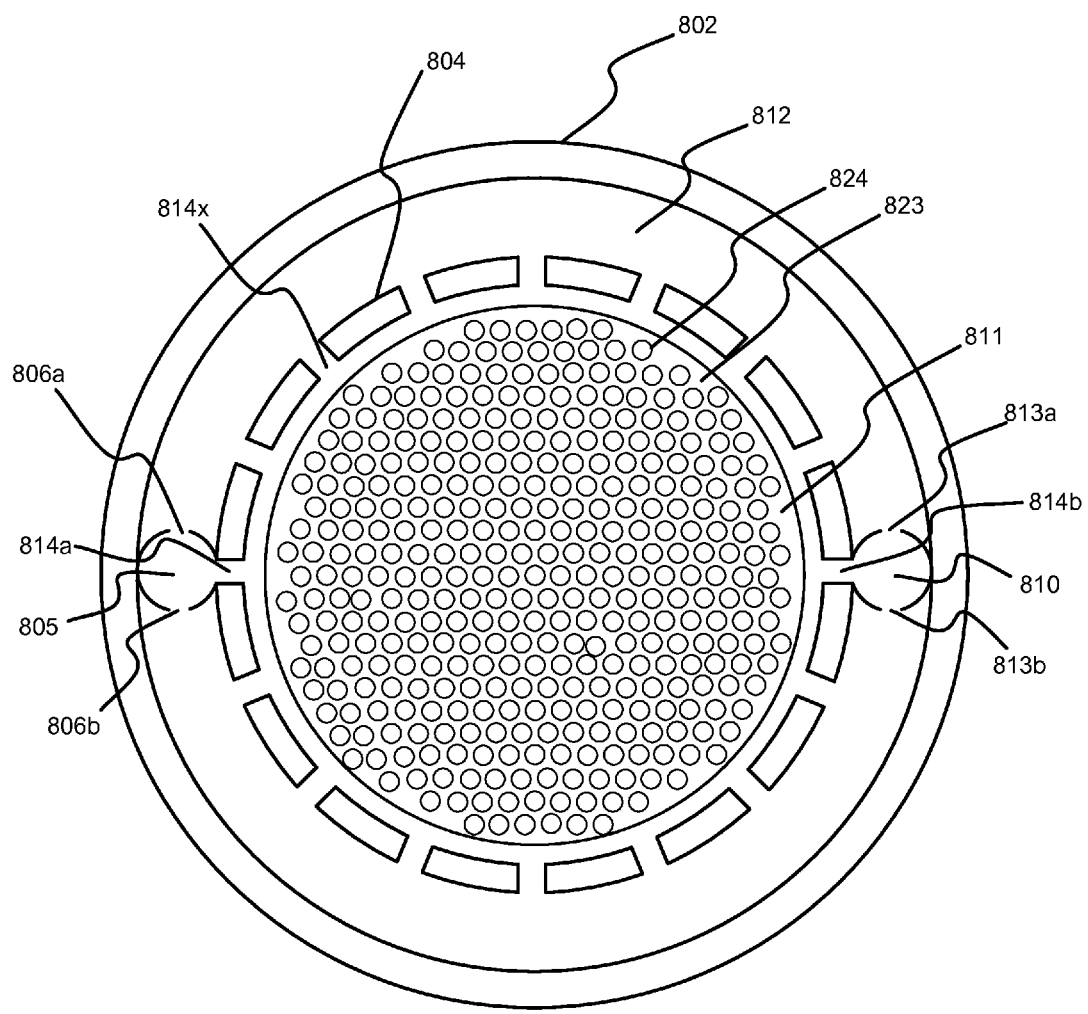
FIG. 8 shows a plan view of a cross-sectional portion of the processing chamber illustrated in FIG. 7 along line A-A.

FIG. 8 shows a top plan view of a cross-sectional portion of the system 700 chamber illustrated in FIG. 7 along line A-A. As previously described, plenum 812 may be defined by a housing including an outer wall 802 and an inner wall 804. The housing may be a contiguous material, or may be two separate materials comprising the inner wall 804 and outer wall 802. Access may be provided to the plenum 812 via any number of access points that may include first access 805 and second access 810. For example, a single access to the plenum may be provided by which two or more RPS units may deliver plasma effluents to the processing chamber. As illustrated, first access 805 may define one or more spaces 806 to provide access about the plenum space 812. As illustrated, two spaces 806a and 806b are shown providing access in multiple directions from the first access 805. In disclosed embodiments the first access 805 may include fewer or more spaces 806 by which a first precursor may be delivered to the plenum. For example, a single space 806a may be defined to allow ingress to the plenum 805 from a single position. Additionally, although illustrated as being defined to the outer wall 802, first access 805 may, for example, be of a smaller radius than the distance between the inner wall 802 and outer wall 804 defining plenum 812. Accordingly, an additional space 806 may be provided that is directed towards the outer wall 802 (not shown) from the first access 805. Moreover, although illustrated as extending into plenum 812 to provide additional flow control over the delivered precursor, first access 805 may include access at the top portion of the plenum 812 such that the precursor may simply flow down and outward through the plenum 812 with an undirected current flow.

A similar configuration may be provided with second access 810 by which a second precursor may be delivered to the chamber through plenum 812. Second access 810 may include one or more spaces 813 that provide access to the plenum space 812. As illustrated, two spaces 813a and 813b are shown providing access in multiple directions from the second access 810. Similar modifications may be provided as discussed above with respect to first access 805. In an exemplary configuration in which a single space is provided from each of first access 805 and second access 810, the spaces may be provided in similar or in opposite directions. For example, if space 806a is defined by first access 805 to direct the precursor in one direction about the plenum 812, space 813b may be defined by second access 810 to direct the second precursor in an opposite direction about plenum 812. Various alternatives as would be understood are similarly encompassed. Additionally, as discussed with respect to first access 805, second access 810 may port only to the top of the plenum housing such that no further direction is provided to the precursor as it is delivered to the plenum 812, and the precursor may flow naturally about the plenum 812.

Inner wall 804 of plenum 812 may at least partially define mixing region 811 as previously described. Ports or apertures 814 may be defined throughout the distance around inner wall 804 to provide access by which the precursors may enter the mixing region 811, prior to traversing assembly 823 via ports 824. Ports 814, such as port 814x, may be defined in a variety of ways along inner wall 804, and may have straight lumen-style characteristics as shown, or may be angled toward mixing region 811 or away from mixing region 811 in disclosed embodiments to provide further ways by which the distribution of the precursors may be controlled or tuned. As shown, ports 814a and 814b are illustrated proximate to the first access 805 and second access 810 respectively. In disclosed embodiments, these ports may be included or not included to further affect the distribution of precursors into the mixing region 811. Additional ports 814 may also be removed at structured or varying intervals, in which case the inner wall 804 remains continuous along the section in which a port 814 is not defined. Once delivered precursors are directed or allowed to flow along plenum 812 and through ports 814, the precursors may interact and further mix in mixing region 811. The precursor mixture may then flow through apertures 824 through assembly 823 toward the processing region in which the precursors may, for example, be used to perform an etch process on a substrate.

Figure 9:
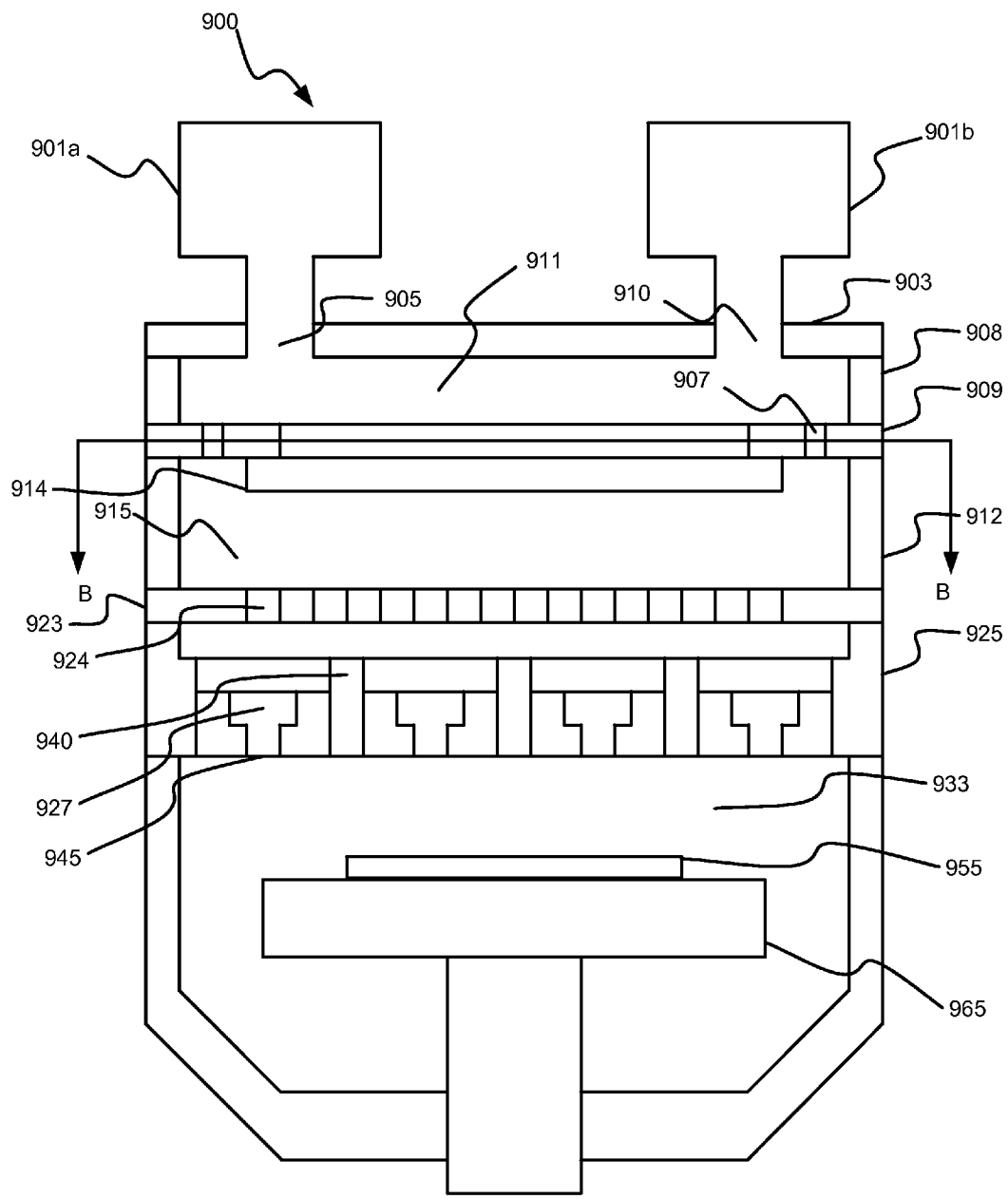
FIG. 9 shows a simplified cross-sectional view of a processing chamber according to the disclosed technology.

FIG. 9 shows a simplified cross-sectional view of a processing chamber according to the disclosed technology. Processing chamber system 900 may include some or all of the components previously described with respect to the systems described with respect to any of FIG. 5, 6, or 7. For example, the system 900 chamber may be configured to house a semiconductor substrate 955 in a processing region 933 of the chamber. The substrate 955 may be located on a pedestal 965 as shown. The processing chamber of system 900 may include two or more remote plasma units or systems (RPS) 901a-b. The chamber may include a first RPS unit 901a and a second RPS unit 901b as previously discussed, which may be configured to provide radicalized precursors to the processing chamber. A first RPS unit 901a may be fluidly coupled with a first access 905 of the chamber, and may be configured to deliver a first precursor into the chamber through the first access 905. A second RPS unit 901b may be fluidly coupled with a second access 910 of the chamber, and may be configured to deliver a second precursor into the chamber through the second access 910. An exemplary configuration may include the first access 905 and the second access 910 coupled with a top portion of the chamber. The exemplary configuration may further couple the RPS units with the accesses such that the first access 905 and second access 910 are separate from one another.

The separately excited precursors produced in the RPS units 901 may be directed or otherwise flowed in mixing region 911 in which the precursors may mix to provide improved uniformity of distribution of the precursors through the chamber. The accesses 905, 910 may be formed in a top plate such as a faceplate 903 that at least partially defines the mixing region 911. The mixing region may be additionally defined by a showerhead or configuration of portions 909, 914 that may be utilized to distribute the precursors through the chamber. Spacer 908 may additionally define a portion of the mixing region 911.

The showerhead including portions 909, 914 may include one, two, or more plates or components configured to affect the distribution of precursors. As illustrated, component 909 may comprise an annular plate coupled with a plate structure 914 disposed below the annular plate 909. In disclosed embodiments, plate 914 may be disposed in line with annular plate 909. Annular plate 909 and plate 914 may be composed of similar or different materials in disclosed embodiments. For example, annular portion 909 may be formed of a dielectric material or other non-conducting material while plate 914 may comprise a metal or other conducting portion that may act as an electrode as discussed below. As another example, both portions 909, 914 may comprise a conductive metal, and spacers 908, 912 may electrically isolate the plate from other portions of the system 900 chamber. Apertures 907 may be defined in annular portion 909 through which the mixed precursors may be flowed.

A plate 923 that may be positioned below the showerhead including portions 909, 914, and may be configured to suppress the flow of ionic species into the processing region 933. Plate 923 may include a similar design and may have a similar arrangement as the showerhead illustrated at FIG. 4, for example. Spacer 912 may be positioned between the showerhead including portions 909, 914 and plate 923, and may include similar components as previously discussed, such as a dielectric material. Apertures 924 may be defined in plate 923, and may be distributed and configured to affect the flow of ionic species through the plate 923. For example, the apertures 924 may be configured to at least partially suppress the flow of ionic species directed toward the processing region 933. The apertures 924 may have a variety of shapes including channels as previously discussed, and may include a tapered portion extending upward away from the processing region 933 in disclosed embodiments. As illustrated, a region 915 may be defined at least partially by the showerhead including portions 909, 914 and plate 923. This region may allow for additional mixing of the precursors or processing of the precursors as discussed below.

The chamber of system 900 may further include a gas distribution assembly 925 within the chamber. The gas distribution assembly 925, which may be similar in aspects to the dual-channel showerheads as previously described, may be located within the system 900 chamber at a top portion of the processing region 933, or above the processing region 933. The gas distribution assembly 925 may be configured to deliver both the first and second precursors into the processing region 933 of the chamber 900. Although the exemplary system of FIG. 9 includes a dual-channel showerhead, it is understood that alternative distribution assemblies may be utilized that maintain a third precursor fluidly isolated from the radical species of the first and second precursors prior to entering the processing region 933. Although not shown, an additional spacer may be positioned between the assembly 923 and the showerhead 925, such as an annular spacer, to isolate the plates from one another. In embodiments in which a third precursor is not required, the gas distribution assembly 925 may have a design similar to any of the previously described components, and may include characteristics similar to the showerhead illustrated in FIG. 4.

The gas distribution assembly 925 may comprise an upper plate and a lower plate as previously discussed. The plates may be coupled with one another to define a volume 927 between the plates. The coupling of the plates may be such as to provide first fluid channels 940 through the upper and lower plates, and second fluid channels 945 through the lower plate. The formed channels may be configured to provide fluid access from the volume 927 through the lower plate, and the first fluid channels 940 may be fluidly isolated from the volume 927 between the plates and the second fluid channels 945. The volume 927 may be fluidly accessible through a side of the gas distribution assembly 925, such as channel 322 as previously discussed. The channel may be coupled with a third access in the chamber separate from the first access 905 and second access 910 of the system 900 chamber.

A plasma as described earlier may be formed in a region of the system 900 chamber defined between two or more of the components previously discussed. By providing an additional plasma source, such as a CCP source, the plasma effluents may be further tuned as previously described. For example, a plasma region 915, which may be similar in certain aspects to first plasma region 215 as previously described, may be formed in the area defined between the showerhead including portions 909, 914 and plate 923. Spacer 912 may maintain the two devices electrically isolated from one another in order to allow a plasma field to be formed. In disclosed embodiments, portion 914 of the showerhead may be electrically charged and isolated by portion 909 as previously discussed which may be electrically insulating, for example. The showerhead may be electrically charged partially or entirely, while plate 923 may be grounded or DC biased to produce a plasma field within the region defined between the plates. The plates may additionally be coated or seasoned in order to minimize the degradation of the components between which the plasma may be formed. The plates may additionally include compositions that may be less likely to degrade or be affected including ceramics, metal oxides, etc.

Figure 10:
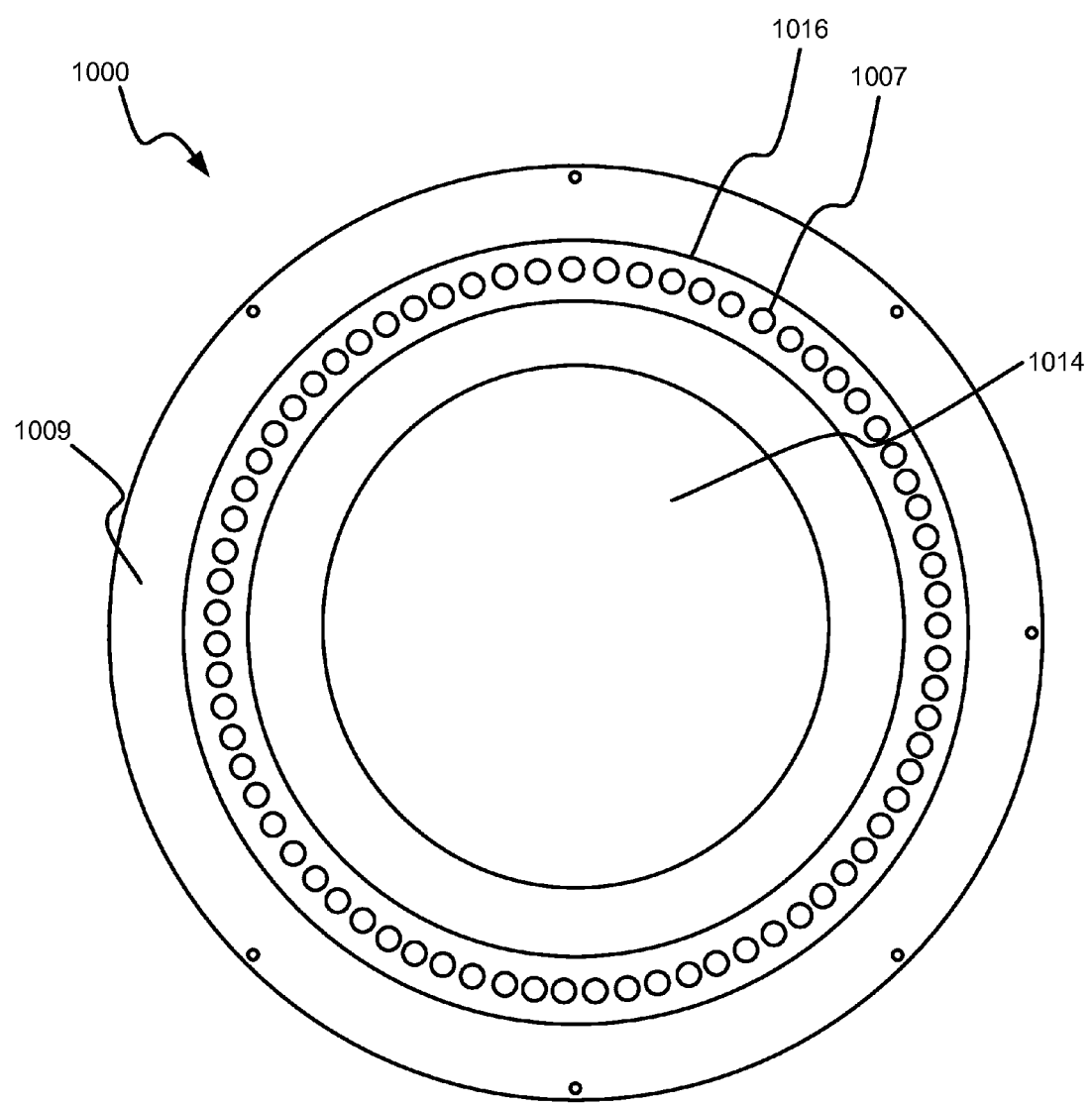
FIG. 10 shows a plan view of a cross-sectional portion of the processing chamber illustrated in FIG. 9 along line B-B.

FIG. 10 shows a top plan view of a cross-sectional portion of the processing chamber illustrated in FIG. 9 along line B-B. The showerhead 1000 including portions 1009 and 1014 may include one or more plates or components as previously discussed. Portion 1009 may include an exterior annular portion of the showerhead that surrounds an interior portion 1014 of the showerhead 1000. The portion 1014 may be contained within the plane of the exterior portion 1009, or may be disposed or seated above or below the exterior portion 1009. The interior portion may be welded or otherwise mechanically coupled with or to the exterior portion to form the showerhead 1000. Exterior portion 1009 may include a section 1016 that may be an annular inner portion of the exterior portion 1009 of the showerhead 1000. Section 1016 may be an additional annular section coupled with both exterior portion 1009 and interior portion 1014. Section 1016 may include a plurality of apertures 1007 defined within section 1016 that provide access through showerhead 1000. The apertures 1007 may be defined in a variety of patterns, such as a ring pattern as illustrated. The showerhead 1000 may or may not include apertures in the interior portion 1014 in disclosed embodiments. For example, interior portion 1014 may be devoid of apertures, and apertures may not be formed in a region extending from a center point of the showerhead 1000. Based on the radial length of the showerhead, the showerhead may include no apertures 1007 about the interior portion 1014 of the showerhead extending at least from the center point of the showerhead to an area defined within at least 10% of the radial length of the showerhead. No apertures may additionally be included within an interior portion 1014 of the showerhead extending from the center point of the showerhead to an area defined within at least about 15%, 20%, 25%, 30%, 35%, 40%, 45%, 50%, 60%, etc. or more.

Although illustrated as a single ring of apertures 1007, section 1016 may include more than one ring of apertures 1007. Apertures 1007 may be disposed at a variety of spacing intervals that may include continuous spacing between apertures 1007, as well as varied spacing or inconsistent spacing. If multiple rows of apertures 1007 are included, such as 2, 3, 4, 5, 6, 7, 8, 9, etc., or more rows of apertures, the apertures may be displaced between rows, or be in radial alignment from a radius of the showerhead extending out from a center point of the showerhead 1000. In disclosed embodiments the exterior portion 1009 may be of a thickness that is equal to, greater than, or less than the thickness of the interior portion 1014. Additionally, portion 1016 may be of a thickness that is equal to, greater than, or less than the thickness of either or both of the exterior portion 1009 and interior portion 1014. Materials included in each of portions 1009, 1014, and 1016 may be similar or different from any of the other portions of the showerhead 1000. For example, section 1016 may be of a material different from both exterior portion 1009 and interior portion 1014, which may include similar or different materials from one another. For example, exterior portion 1009 and interior portion 1014 may include a metal or conductive material, while section 1016 includes a dielectric material that allows interior portion 1014 to be electrically isolated from other portions of the system. In disclosed embodiments the exterior portion 1009 and section 1016 may be of a similar non-conducting material such as a dielectric material, while interior portion 1014 may be made of a conductive material. Various other configurations as would be understood are similarly encompassed by the technology.

Figure 11:
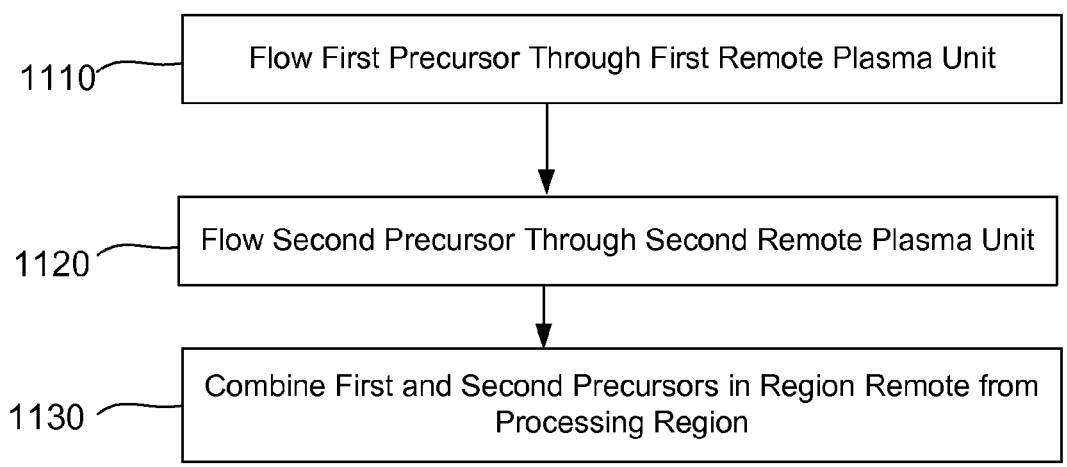
FIG. 11 shows a flowchart of a method of operating a semiconductor processing chamber according to the disclosed technology.

In order to better understand and appreciate the technology described, reference is now made to FIG. 11 which is a flow chart of an etch process according to disclosed embodiments. It is understood that the technology can similarly be utilized for deposition processes in alternative arrangements. Prior to the first operation, a structure may be formed in a patterned substrate. The structure may possess separate exposed regions of silicon, oxides, nitrides, metals including tungsten, copper, titanium, tantalum etc., or other components. Silicon may be amorphous, crystalline, or polycrystalline (in which case it is usually referred to as polysilicon). Previous deposition and formation processes may or may not have been performed in the same chamber. If performed in a different chamber, the substrate may be transferred to a system such as that described above.

A first precursor such as an oxygen-containing precursor or a hydrogen-containing precursor may be flowed into a first plasma region separate from the substrate processing region at operation 1110. The separate plasma region may be referred to as a remote plasma region herein and may be within a distinct module from the processing chamber or a compartment within the processing chamber. Generally speaking, a hydrogen or oxygen-containing precursor may be flowed into the first plasma region, such as a first RPS unit as previously discussed, in which it is excited in a plasma, and the hydrogen or oxygen-containing precursor may comprise at least one precursor selected from $H_2$, $NH_3$, $O_2$, $O_3$, $N_2O$, hydrocarbons, or the like. A flow of a second precursor such as nitrogen trifluoride, or a different fluorine-containing precursor, may be introduced into a second remote plasma region at operation 1120 where it is excited in a plasma. The first and second plasma systems may be operated in any fashion as previously discussed, and in disclosed embodiments the hydrogen or oxygen-containing precursor and the fluorine-containing precursor may be flowed through the alternative RPS units. Other sources of fluorine may be used to augment or replace the nitrogen trifluoride. In general, a fluorine-containing precursor may be flowed into the second remote plasma region and the fluorine-containing precursor may include at least one precursor selected from the group consisting of atomic fluorine, diatomic fluorine, bromine trifluoride, chlorine trifluoride, nitrogen trifluoride, hydrogen fluoride, fluorinated hydrocarbons, sulfur hexafluoride, and xenon difluoride. Either or both of the first and second precursors may be included with carrier precursors such as those previously discussed.

The plasma effluents formed in the remote plasma regions of the first and second precursors may then be separately flowed into and then combined in a mixing region of the chamber at operation 1130. The mixing region may be located fluidly upstream of a processing region of the chamber in which a substrate, such as a patterned substrate, resides. If a chamber cleaning operation is being performed, a substrate may not be located in the chamber during such operations. The gas flow ratios of the precursors may include a variety of flow ratios such as flow ratios (O or H:F) less than, greater than, or about 1:1000, 1:500, 1:250, 1:100, 1:50, 1:25, 1:15, 1:10, 1:5, 1:1, 5:1, 10:1 15:1, 25:1, 50:1, 100:1, 250:1, 500:1, 1000:1, etc. Regions of exposed tungsten, titanium nitride, or other metals may also be present on the patterned substrate and may be referred to as exposed metallic regions. The precursors may be delivered to the processing region and may react with the substrate materials to perform an etch operation, for example. The reactive chemical species may be removed from the substrate processing region and then the substrate may be removed from the processing region.

The fluorine-containing precursor and/or the oxygen or hydrogen-containing precursor may further include one or more relatively inert gases such as He, $N_2$, Ar, or the like. The inert gas can be used to improve plasma stability and/or to carry liquid precursors to the remote plasma region. Flow rates and ratios of the different gases may be used to control etch rates and etch selectivity. In an embodiment, the fluorine-containing gas may include $NF_3$ at a flow rate of between about 1 sccm (standard cubic centimeters per minute) and 5000 sccm. A hydrogen or oxygen-containing precursor may be included at a flow rate of between about 1 sccm and 5,000 sccm, and one or more carrier gases at a flow rate of between about 0 sccm and 3000 sccm, may be included with either precursor stream. The atomic flow rates or ratio of O or H:F may be kept high in disclosed embodiments to reduce or eliminate solid residue formation on the substrate materials such as oxide. The formation of solid residue consumes some silicon oxide which may reduce the silicon selectivity of the etch process. The atomic flow ratio of O or H:F may be greater than or about five, twenty five (i.e. 25:1), greater than or about 30:1 or greater than or about 40:1 in embodiments of the technology.

By maintaining the precursors fluidly separate, corrosion and other interaction with the RPS systems may be reduced or eliminated. As described above, the RPS units and distribution components including the gas distribution assembly may be made of materials selected based on the precursors being delivered, and thus selected to prevent reaction between the ionized precursors and the equipment.

An ion suppressor may be used to filter ions from the plasma effluents during transit from the remote plasma region to the substrate processing region in embodiments of the technology. The ion suppressor functions to reduce or eliminate ionically charged species traveling from the plasma generation region to the substrate. Uncharged neutral and radical species may pass through the openings in the ion suppressor to react at the substrate. It should be noted that complete elimination of ionically charged species in the reaction region surrounding the substrate is not always the desired goal. In many instances, ionic species are required to reach the substrate in order to perform the etch and/or deposition process. In these instances, the ion suppressor helps control the concentration of ionic species in the reaction region at a level that assists the process. In disclosed embodiments the upper plate of the gas distribution assembly may include an ion suppressor.

The temperature of the substrate may be greater than 0° C. during the etch process. The substrate temperature may alternatively be greater than or about 20° C. and less than or about 300° C. At the high end of this substrate temperature range, the etch rate may drop. At the lower end of this substrate temperature range, alternative components may begin to etch and thus the selectivity may drop. In disclosed embodiments, the temperature of the substrate during the etches described herein may be greater than or about 30° C. while less than or about 200° C. or greater than or about 40° C. while less than or about 150° C. The substrate temperature may be below 100° C., below or about 80° C., below or about 65° C. or below or about 50° C. in disclosed embodiments.

The process pressure may similarly be adjusted for various operations. The pressure within the substrate processing region may be below or about 10 Torr, below or about 5 Torr, below or about 3 Torr, below or about 2 Torr, below or about 1 Torr or below or about 750 mTorr in disclosed embodiments. In order to ensure adequate etch rate, the pressure may be below, above or about 0.02 Torr and range up to about atmospheric pressure, or about 760 Torr in embodiments of the technology. Additional examples, process parameters, and operational steps are included in previously incorporated application Ser. No. 13/439,079 to the extent not inconsistent with the delivery mechanisms described herein. The pressure may be modulated or determined based on the plasma processing being performed. CCP plasma operations may be operated at higher pressures than remote plasma processes. In embodiments the operating pressures may be below about 20 Torr based on the use of RPS units. However, in disclosed embodiments the RPS unit may be sized or configured to operate at pressures above about 5 Torr, 10 Torr, 20 Torr, 50 Torr, 100 Torr, up to about 760 Torr or above.

The RPS units exciting the precursors may be operated at any of the plasma powers as previously described. The RPS units may be operated at similar or different power levels in disclosed embodiments. For example, the first precursor excited in the first remote plasma unit may be excited at a first plasma power level. The second precursor excited in the second remote plasma unit may be excited at a second plasma power level. The first and second plasma power levels may be similar or different from one another with either plasma power level being greater than the other power level.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the disclosed embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "an aperture" includes a plurality of such apertures, and reference to "the plate" includes reference to one or more plates and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or steps, but they do not preclude the presence or addition of one or more other features, integers, components, steps, acts, or groups.

What is claimed is:

1. A system for semiconductor processing, the system comprising:
   a chamber configured to contain a semiconductor substrate in a processing region of the chamber, the chamber comprising a lid and sidewalls defining an internal volume of the chamber;
   a first remote plasma unit fluidly coupled with a first access of the chamber defined through the lid and configured to deliver a first precursor into the chamber through the first access;
   a second remote plasma unit fluidly coupled with a second access of the chamber separate from the first access, the second access defined through the lid and configured to deliver a second precursor into the chamber through the second access, wherein the first and second accesses of the chamber provide access to a mixing region in the internal volume of the chamber separate from and fluidly coupled with the processing region of the chamber, and wherein the mixing region is configured to allow the first and second precursors to interact with each other in the internal volume of the chamber and externally from the processing region of the chamber;
a showerhead postioned within the chamber and at least partially defining the mixing region from below, wherein the lid defines the mixing region from above;
a faceplate positioned within the chamber between the showerhead and the substrate processing region of the chamber, wherein the faceplate defines a plurality of apertures configured to allow the first precursor and the second percursor to flow from the mixing region towards the processing region;
an ion suppressor positioned within the chamber between the faceplate and the substrate processing region of the chamber, wherein the faceplate is electrically coupled with an RF source, wherein the ion suppressor is electrically grounded, and wherein the chamber is configured to generate a capacitively-coupled plasma between the faceplate and ion suppressor operating as the electrodes of the capacitively-coupled plasma; and
an annular dielectric insert positioned between and contacting the faceplate and the ion suppressor, wherein the annular dielectric insert electrically isolates the faceplate and ion suppressor from one another, wherein the showerhead, the faceplate, the ion suppressor, and the annular dielectric insert are coaxially aligned along an axis of the chamber and configured to at least partially define a flow passage along the axis of the chamber for the first and second precursors to flow from the mixing region to the processing region.

2. The system of claim 1, wherein the ion suppressor is configured to at least partially suppress the flow of ionic species directed toward the processing region of the chamber.

3. The system of claim 1, wherein the chamber further comprises a gas distribution assembly located within the chamber at a top portion of or above the processing region of the chamber and configured to deliver both the first and second precursors into the processing region of the chamber.

4. The system of claim 3, wherein the gas distribution assembly comprises an upper plate and a lower plate, wherein the upper and lower plates are coupled with one another to define a volume between the plates, wherein the coupling of the plates provides first fluid channels through the upper and lower plates and second fluid channels through the lower plate that are configured to provide fluid access from the volume through the lower plate, and wherein the first fluid channels are fluidly isolated from the volume between the plates and the second fluid channels.

5. The system of claim 4, wherein the volume is fluidly accessible through a side of the gas distribution assembly fluidly coupled with a third access in the chamber separate from the first and second accesses of the chamber.

6. The system of claim 3, wherein the ion suppressor is directly coupled with and contacting the gas distribution assembly at an exterior region of the ion suppressor.

7. The system of claim 1, wherein the first access and second access are coupled with a top portion of the chamber.

8. The system of claim 1, wherein the showerhead is configured to distribute the first and second precursors through the chamber.

9. The system of claim 8, wherein a dielectric spacer is positioned between the showerhead and the first remote plasma unit and the second remote plasma unit, and wherein the dielectric spacer at least partially defines the mixing region.

10. The system of claim 1, wherein the first remote plasma unit comprises a first material and the second remote plasma system comprises a second material.

11. The system of claim 10, wherein the first material is selected based on the composition of the first precursor, and wherein the second material is selected based on the composition of the second precursor.

12. The system of claim 11, wherein the first material and second material are different materials.

13. The system of claim 1, wherein the first remote plasma unit is configured to operate at a first power level that is selected based on the composition of the first precursor, and wherein the second remote plasma unit is configured to operate at a second power level that is selected based on the composition of the second precursor.

14. The system of claim 1, wherein the faceplate, ion suppressor, and the annular dielectric insert are stacked with one another to at least partially define sidewalls of the chamber.

15. The system of claim 1, wherein the ion suppressor includes a plurality of rings of apertures, wherein each ring is hexagonally shaped, and wherein each of the apertures of each ring is arranged at an equal distance from each adjacent apertures.

16. The system of claim 1, wherein the faceplate includes a plurality of apertures each configured to facilitate the flow of at least a portion of ions from the first precursor or the second precursor through the faceplate.

17. The system of claim 1, wherein the faceplate includes a plurality of apertures each configured with a tapered portion extending outward toward the processing region, and wherein the ion suppressor includes a plurality of apertures each configured with a tapered portion extending outward away from the processing region.

18. The system of claim 1, wherein the faceplate and the ion suppressor are configured to generate the capacitively-coupled plasma at a power level below or about 1 kW such that concentrations of radical species entering into the processing region are similar to concentrations of radical species entering into the mixing region from the first remote plasma unit and the second remote plasma unit.

19. The system of claim 1, wherein the showerhead includes a first plurality of apertures, wherein the faceplate includes a second plurality apertures, wherein the ion suppressor includes a third plurality of apertures, and wherein a density of the second plurality of apertures is less than a density of the first plurality of apertures and is less than a density of the third plurality of apertures.

20. The system of claim 1, wherein the coupling between the first remote plasma unit and the chamber and the coupling between the second remote plasma and the chamber are respectively configured such that a flow path for the first precursor to travel from the first remote plasma unit to the mixing region of the chamber is greater than a flow path for the second precursor to travel from the second remote plasma unit to the mixing region of the chamber, and wherein the flow paths are determined based at least in part on respective recombination rates of radicals from the first precursor and the second precursor.

21. A system for semiconductor processing, the system comprising:
a chamber configured to contain a semiconductor substrate in a processing region of the chamber, the chamber comprising a lid and sidewalls defining an internal volume of the chamber;

a first remote plasma unit fluidly coupled with a first access of the chamber defined through the lid and configured to deliver a first precursor into the chamber through the first access;

a second remote plasma unit fluidly coupled with a second access of the chamber separate from the first access, the second access defined through the lid and configured to deliver a second precursor into the chamber through the second access, wherein the first and second accesses of the chamber provide access to a mixing region in the internal volume of the chamber separate from and fluidly coupled with the processing region of the chamber, and wherein the mixing region is configured to allow the first and second precursors to interact with each other in the internal volume of the chamber and externally from the processing region of the chamber;

a showerhead positioned within the chamber to at least partially define the mixing region from below, wherein the lid defines the mixing region from above;

an annular insert positioned adjacent the showerhead and defining an exterior of the mixing region;

an ion suppressor positioned within the chamber between the showerhead and the substrate processing region of the chamber, wherein the ion suppressor comprises a plate defining apertures, and wherein the ion suppressor is configured to operate as an electrically grounded electrode for a capacitively-coupled plasma formable within the chamber;

an annular dielectric insert positioned between the ion suppressor and the showerhead, wherein the annular dielectric insert is in contact with the ion suppressor; and a gas distribution assembly positioned between the ion suppressor and the processing region of the chamber, wherein the gas distribution assembly is in direct contact with the ion suppressor.

22. The system of claim 21, wherein the showerhead, the ion suppressor, the annular insert, the annular dielectric insert, and the gas distribution assembly are in a stacked arrangement, and each at least partially define sidewalls of the chamber.

23. A system for semiconductor processing, the system comprising:

a chamber configured to contain a semiconductor substrate in a processing region of the chamber, the chamber comprising a lid and sidewalls defining an internal volume of the chamber;

a first remote plasma unit fluidly coupled with a first access of the chamber defined through the lid and configured to deliver a first precursor into a mixing region of in the internal volume of the chamber, wherein the mixing region is separate from and fluidly coupled with the processing region of the chamber;

a second remote plasma unit fluidly coupled with a second access of the chamber separate from the first access, the second access defined through the lid and configured to deliver a second precursor into the mixing region in the internal volume of the chamber through the second access, wherein the mixing region is configured to allow the first and second precursors to interact with each other in the internal volume of the chamber and externally from the processing region of the chamber;

a first annular insert positioned downstream of and contacting the lid and configured to at least partially define the sidewalls;

a showerhead positioned downstream of and contacting the first annular insert, wherein the showerhead defines a plurality of apertures, and wherein the lid, the first annular insert, and the showerhead are configured to collectively define the mixing region;

a second annular insert positioned downstream of and contacting the showerhead and configured to at least partially define the sidewalls;

a faceplate positioned downstream of the showerhead and spaced apart from the showerhead by the second annular insert, wherein the faceplate defines a plurality of apertures;

a third annular insert positioned downstream of and contacting the faceplate and configured to at least partially define the sidewalls;

an ion suppressor positioned downstream of and contacting the third annular insert, wherein the ion suppressor defines a plurality of apertures, wherein the faceplate is electrically coupled with an RF source, wherein the ion suppressor is electrically grounded, wherein the third annular insert is configured to electrically isolate the faceplate and ion suppressor from one another, wherein the faceplate, the ion suppressor, and the third annular insert are configured to define a chamber plasma region, wherein the mixing region, the chamber plasma region, and the processing region are arranged along an axis of the chamber, wherein the faceplate and the ion suppressor are configured to operate as electrodes for generating a capacitively-coupled plasma within the chamber plasma region, wherein each of the plurality of apertures of the faceplate is configured with a tapered portion extending outward toward the chamber plasma region, and wherein each of the plurality of apertures of the ion suppressor is configured with a tapered portion extending outward toward the chamber plasma region;

a gas distribution assembly positioned downsteam of and contacting the ion suppressor, wherein the gas distribution assembly is configured to at least partially define the processing region, wherein the gas distribution assembly further includes an annular body configured to at least partially define the sidewalls, and wherein the showerhead, the second annular insert, the faceplate, the third annular insert, and the ion suppressor collectively define a flow passage along the axis of the chamber for the first and second precursors to flow from the mixing region to the processing region; and a pedestal configured to support the semicondcutor substrate in the processing region, wherein the showerhead, the faceplate, the ion suppressor, and the gas distribution assembly, and the substrate support are coaxially aligned along the axis of the chamber.

* * * * *